United States Patent
Suzuki et al.

(10) Patent No.: US 10,236,311 B2
(45) Date of Patent: Mar. 19, 2019

(54) SOLID-STATE IMAGING ELEMENT AND ELECTRONIC DEVICE TO IMPROVE QUALITY OF AN IMAGE

(71) Applicant: SONY SEMICONDUCTOR SOLUTIONS CORPORATION, Kanagawa (JP)

(72) Inventors: Ryoji Suzuki, Kanagawa (JP); Hitoshi Moriya, Tokyo (JP); Atsuhiro Ando, Kanagawa (JP); Atsushi Masagaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/518,483

(22) PCT Filed: Oct. 7, 2015

(86) PCT No.: PCT/JP2015/078495
§ 371 (c)(1),
(2) Date: Apr. 11, 2017

(87) PCT Pub. No.: WO2016/063727
PCT Pub. Date: Apr. 28, 2016

(65) Prior Publication Data
US 2017/0229503 A1    Aug. 10, 2017

(30) Foreign Application Priority Data

Oct. 20, 2014 (JP) .................................. 2014-213767

(51) Int. Cl.
*H01L 31/00* (2006.01)
*H01L 27/146* (2006.01)
(Continued)

(52) U.S. Cl.
CPC ...... *H01L 27/14609* (2013.01); *H01L 27/146* (2013.01); *H01L 27/1462* (2013.01);
(Continued)

(58) Field of Classification Search
None
See application file for complete search history.

(56) References Cited

U.S. PATENT DOCUMENTS 8,039,914 B2 * 10/2011 Akiyama .......... H01L 27/14603
257/432
2007/0001100 A1   1/2007 Hsu et al.
(Continued)

FOREIGN PATENT DOCUMENTS

CN    1897287 A    1/2007
CN    1992910 A    7/2007
(Continued)

OTHER PUBLICATIONS

International Search Report and Written Opinion of PCT Application No. PCT/JP2015/078495, dated Dec. 15, 2015, 20 pages of English Translation and 12 pages of ISRWO.
(Continued)

*Primary Examiner* — Minh-Loan Tran
(74) *Attorney, Agent, or Firm* — Chip Law Group

(57) ABSTRACT

The present technology relates to a solid-state imaging element and an electronic device capable of improving image quality of the solid-state imaging element. The solid-state imaging element includes a photoelectric conversion unit adapted to photoelectrically convert incident light incident from a predetermined incident surface. Also, the solid-state imaging element includes a wire arranged on a bottom surface side that is an opposite surface of the incident surface of the photoelectric conversion unit, and formed with a protruding pattern on a surface facing the photoelec-
(Continued)

tric conversion unit. The present technology can be applied to, for example, a solid-state imaging element such as a CMOS image sensor, and an electronic device including the solid-state imaging element.

10 Claims, 56 Drawing Sheets

(51) Int. Cl.
 *H01L 31/0224* (2006.01)
 *H04N 5/369* (2011.01)
 *H01L 31/102* (2006.01)
 *H04N 5/378* (2011.01)
 *H04N 5/232* (2006.01)
 *H04N 5/374* (2011.01)
 *H04N 9/04* (2006.01)
 *H01L 27/148* (2006.01)

(52) U.S. Cl.
 CPC .... *H01L 27/1464* (2013.01); *H01L 27/14621* (2013.01); *H01L 27/14623* (2013.01); *H01L 27/14643* (2013.01); *H01L 27/14645* (2013.01); *H01L 27/14659* (2013.01); *H01L 27/14667* (2013.01); *H01L 31/022441* (2013.01); *H01L 31/102* (2013.01); *H04N 5/23212* (2013.01); *H04N 5/369* (2013.01); *H04N 5/374* (2013.01); *H04N 5/378* (2013.01); *H04N 9/045* (2013.01); *H01L 27/14627* (2013.01); *H01L 27/14634* (2013.01); *H01L 27/14636* (2013.01); *H01L 27/14812* (2013.01)

(56) References Cited

U.S. PATENT DOCUMENTS

| | | | |
|---|---|---|---|
| 2007/0045513 A1 | 3/2007 | Lee et al. |
| 2007/0146512 A1 | 6/2007 | Suzuki et al. |
| 2011/0090384 A1 | 4/2011 | Yamada |
| 2011/0115919 A1 | 5/2011 | Hiramoto et al. |
| 2011/0254115 A1 | 10/2011 | Shih et al. |
| 2012/0104523 A1 | 5/2012 | Ikeda |
| 2013/0235237 A1 | 9/2013 | Aoki |
| 2014/0061439 A1 | 3/2014 | Toda |
| 2014/0106498 A1 | 4/2014 | Shih et al. |
| 2014/0111663 A1 | 4/2014 | Soda |
| 2014/0117481 A1 | 5/2014 | Kato et al. |
| 2014/0132812 A1 | 5/2014 | Soda |
| 2014/0145287 A1 | 5/2014 | Kato |
| 2015/0062391 A1 | 3/2015 | Murata |
| 2015/0123228 A1 | 5/2015 | Hatano et al. |
| 2015/0132884 A1 | 5/2015 | Shih et al. |
| 2015/0145089 A1 | 5/2015 | Soda |

FOREIGN PATENT DOCUMENTS

| | | |
|---|---|---|
| CN | 102007592 A | 4/2011 |
| CN | 102222674 A | 10/2011 |
| CN | 102456698 A | 5/2012 |
| CN | 103311259 A | 9/2013 |
| CN | 103681712 A | 3/2014 |
| CN | 103765590 A | 4/2014 |
| CN | 103811508 A | 5/2014 |
| CN | 104221365 A | 12/2014 |
| CN | 104541371 A | 4/2015 |
| EP | 2833623 A1 | 2/2015 |
| JP | 6-104414 A | 4/1994 |
| JP | 2007-13147 A | 1/2007 |
| JP | 2007-202107 A | 8/2007 |
| JP | 2010-177705 A | 8/2010 |
| JP | 2010-251765 A | 11/2010 |
| JP | 2011-91128 A | 5/2011 |
| JP | 2011-114150 A | 6/2011 |
| JP | 2011-151421 A | 8/2011 |
| JP | 2012-94719 A | 5/2012 |
| JP | 2013-055159 A | 3/2013 |
| JP | 2013-187475 A | 9/2013 |
| JP | 5331119 B2 | 10/2013 |
| JP | 2014-53429 A | 3/2014 |
| JP | 2014-86551 A | 5/2014 |
| JP | 2014-86700 A | 5/2014 |
| JP | 2014-96540 A | 5/2014 |
| KR | 10-2007-0003658 A | 1/2007 |
| KR | 10-2008-0049004 A | 6/2008 |
| KR | 10-2011-0121531 A | 11/2011 |
| KR | 10-2015-0018775 A | 2/2015 |
| TW | I306664 B | 2/2009 |
| TW | 201222802 A | 6/2012 |
| WO | 2010/100897 A1 | 9/2010 |
| WO | 2013/031707 A1 | 3/2013 |
| WO | 2013/147199 A1 | 10/2013 |
| WO | 2014/156933 A1 | 10/2014 |
| WO | 2013/172232 A1 | 1/2016 |

OTHER PUBLICATIONS

International Preliminary Report on Patentability of PCT Application No. PCT/JP2015/078495, dated May 4, 2017, 19 pages of English Translation and 07 pages of IPRP.

* cited by examiner

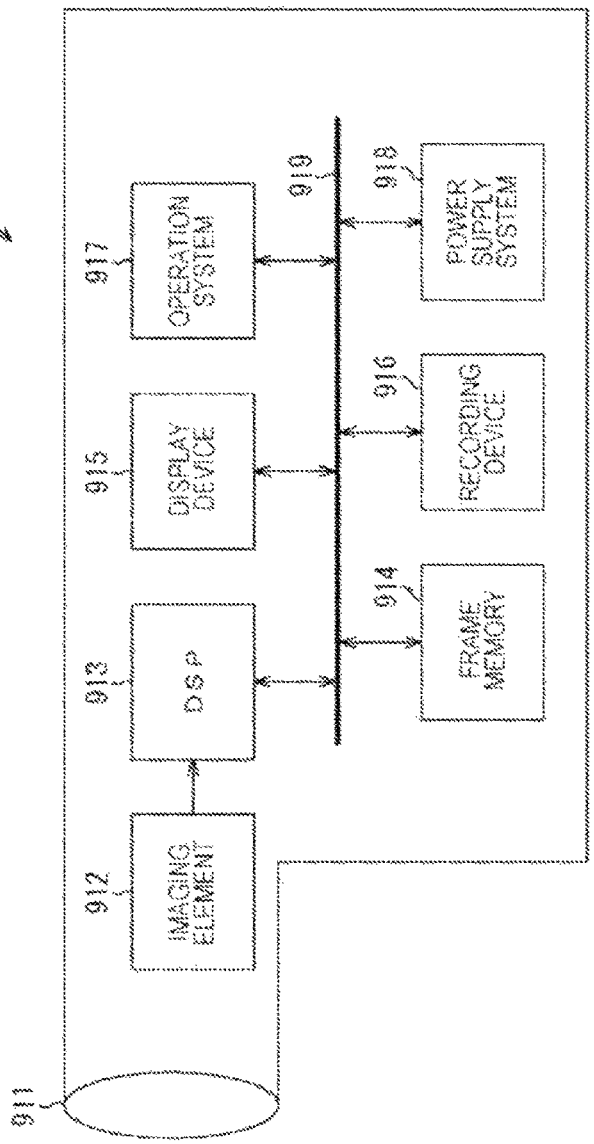

SOLID-STATE IMAGING ELEMENT AND ELECTRONIC DEVICE TO IMPROVE QUALITY OF AN IMAGE

CROSS REFERENCE TO RELATED APPLICATIONS

This application is a U.S. National Phase of International Patent Application No. PCT/JP2015/078495 filed on Oct. 7, 2015, which claims priority benefit of Japanese Patent Application No. JP 2014-213767 filed in the Japan Patent Office on Oct. 20, 2014. Each of the above-referenced applications is hereby incorporated herein by reference in its entirety.

TECHNICAL FIELD

The present technology relates to a solid-state imaging element and an electronic device, particularly, a solid-state imaging element and an electronic device capable of improving image quality.

BACKGROUND ART

In a back-illumination type CMOS image sensor (CIS), part of incident light, especially light in a long wavelength band is not sufficiently absorbed and passes through a photoelectric conversion unit formed of a photodiode and the like, and enters a wiring layer. Then, transmitted light is reflected by a wire of the wiring layer and enters a photoelectric conversion unit of an adjacent pixel, thereby causing color mixture and deteriorating image quality.

Therefore, in the related art, proposed is a technology in which a reflection layer made of tungsten is formed on an opposite surface of a light incident side of a substrate layer formed with a photoelectric conversion unit. Since the light having passed through the photoelectric conversion unit is reflected in a direction to the same photoelectric conversion unit by this reflection layer, occurrence of color mixture is prevented (refer to Patent Document 1, for example).

CITATION LIST

Patent Documents

Patent Document 1: Japanese Patent Application Laid-Open No. 2010-177705

SUMMARY OF THE INVENTION

Problems to be Solved by the Invention

However, in the invention of Patent Document 1, since a reflection layer is formed in a layer same as a contact portion adapted to connect a gate electrode of a substrate layer to a wiring layer, restrictions on wiring layout may be increased. On the other hand, in the case of prioritizing the wiring layout, sufficient reflection layers may not be able to be arranged, and occurrence of color mixture cannot be sufficiently suppressed.

Therefore, the present technology is directed to improving image quality of a solid-state imaging element.

Solutions to Problems

A solid-state imaging element according to a first aspect of the present technology includes: a photoelectric conversion unit adapted to photoelectrically convert incident light incident from a predetermined incident surface; and a wire arranged on a bottom surface side that is an opposite surface of the incident surface of the photoelectric conversion unit, and formed with a protruding pattern on a surface facing the photoelectric conversion unit.

A plurality of the above-described patterns can be arranged in the one photoelectric conversion unit.

The patterns can be arranged at various intervals in an extending direction of the wire.

The patterns can be arranged in a manner so as not to be aligned in a straight line.

A pixel located closer to an outer periphery of the solid-state imaging element can have a lower density of the patterns in a direction vertical to a side of the outer periphery.

The pattern can be arranged at a position not overlapping with a wire located at a position closer to the photoelectric conversion unit than a wire formed with the pattern when viewed from the photoelectric conversion unit side.

A width of the pattern can be set in accordance with a width of the wire.

A pixel located closer to the outer periphery of the solid-state imaging element can have a longer pattern length in a wire extending direction in the wire that extends in a direction vertical to the side of the outer periphery.

The pattern can be formed so as not to be formed in a wire of a wiring layer closest to the bottom surface of the photoelectric conversion unit.

The pattern can be arranged only in the photoelectric conversion unit of a pixel that receives light having a predetermined wavelength or more.

The pattern can be formed in at least one process out of a process of connecting wires of adjacent wiring layers and a process of connecting a wire to a semiconductor substrate formed with the photoelectric conversion unit.

An electronic device according to a first aspect of the present technology includes a solid-state imaging element including: a photoelectric conversion unit adapted to photoelectrically convert incident light incident from a predetermined incident surface; and a wire arranged on a bottom surface side that is an opposite surface of the incident surface of the photoelectric conversion unit, and formed with a protruding pattern on a surface facing the photoelectric conversion unit.

A solid-state imaging element according to a second aspect of the present technology includes: a pixel array unit on which a plurality of pixels each provided with photoelectric conversion unit is arrayed; and a reflection film arranged in a manner overlapping with part of a bottom surface that is an opposite surface of an incident surface of the photoelectric conversion unit in at least some of the pixels in the pixel array unit, and adapted to reflect part of the light having passed through the photoelectric conversion unit in a direction to the photoelectric conversion unit.

A range of the reflection film overlapping with the bottom surface of the photoelectric conversion unit can be divided into a plurality patterns per pixel.

It is possible to provide: a pixel in which the reflection film overlaps with a first range that is an approximately half of the bottom surface of the photoelectric conversion unit; and a pixel in which the reflection film overlaps with a second range that is an approximately half of the bottom surface of the photoelectric conversion unit and different from the first range.

The reflection film can be arranged in the wiring layer formed on the bottom surface side of the photoelectric conversion unit.

The reflection film can be arranged on a substrate stacked on a substrate formed with the pixel array unit.

The reflection film can be arranged in a layer formed with a gate electrode of a semiconductor substrate formed with the pixel array unit.

It is possible to further provide a separation layer adapted to separate a pixel arranged with the reflection film from an adjacent pixel.

Deviation of a focal point can be detected on the basis of a pixel signal of the pixel arranged with the reflection film.

A light shielding film is arranged in a manner overlapping with part of the incident surface of the photoelectric conversion unit at least in some of pixels each not arranged with the reflection film, and deviation of a focal point can be detected by differently using, in accordance with an incident light amount, a pixel signal of a pixel arranged with the reflection film and a pixel signal of a pixel arranged with the light shielding film.

Filter colors used in a pixel arranged with the reflection film are various, and deviation of a focal point can be detected by differently using pixel signals of the pixels having different colors in accordance with the incident light amount.

A white color filter can be used in at least some of pixels each arranged with the reflection film.

An electronic device according to a second aspect of the present technology includes a solid-state imaging element including: a pixel array unit on which a plurality of pixels each provided with photoelectric conversion unit is arrayed; and a reflection film arranged in a manner overlapping with part of a bottom surface that is an opposite surface of an incident surface of the photoelectric conversion unit in at least some of the pixels in the pixel array unit, and adapted to reflect part of the light having passed through the photoelectric conversion unit to the photoelectric conversion unit.

A solid-state imaging element according to a third aspect of the present technology includes: a pixel array unit on which a plurality of pixels is arrayed and a plurality of photoelectric conversion units is provided in at least some of the pixels; and a reflection film arranged in a manner overlapping with bottom surfaces that are opposite surfaces of incident surfaces of the plurality of photoelectric conversion units of the pixel provided with the plurality of photoelectric conversion units, and adapted to reflect the light having passed through the photoelectric conversion unit in a direction to the photoelectric conversion unit.

An electronic device according to the third aspect of the present technology includes a solid-state imaging element that including: a pixel array unit on which a plurality of pixels is arrayed and a plurality of photoelectric conversion units is provided in at least some of the pixels; and a reflection film arranged in a manner overlapping with bottom surfaces that are opposite surfaces of incident surfaces of the plurality of photoelectric conversion units of the pixels provided with the plurality of photoelectric conversion units, and adapted to reflect the light having passed through the photoelectric conversion unit in a direction to the photoelectric conversion unit.

A solid-state imaging element according to a fourth aspect of the present technology includes: a pixel array unit on which a plurality of pixels each provided with a photoelectric conversion unit adapted to receive incident light including infrared light is arranged; a first reflection film provided per the photoelectric conversion element and adapted to reflect transmitted light having passed through the photoelectric conversion element in multiple directions toward the photoelectric conversion element where the transmitted light has passed through; and a second reflection film formed between the photoelectric conversion elements adjacent to each other.

A protruding portion having a predetermined shape can be formed in the first reflection film.

At least either one of a shape and a position of the protruding portion can be varied by a position of the pixel.

The protruding portion can be formed in a quadrangular pyramid shape.

The protruding portion can be formed in a manner conforming to a groove formed on an opposite surface of a light incident surface of a semiconductor substrate formed with the photoelectric conversion element.

The protruding portion can be formed in a manner conforming to a groove formed on a film stacked on an opposite surface of a light incident surface of a semiconductor substrate formed with the photoelectric conversion element.

The second reflection film can be formed in a manner extending to the inside of the semiconductor substrate from the light incident surface of the semiconductor substrate formed with the photoelectric conversion element.

The second reflection film can be formed in a manner extending to the inside of the semiconductor substrate from the opposite surface of the light incident surface of the semiconductor substrate formed with the photoelectric conversion element.

The first reflection film and the second reflection film can be integrated.

An electronic device according to the fourth aspect of the present technology includes a solid-state imaging element including: a pixel array unit on which a plurality of pixels each provided with a photoelectric conversion unit adapted to receive incident light including infrared light is arranged; a first reflection film provided per the photoelectric conversion element and adapted to reflect transmitted light having passed through the photoelectric conversion element in multiple directions toward the photoelectric conversion element where the transmitted light has passed through; and a second reflection film formed between the photoelectric conversion elements adjacent to each other.

According to the first aspect of the present technology, the reflection direction of the transmitted light having passed through the photoelectric conversion unit is dispersed.

According to the second aspect of the present technology, the part of the transmitted light having passed through the photoelectric conversion unit is reflected in a direction to the photoelectric conversion units.

According to the third aspect of the present technology, the transmitted light having passed through the plurality of photoelectric conversion units inside the pixel is reflected in a direction to the respective photoelectric conversion units.

According to the fourth aspect of the present technology, the transmitted light having passed through the photoelectric conversion unit is reflected in plural directions toward the photoelectric conversion unit.

EFFECTS OF THE INVENTION

According to the first to fourth aspects of the present technology, image quality of the solid-state imaging element can be improved.

BRIEF DESCRIPTION OF DRAWINGS

FIG. 75 is a block diagram illustrating an exemplary configuration of an electronic device.

MODE FOR CARRYING OUT THE INVENTION

Figure 1:
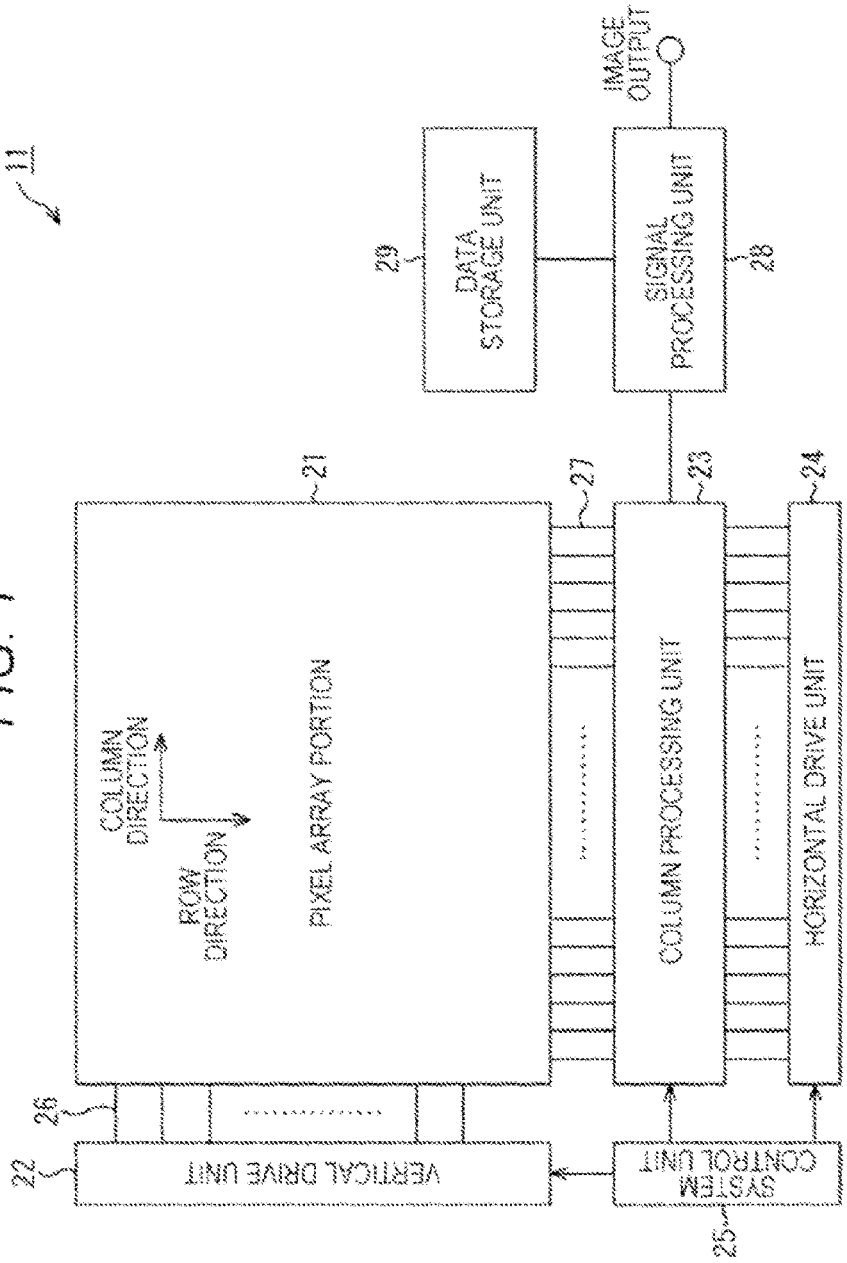
FIG. 1 is a diagram illustrating an exemplary configuration of a solid-state imaging element to which the present technology is applied.

Modes to implement the present technology (hereinafter referred to as "embodiments") will be described below. Note that the description will be provided in the following order.

1. Exemplary configuration of solid-state imaging element
2. First embodiment
3. Second embodiment
4. Third embodiment
5. Exemplary use of solid-state imaging element <1. Exemplary Configuration of Solid-State Imaging Element>

{Exemplary Structure of Solid-State Imaging Element 11}

First, an exemplary configuration of a solid-state imaging element 11 to which the present technology is applied will be described with reference to FIG. 1.

For example, the solid-state imaging element 11 is a back-illumination type image sensor formed of a complementary metal oxide semiconductor (CMOS) and the like and adapted to receive and photoelectrically convert light from a subject and image an image by generating an image signal. Meanwhile, the present technology is not limited to application to the CMOS image sensor.

Meanwhile, the back-illumination type image sensor is an image sensor that has a configuration including: a light receiving surface where light is incident from a subject, namely, an on-chip microlens adapted to condense light; and a photoelectric conversion unit such as a photodiode located in a space with a wiring layer provided with a wire such as a transistor to drive each pixel, and adapted to receive light from the subject and convert the light to an electric signal.

The solid-state imaging element 11 includes a pixel array unit 21, a vertical drive unit 22, a column processing unit 23, a horizontal drive unit 24, a system control unit 25, a pixel drive line 26, a vertical signal line 27, a signal processing unit 28, and a data storage unit 29.

In the solid-state imaging element 11, the pixel array unit 21 is formed on a semiconductor substrate not illustrated, and further the vertical drive unit 22 to the system control unit 25 are integrated on the semiconductor substrate.

The pixel array unit 21 is formed of a pixel including a photoelectric conversion element adapted to generate and accumulate electric charge in accordance with a light amount incident from a subject, and pixels constituting the pixel array unit 21 are two-dimensionally arrayed in a lateral direction (row direction) and a longitudinal direction (column direction) in the drawing.

For example, in the pixel array unit 21, the pixel drive line 26 is wired in the row direction for each pixel row formed of pixels arrayed in the row direction, and the vertical signal line 27 is wired in the column direction for each pixel column formed of pixels arrayed in the column direction.

The vertical drive unit 22 is formed of a shift register, an address decoder, and the like, and drives all of the respective pixels in the pixel array unit 21 at the same time or in the row units or the like by supplying the respective pixels with signals and the like via the plurality of pixel drive lines 26.

The column processing unit 23 reads a signal from each pixel via the vertical signal line 27 per pixel column of the pixel array unit 21, and generates a pixel signal by performing noise removal processing, correlated double sampling, analog to digital (A/D) conversion, and the like.

The horizontal drive unit 24 is formed of a shift register and an address decoder, and sequentially selects unit circuits corresponding to the pixel columns of the column processing unit 23. When such selective scanning is performed by the horizontal drive unit 24, the pixel signals subjected to signal processing in the column processing unit 23 per unit circuit are sequentially output to the signal processing unit 28.

The system control unit 25 is formed of, for example, a timing generator adapted to generate various kinds of timing signals, and performs drive control for the vertical drive unit 22, column processing unit 23, and horizontal drive unit 24 on the basis of the timing signals generated in the timing generator.

The signal processing unit 28 applies signal processing such as arithmetic processing to a pixel signal supplied from the column processing unit 23 while temporarily storing data in the data storage unit 29 as needed, and outputs an image signal formed of each pixel signal.

{Pixel Exemplary Configuration}

Figure 2:
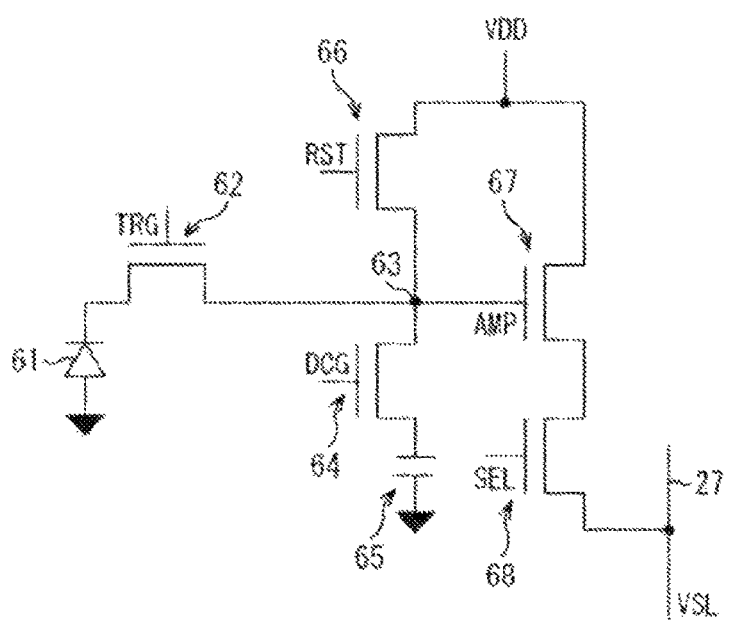
FIG. 2 is a circuit diagram illustrating an exemplary configuration of a pixel.

Next, a configuration of each pixel of the above-described pixel array unit 21 will be described. FIG. 2 is a circuit diagram illustrating an exemplary configuration of one pixel provided in the pixel array unit 21.

In this example, the pixel of the pixel array unit 21 is configured to include a photodiode 61, a transfer gate portion 62, an electric charge-voltage conversion unit 63, a capacitance changeover switch 64, an electric charge accumulation unit 65, a reset gate portion 66, an amplification transistor 67, and a selection transistor 68.

The photodiode 61 is a photoelectric conversion element formed of, for example, a PN-junction photodiode, and adapted to receive light from a subject, generate and accumulate electric charge by performing photoelectric conversion in accordance with the received light amount.

The transfer gate portion 62 is provided between the photodiode 61 and the electric charge-voltage conversion unit 63, and adapted to transfer electric charge accumulated in the photodiode 61 to the electric charge-voltage conversion unit 63 in accordance with a drive signal TRG applied to a gate electrode of the transfer gate portion 62.

For example, in FIG. 2, the transfer gate portion 62, capacitance changeover switch 64, reset gate portion 66, and selection transistor 68 are formed of N-channel MOS transistors.

Furthermore, drive signals TRG, DCG, RST, and SEL are supplied to gate electrodes of the transfer gate portion 62 to the selection transistor 68. These drive signals are pulse signals which become an active state (ON state) in a high level state, and become an inactive state (OFF state) in a low level state.

Therefore, for example, when the drive signal TRG supplied to the gate electrode of the transfer gate portion 62 becomes the active state in the transfer gate portion 62 and the transfer gate portion 62 becomes the ON state, and electric charge accumulated in the photodiode 61 is transferred to the electric charge-voltage conversion unit 63.

The electric charge-voltage conversion unit 63 is a floating diffusion region (FD) adapted to: convert, to an electric signal such as a voltage signal, the electric charge transferred from the photodiode 61 via the transfer gate portion 62; and output the voltage signal.

The reset gate portion 66 is connected to the electric charge-voltage conversion unit 63, and furthermore, the vertical signal line 27 is also connected via the amplification transistor 67 and the selection transistor 68. Additionally, the electric charge accumulation unit 65 that is capacitance (capacitor) to accumulate electric charge is also connected to the electric charge-voltage conversion unit 63 via the capacitance changeover switch 64.

The capacitance changeover switch 64 is turned ON/OFF in accordance with the drive signal DCG, thereby switching a connection state between the electric charge-voltage conversion unit 63 and the electric charge accumulation unit 65 to either one of an electrically-connected state and an electrically-disconnected state.

In other words, when the drive signal DCG is supplied to the gate electrode constituting the capacitance changeover switch 64 and this drive signal DCG is turned ON, potential immediately below the capacitance changeover switch 64 becomes deep, and the electric charge-voltage conversion unit 63 and the electric charge accumulation unit 65 are electrically connected.

In contrast, when the drive signal DCG is turned OFF, the potential immediately below the capacitance changeover switch 64 becomes shallow, and the electric charge-voltage conversion unit 63 and the electric charge accumulation unit 65 are electrically disconnected.

Therefore, capacitance is added to the electric charge-voltage conversion unit 63 by turning ON/OFF the drive signal DCG, and pixel sensitivity can be changed. Specifically, a relation of $\Delta V = \Delta Q/C$ is satisfied when a change amount of accumulated electric charge is defined as $\Delta Q$, voltage change at this point is defined as $\Delta V$, and a capacitance value is defined as C.

Here, when a capacitance value of the electric charge-voltage conversion unit 63 is defined as $C_{FD}$ and a capacitance value of the electric charge accumulation unit 65 is defined as $C_{CAP}$, the capacitance value C in a pixel region where signal level reading is performed becomes $C_{FD}+C_{CAP}$ in a state that the drive signal DCG is turned ON. In contrast, when the drive signal DCG is turned OFF, the capacitance value C is changed to $C_{FD}$, and therefore, voltage sensitivity relative to a change amount of electric charge (voltage change amount) is increased.

Thus, pixel sensitivity can be suitably changed by turning ON/OFF the drive signal DCG in the solid-state imaging element 11. For example, when the drive signal DCG is turned ON, the electric charge accumulation unit 65 is electrically connected to the electric charge-voltage conversion unit 63. Therefore, part of electric charge transferred from the photodiode 61 to the electric charge-voltage conversion unit 63 is accumulated not only in the electric charge-voltage conversion unit 63 but also in the electric charge accumulation unit 65.

Meanwhile, more specifically, an electric charge accumulation unit provided in an adjacent pixel is also suitably connected to the electric charge-voltage conversion unit 63 in addition to the electric charge accumulation unit 65. Furthermore, the electric charge accumulation unit 65 is provided in a manner overlapping with the photodiode 61 on an opposite side of the light receiving surface of the photodiode 61, namely, adjacent to a region where light from a subject does not enter. Therefore, there is no possibility that the light from the subject is shielded by the electric charge accumulation unit 65 and a light amount of the light incident upon the photodiode 61 is decreased.

The reset gate portion 66 is an element to suitably initialize (reset) respective regions from the electric charge-voltage conversion unit 63 to the electric charge accumulation unit 65, and has a drain connected to a power source of a power source voltage VDD and has a source connected to the electric charge-voltage conversion unit 63. A drive signal RST is applied to a gate electrode of the reset gate portion 66 as a reset signal.

Furthermore, when the drive signal RST is turned to active state, the reset gate portion 66 is brought into a conductive state, and potential of the electric charge-voltage conversion unit 63 and the like are reset to a level of the power source voltage VDD. In other words, the electric charge-voltage conversion unit 63 and the like are initialized.

The amplification transistor 67 has a gate electrode connected to the electric charge-voltage conversion unit 63, has a drain connected to the power source having the power source voltage VDD, and functions as an input unit of a source follower circuit adapted to read electric charge obtained by photoelectric conversion in the photodiode 61. In other words, the amplification transistor 67 has a source connected to the vertical signal line 27 via the selection transistor 68, thereby constituting a source follower circuit with a constant current source connected to one end of the vertical signal line 27.

The selection transistor 68 is connected between the source of the amplification transistor 67 and the vertical signal line 27, and a drive signal SEL is supplied to the gate electrode of the selection transistor 68 as a selection signal. When the drive signal SEL is turned to an active state, the selection transistor 68 is brought into a conductive state, and a pixel provided with the selection transistor 68 is brought into a selected state. When the pixel is brought into the selected state, a signal output from the amplification transistor 67 is read by the column processing unit 23 via the vertical signal line 27.

Furthermore, in each pixel, a plurality of drive lines is wired in respective pixel row as the pixel drive lines 26 in FIG. 1, for example. Then, the drive signals TRG, DCG, RST, and SEL are supplied into the pixels from the vertical drive unit 22 via the plurality of drive lines provided as the pixel drive lines 26.

Meanwhile, a pixel circuit of FIG. 2 is an exemplary pixel circuit that can be used in the pixel array unit 21, and a pixel circuit having a different configuration can also be used. For example, a 4Tr type pixel circuit which does not include the capacitance changeover switch 64 and the electric charge accumulation unit 65 and is not provided with a sensitivity change function can also be used in the pixel array unit 21.

<2. First Embodiment>

Next, a first embodiment of the present technology will be described with reference to FIGS. 3 to 23.

{Exemplary Structure of Solid-State Imaging Element}

Figure 3:
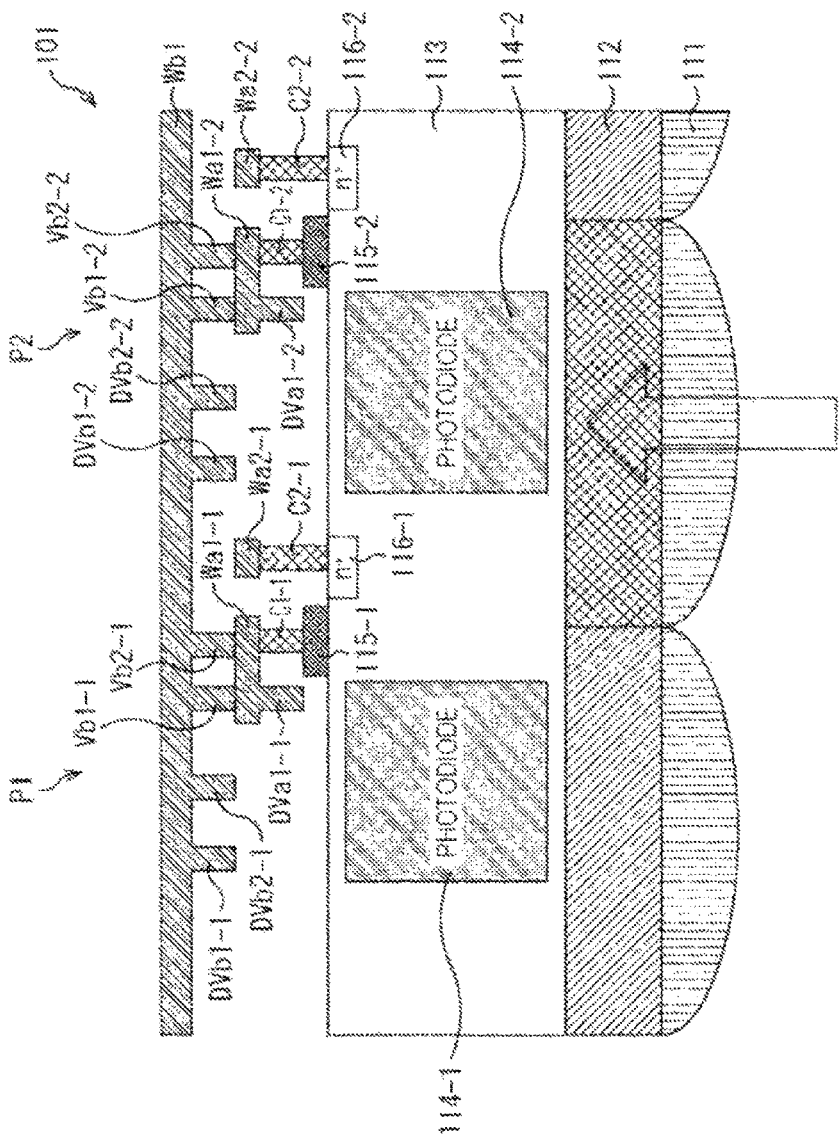
FIG. 3 is a cross-sectional view schematically illustrating a solid-state imaging element according to a first embodiment of the present technology.

FIG. 3 is a cross-sectional view schematically illustrating an exemplary configuration of a solid-state imaging element 101 that is one embodiment of a solid-state imaging element 11 of FIG. 1. Meanwhile, FIG. 3 illustrates a cross-section of a portion including two pixels formed of pixels P1 and P2 in the solid-state imaging element 101, but other pixels also basically have the same configuration.

In the solid-state imaging element 101, for example, a color filter 112 and an on-chip microlens 111 are stacked on a light incident-side surface (hereinafter referred to as incident surface) of a semiconductor substrate 113 formed of, for example, a silicon substrate.

Photodiodes 114-1, 114-2 each corresponding to a photodiode 61 of FIG. 2 are formed inside the semiconductor substrate 113. The light from a subject enters the photodiodes 114-1, 114-2 via the on-chip microlens 111 and the color filter 112.

Furthermore, electric charge-voltage conversion units 116-1, 116-2 each corresponding to an electric charge-voltage conversion unit 63 of FIG. 2 are formed on a surface (hereinafter referred to as bottom surface) of an opposite surface of the incident surface of the semiconductor substrate 113. Additionally, transfer gate portions 115-1, 115-2 each corresponding to a transfer gate portion 62 of FIG. 2 are formed on the bottom surface of the semiconductor substrate 113. The transfer gate portion 115-1 is formed between the photodiode 114-1 and the electric charge-voltage conversion unit 116-1, and the transfer gate portion 115-2 is formed between the photodiode 114-2 and the electric charge-voltage conversion unit 116-2.

The photodiode 114-1, transfer gate portion 115-1, and electric charge-voltage conversion unit 116-1 are included in the pixel P1, and the photodiode 114-2, transfer gate portion 115-2, and electric charge-voltage conversion unit 116-2 are included in the pixel P2.

A wiring layer is stacked on a bottom surface side of the semiconductor substrate 113. In FIG. 3, an example in which there are two wiring layers is illustrated. In a first wiring layer, wires Wa1-1, Wa1-2 and wires Wa2-1, Wa2-2 are formed. In a second wiring layer, a wire Wb1 is formed.

The transfer gate portion 115-1 is connected to the wire Wa1-1 via a contact C1-1. The electric charge-voltage conversion unit 116-1 is connected to the wire Wa2-1 via a contact C2-1. The wire Wa1-1 is connected to the wire Wb1 via vias Vb1-1 and Vb2-1.

The transfer gate portion 115-2 is connected to the wire Wa1-2 via a contact C1-2. The electric charge-voltage conversion unit 116-2 is connected to the wire Wa2-2 via a contact C2-2. The wire Wa1-2 is connected to the wire Wb1 via vias Vb1-2 and Vb2-2.

A dummy via DVa1-1 that is a protruding pattern is formed on a surface on the bottom-side surface of the semiconductor substrate 113 of the wire Wa1-1, in other words, a surface facing the photodiode 114-1 of the wire Wa1-1 (hereinafter also referred to as incident-side surface) above the photodiode 114-1. The dummy via DVa1-1 is electrically connected to nowhere other than the wire Wa1-1. Furthermore, dummy vias DVb1-1 and DVb2-1 which are protruding patterns are formed on an incident-side surface of the wire Wb1 above the photodiode 114-1. The dummy vias DVb1-1 and DVb2-1 are electrically connected to nowhere other than wire Wb1.

In the similar manner, a dummy via DVa1-2 that is a protruding pattern is formed on an incident-side surface of the wire Wa1-2 above the photodiode 114-2. The dummy via DVa1-2 is not electrically connected to nowhere other than the wire Wa1-2. Additionally, dummy vias DVb1-2 and DVb2-2 are formed on the incident-side surface of the wire Wb1 above the photodiode 114-2. The dummy vias DVb1-2 and DVb2-2 are not electrically connected to nowhere other than the wire Wb1.

The dummy vias DVa1-1, DVb1-1 and DVb2-1 function to disperse a reflection direction of light that has been transmitted without being absorbed in the photodiode 114-1 (hereinafter referred to as transmitted light) as described later. In the similar manner, the dummy vias DVa1-2, DVb1-2, and DVb2-2 function to disperse a reflection direction of transmitted light that has been transmitted without being absorbed in the photodiode 114-2.

Meanwhile, in the case where there is no need to differentiate each one of the photodiodes 114-1 and 114-2 in the following, each thereof will be simply referred to as a photodiode 114. Additionally, in the case where there is no need to differentiate each one of the transfer gate portions 115-2 and 115-2 in the following, each thereof will be simply referred to as a transfer gate portion 115. Furthermore, in the case where there is no need to differentiate each one of the electric charge-voltage conversion units 116-1 and 116-2 in the following, each thereof will be simply referred to as an electric charge-voltage conversion unit 116.

{Exemplary Dummy Via Arrangement}

Here, exemplary dummy via arrangement will be described with reference to FIG. 4.

Figure 4:
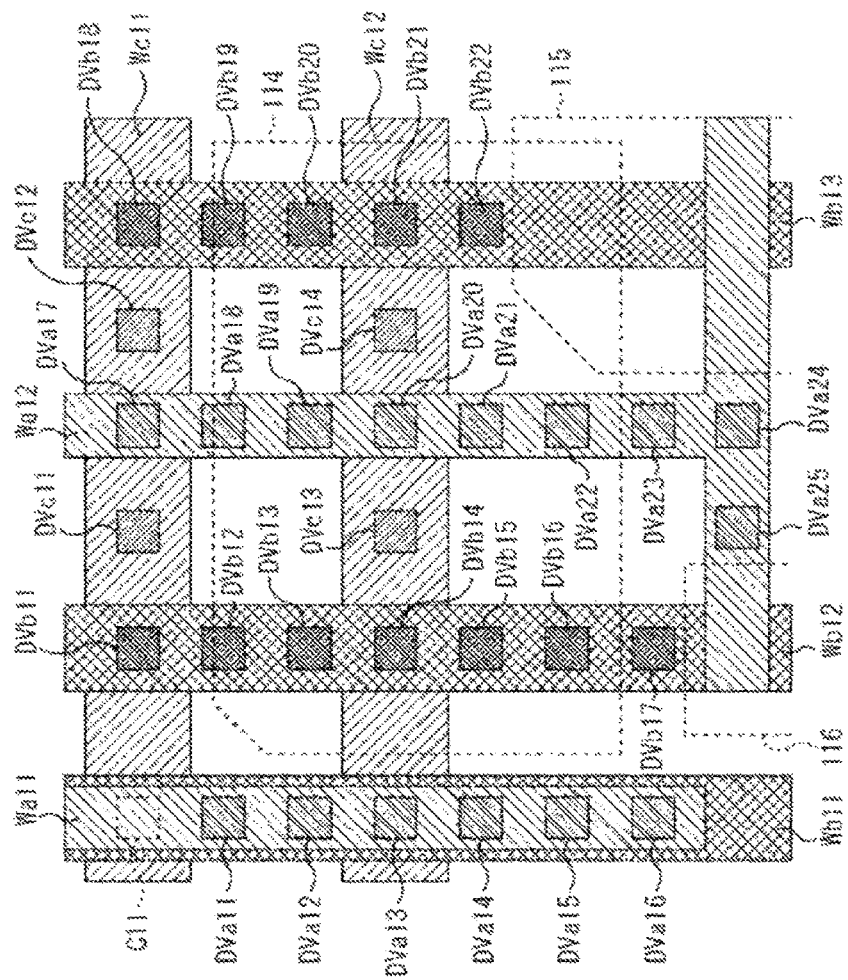
FIG. 4 is a diagram illustrating an exemplary dummy via arrangement.

FIG. 4 schematically illustrates an example in the case of viewing a wiring layer of the solid-state imaging element 101 from the semiconductor substrate 113 side (photodiode 114 side, light incident side). Meanwhile, the example of this wiring layer differs from the example illustrated in FIG. 3.

In this example, the example in which three wiring layers formed of a first wiring layer, a second wiring layer, and a third wiring layer are stacked in this order from a side closer to the semiconductor substrate 113. In other words, the first wiring layer is a wiring layer closest to the semiconductor substrate 113, and the third wiring layer is a wiring layer farthest from the semiconductor substrate 113.

The wires Wa11 and Wa12 are formed in the first wiring layer. The wire Wa11 is arranged at a position near a left end of the drawing in a manner extending in a longitudinal direction (vertical direction). The wire Wa12 has an inverted T-shape and is arranged at a position in the center slightly close to the right side in the drawing.

The wires Wb11 to Wb13 are formed in the second wiring layer. The wire Wb11 is arranged in a manner overlapping with the wire Wa11. The wire Wb12 is arranged at a position close to the left side in the drawing in a manner extending in a longitudinal direction. The wire Wb13 is arranged at a position near the right end in the drawing in a manner extending in the longitudinal direction.

The wires Wc11 and Wc12 are formed in the third wiring layer. The wire Wc11 is arranged at a position near an upper end in the drawing in a manner extending in a lateral direction (horizontal direction). The wire Wc12 is arranged at a position in the center of the drawing in a manner extending in the lateral direction.

Additionally, the incident-side surfaces of the wires Wa11 to Wc12 are formed with dummy vias DVa11 to DVc14 which are protruding patterns each having a square surface and substantially the same shape.

Meanwhile, in the case where there is no need to differentiate each one of the dummy vias DVa11 to DVc14, each thereof will be simply referred to as a dummy via DV in the following.

Specifically, dummy vias DVa11 to DVa16 are formed on the incident-side surface of the wire Wa11 at substantially equal intervals in the longitudinal direction in a manner aligned in a straight line. However, no dummy via is provided near a position where the contact C11 is formed.

Dummy vias DVa17 to DVa24 are formed at substantially equal intervals in the longitudinal direction in a manner aligned in a straight line on the incident-side surface which is a side in the longitudinal direction of the wire Wa12. Dummy vias DVa24 and DVa25 are formed on the incident-side surface which is a side in the lateral direction of the wire Wa12. However, no dummy via is provided at a portion overlapping with the transfer gate portion 115 and the electric charge-voltage conversion unit 116.

The wire Wb11 substantially overlaps with the wire Wa11, and no dummy via is provided at the wire Wb11.

Dummy vias DVb11 to DVb17 are formed on the incident-side surface of the wire Wb12 at substantially equal intervals in the longitudinal direction in a manner aligned in a straight line. However, no dummy via is provided at a portion overlapping with the electric charge-voltage conversion unit 116.

Dummy vias DVb18 to DVb22 are formed on the incident-side surface of the wire Wb13 at substantially equal intervals in a manner aligned in the longitudinal direction in a straight line. However, no dummy via is provided at a portion overlapping with the transfer gate portion 115.

The dummy vias DV are formed at the positions not overlapping with the wires Wa11, Wa12, and Wb11 to Wb13 on the incident-side surface of the wire Wc11. More specifically, a dummy via DVc11 is formed between the wire Wb12 and the wire Wa12 and a dummy via DVc12 is formed between the wire Wa12 and the wire Wb13 on the incident-side surface of the wire Wc11.

The dummy vias DV are formed on the incident-side surface of the wire Wc12 at the positions not overlapping with the wires Wa11, Wa12, and Wb11 to Wb13. More specifically, a dummy via DVc13 is formed between the wire Wb12 and the wire Wa12 and a dummy via DVc14 is formed between the wire Wa12 and the wire Wb13 on the incident-side surface of the wire Wc12.

Thus, the dummy vias DV are formed in a manner aligned at equal intervals in the longitudinal direction and the lateral direction on the incident-side surfaces of the wires Wa11 to Wc12 except for the portions overlapping with the contact C11, transfer gate portion 115, and electric charge-voltage conversion unit 116 when viewed from the semiconductor substrate 113 side (photodiode 114 side). Furthermore, each of the dummy vias DV is formed so as not to overlap with a wire located at a position closer to the semiconductor substrate 113 than a wire formed with the dummy via DV when viewed from the semiconductor substrate 113. Furthermore, multiple dummy vias DV are each arranged in one photodiode 114.

Here, effects of the dummy via DV will be described with reference to FIGS. 5 to 6.

Figure 5:
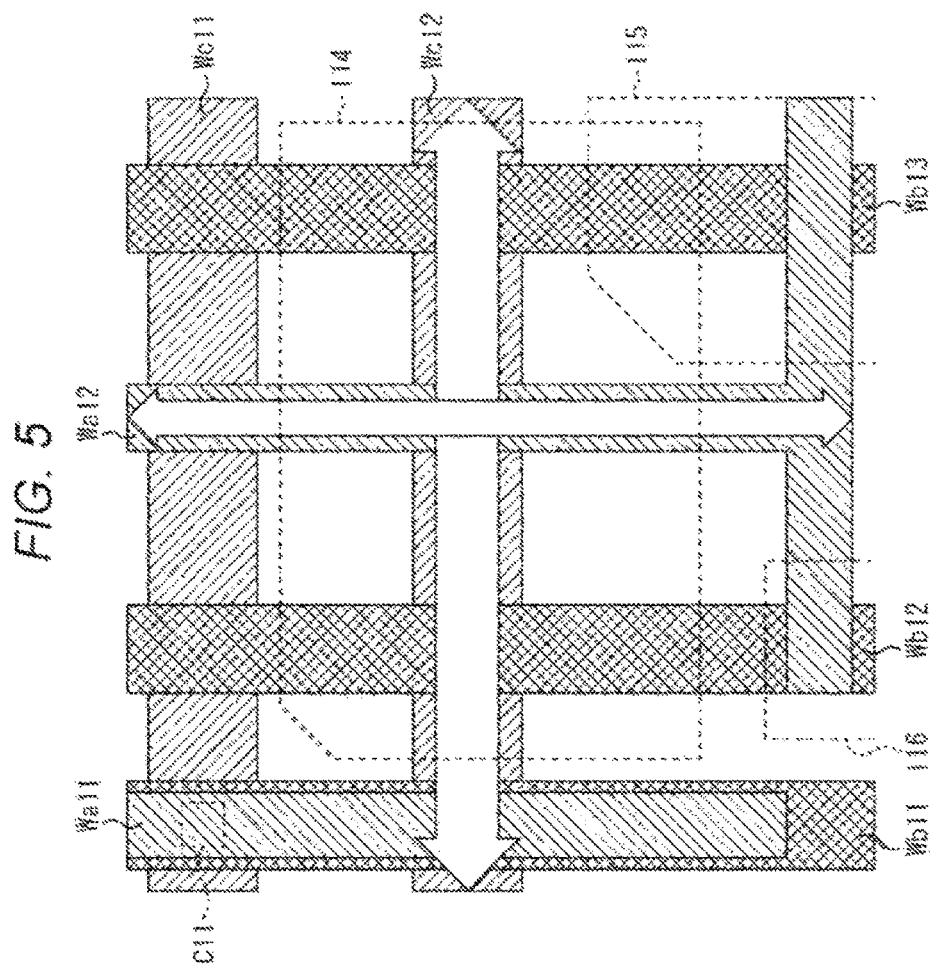
FIG. 5 is a diagram to describe a reflection direction of transmitted light in the case of providing no dummy via.

As illustrated in FIG. 5, in the case of providing no dummy via DV, a reflection direction of transmitted light is likely to be affected by a wire arranged in a manner passing across the bottom surface of the photodiode 114 like the wire Wa12 and wire Wc12, and tends to be biased in a specific direction. Additionally, when the reflection direction of the transmitted light is biased, a light amount of reflection light entering an adjacent pixel (mixed color amount) is biased, and image quality is degraded. Particularly, when the mixed color amount is biased between pixels of the same color, degradation of the image quality is conspicuous.

For example, in the case where transmitted light having passed through an R pixel is reflected and enters a Gb pixel and a Gr pixel adjacent to each other, the reflection direction of the transmitted light is biased. Consequently, a difference is generated in the mixed color amount between the Gb pixel and the Gr pixel of the same color. The difference of this mixed color amount appears as noise having a lateral-striped shape.

Here, an R pixel, a G pixel, and a B pixel respectively represent: a pixel adapted to detect light having a red (R) wavelength; a pixel adapted to detect light having a green (G) wavelength; and a pixel adapted to detect light having a blue (B) wavelength. Additionally, for example, a Gb pixel represents a G pixel located in a row same as the B pixel in a Bayer array, and for example, a Gr pixel represents a G pixel located in a row same as the R pixel in the Bayer array.

Figure 6:
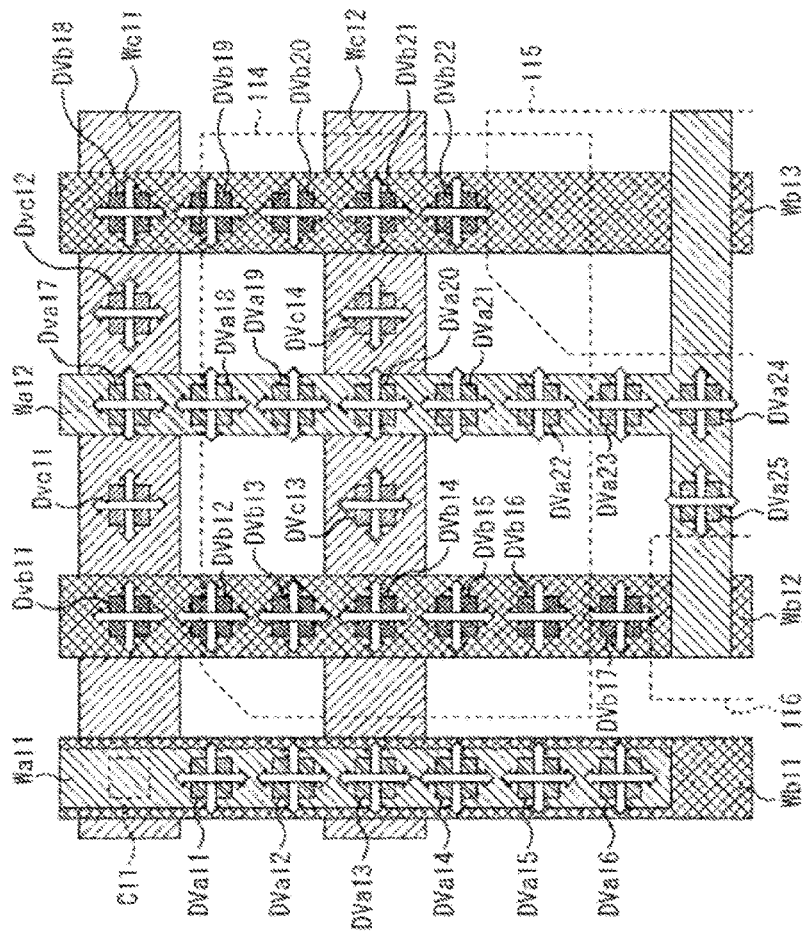
FIG. 6 is a diagram to describe an effect of the first embodiment of the present technology.

On the other hand, as illustrated in FIG. 6, in the case of providing dummy vias DV, most of transmitted light is reflected by any one of the dummy vias DV before reaching the incident-side surfaces of the wires Wa11 to Wc12. A reflection surface in each of the dummy vias DV has a square shape having a small area, and functions to disperse the reflection direction of the transmitted light. As a result, the reflection direction of the transmitted light is suppressed from being biased, and mixed color amounts of adjacent pixels are uniformed. Consequently, degradation of image quality caused by noise having a lateral-striped shape and the like can be suppressed.

Additionally, the dummy via DV is formed at a position where no wire exists in a lower wiring layer. Therefore, since there are fewer restrictions on wiring layout compared to a case where measures against refection are taken in the wiring layer, the wiring layout is more easily designed. Furthermore, since increase of parasitic capacitance is more suppressed compared to the case where measures against refection are taken in the wiring layer, degradation of conversion efficiency and increase of a settling time can be suppressed.

Moreover, since the reflection direction of the transmitted light can be dispersed by the dummy vias DV, interference between the transmitted light and the reflection light can be suppressed, and occurrence of spectral ripple can be suppressed.

{Modified Example of Dummy Via Arrangement}

Next, a modified example of dummy via arrangement will be described with reference to FIGS. 7 to 12.

(First Modified Example)

Figure 7:
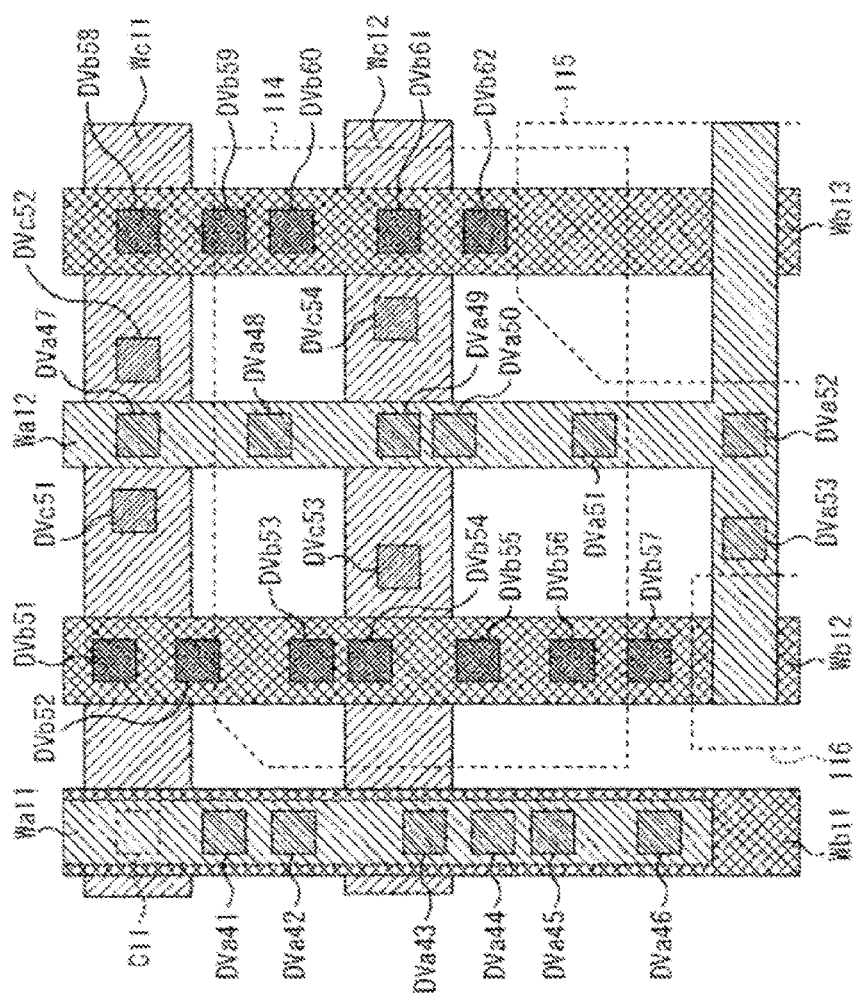
FIG. 7 is a diagram illustrating a first modified example of dummy via arrangement.

FIG. 7 is a diagram illustrating a first modified example of dummy via arrangement. Note that a portion corresponding to the portion in FIG. 4 is denoted by a same reference sign in the drawing.

In the above-described example of FIG. 4, dummy vias are arranged at substantially equal intervals in a wire extending direction on an incident-side surface of each wire. However, in this case, there may be a risk in which the dummy vias aligned at equal intervals form a diffraction grating and enhance reflection light in a specific direction. Therefore, in the first modified example illustrated in FIG. 7, dummy vias are arranged such that intervals between adjacent dummy vias do not become equal intervals.

Specifically, dummy vias DVa41 to DVa46 are arranged in a manner aligned in a straight line in the longitudinal direction on the incident-side surface of the wire Wa11. However, no dummy via is provided near a position where the contact C11 is formed. Additionally, intervals of the dummy vias DVa41 to DVa46 are not equal intervals and different from one another.

Dummy vias DVa47 to DVa52 are arranged in a manner aligned in a straight line in the longitudinal direction on the incident-side surface which is a side in the longitudinal direction of the wire Wa12. Note that intervals of the dummy vias DVa47 to DVa52 are not equal intervals and different from one another. Dummy vias DVa52 and DVa53 are formed on the incident-side surface which is a side in the lateral direction of the wire Wa12. However, no dummy via is provided at a portion overlapping with the transfer gate portion 115 and the electric charge-voltage conversion unit 116.

Dummy vias DVb51 to DVb57 are formed on the incident-side surface of the wire Wb12 in the longitudinal direction in a manner aligned in a straight line. However, no dummy via is provided at a portion overlapping with the electric charge-voltage conversion unit 116. Additionally, intervals of the dummy vias DVa51 to DVa57 are not equal intervals and different from one another.

Dummy vias DVb58 to DVb62 are formed on the incident-side surface of the wire Wb13 in the longitudinal direction in a manner aligned in a straight line. However, no dummy via is provided at a portion overlapping with the transfer gate portion 115. Additionally, intervals of the dummy vias DVb58 to DVb62 are not equal intervals and different from one another.

A dummy via DVc51 is formed between the wire Wb12 and the wire Wa12 and a dummy via DVc52 is formed between the wire Wa12 and the wire Wb13 on the incident-side surface of the wire Wc11. Note that the dummy via DVc51 is not arranged in the middle between the wire Wb12 and the wire Wa12 but at a position closer to the wire Wa12. Therefore, an interval between the dummy via DVb51 and the dummy via DVc51 and an interval between the dummy via DVc51 and the dummy via DVa47 are not equal interval and different from each other. Additionally, the dummy via DVc52 is not arranged in the middle between the wire Wa12 and the wire Wb13 but at a position closer to the wire Wa12. Therefore, an interval between the dummy via DVa47 and the dummy via DVc52 and an interval between the dummy via DVc52 and the dummy via DVb58 are not equal interval and different from each other.

A dummy via DVc53 is formed between the wire Wb12 and the wire Wa12 and a dummy via DVc54 is formed between the wire Wa12 and the wire Wb13 on the incident-side surface of the wire Wc12. Note that the dummy via DVc53 is not arranged in the middle between the wire Wb12 and the wire Wa12 but at a position closer to the wire Wb12. Therefore, an interval between the dummy via DVb54 and the dummy via DVc53 and an interval between the dummy via DVc53 and the dummy via DVa49 are not equal interval and different from each other. Additionally, the dummy via DVc54 is not arranged in the middle between the wire Wa12 and the wire Wb13 but at a position closer to the wire Wb13. Therefore, an interval between the dummy via DVa49 and the dummy via DVc54 and an interval between the dummy via DVc54 and the dummy via DVb61 are not equal interval and different from each other.

Thus, since the dummy vias DV are arranged so as not to be aligned at equal intervals, the dummy vias DV are prevented from forming a diffraction grating and enhancing reflection light in a specific direction.

(Second Modified Example)

Figure 8:
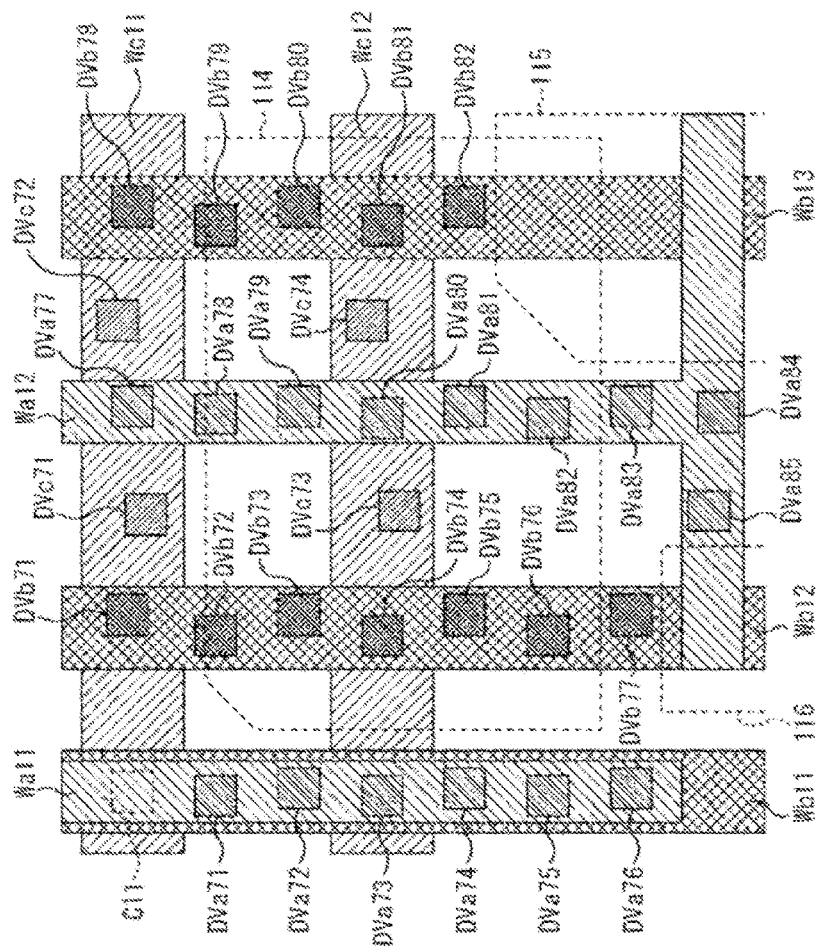
FIG. 8 is a diagram illustrating a second modified example of dummy via arrangement.

FIG. 8 is a diagram illustrating a second modified example of dummy via arrangement. Note that a portion corresponding to the portion in FIG. 4 is denoted by a same reference sign in the drawing.

In this second modified example, dummy vias are prevented from forming a diffraction grating by a method different from the first modified example. In other words, in the second modified example, the dummy vias are arranged so as not to be aligned in a straight line.

Specifically, dummy vias DVa71 to DVa76 are arranged in the longitudinal direction on the incident-side surface of the wire Wa11. However, no dummy via is provided near a position where the contact C11 is formed. Additionally, the dummy vias DVa71 to DVa76 are arranged in a manner displaced from one another in the lateral direction so as not to be aligned in a straight line.

Dummy vias DVa77 to DVa82 are arranged in a manner aligned in the longitudinal direction on the incident-side surface which is the side in the longitudinal direction of the wire Wa12. However, the dummy vias DVa77 to DVa82 are arranged in a manner displaced from one another in the lateral direction so as not to be aligned in a straight line.

Dummy vias DVa84 and DVa85 are formed on the incident-side surface which is a side in the lateral direction of the wire Wa12. However, no dummy via is provided at a portion overlapping with the transfer gate portion 115 and the electric charge-voltage conversion unit 116. Additionally, the dummy vias DVa84 and DVa85 are arranged in a manner displaced from each other in the longitudinal direction so as not to be aligned in a straight line.

Dummy vias DVb71 to DVb77 are formed on the incident-side surface of the wire Wb12 in a manner aligned in the longitudinal direction. However, no dummy via is provided at a portion overlapping with the electric charge-voltage conversion unit 116. Additionally, the dummy vias DVa71 to DVa77 are arranged in a manner displaced from each other in the lateral direction so as not to be aligned in a straight line.

Dummy vias DVb78 to DVb82 are formed on the incident-side surface of the wire Wb13 in a manner aligned in the longitudinal direction. However, no dummy via is provided at a portion overlapping with the transfer gate portion 115. Additionally, the dummy vias DVb78 to DVb82 are arranged in a manner displaced from each other in the lateral direction so as not to be aligned in a straight line.

A dummy via DVc71 is formed between the wire Wb12 and the wire Wa12 and a dummy via DVc72 is formed between the wire Wa12 and the wire Wb13 on the incident-side surface of the wire Wc11. Note that the dummy vias DVc71 and DVc72 are arranged in a manner displaced from each other in the longitudinal direction such that the dummy via DVb71 to dummy via DVb78 are not aligned in a straight line.

A dummy via DVc73 is formed between the wire Wb12 and the wire Wa12, and a dummy via DVc74 is formed between the wire Wa12 and the wire Wb13 on the incident-side surface of the wire Wc12. Note that the dummy vias DVc73 and DVc74 are arranged in a manner displaced from each other in the longitudinal direction such that the dummy via DVa73 to dummy via DVb81 are not aligned in a straight line.

Thus, since the dummy vias DV are not aligned in a straight line in the longitudinal direction or the lateral direction, the dummy vias DV are prevented from forming a diffraction grating and enhancing reflection light in a specific direction.

(Third Modified Example)

Figure 9:
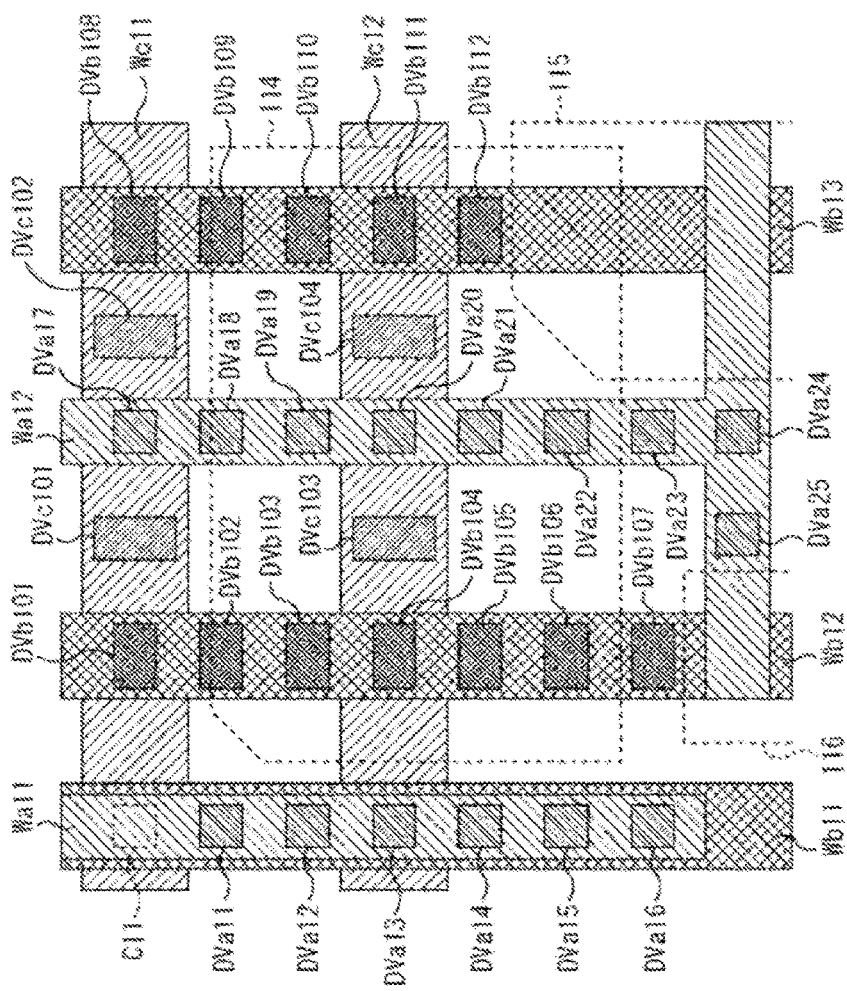
FIG. 9 is a diagram illustrating a third modified example of dummy via arrangement.

FIG. 9 is a diagram illustrating a third modified example of dummy via arrangement. Note that a portion corresponding to the portion in FIG. 4 is denoted by a same reference sign in the drawing.

In the above-described example of FIG. 4, the example in which all of dummy vias have the same shape is provided. On the other hand, in the example of FIG. 9, a width of a dummy via is changed in accordance with a wiring width.

Specifically, dummy vias DVa11 to DVa25 same as those in FIG. 4 are formed in the wires Wa11 and Wa12 of the first wiring layer.

On the other hand, on the incident-side surface of the wire Wb12, dummy vias DVb101 to DVb107 are formed at the same positions as the dummy vias DVb11 to DVb17 in FIG. 4. Additionally, on the incident-side surface of the wire Wb13, dummy vias DVb108 to DVb112 are formed at the same positions as the dummy vias DVb18 to DVb22 in FIG. 4.

Compared to dummy vias DVb11 to DVb22 in FIG. 4, the dummy vias DVb101 to DVb112 each have a longer length in a width direction of the wire (wire Wb12 or Wb13). Additionally, the dummy vias DVb101 to DVb112 each have a longer length in a width direction of the wire than the dummy vias DVa11 to DVa25 of the first wiring layer each have.

Additionally, on the incident-side surface of the wire Wc11, dummy vias DVc101 and DVc102 are formed at the same positions as the dummy vias DVc11 and DVc12 in FIG. 4. Additionally, on the incident-side surface of the wire Wb13, dummy vias DVc103 to DVc104 are formed at the same positions as the dummy vias DVc13 to DVc14 in FIG. 4.

Compared to the dummy vias DVc11 to DVc14 in FIG. 4, the dummy vias DVc101 to DVc104 each have a longer length in a width direction of the wire (wire Wc11 or Wc12). Additionally, the dummy vias DVc101 to DVc104 each have a longer length in a width direction of the wire than the dummy vias DVa11 to DVa25 of the first wiring layer and the dummy vias DVb101 to DVb112 of the second wiring layer each have.

A reflection direction of transmitted light by a wire tends to be biased in a direction vertical (namely, width direction of the wire) to the wire extending direction (extending direction). In contrast, transmitted light reflected in the direction vertical to a long side direction of the dummy via DV (namely, extending direction of the wire) is increased by elongating the dummy via DV in the width direction of the wire. This can effectively eliminate bias of a reflection direction of transmitted light caused by a wire.

(Fourth Embodiment)

Next, a fourth modified example of dummy via arrangement will be described with reference to FIGS. 10 and 11.

For example, in the case of using the solid-state imaging element 101 in combination with a lens having a short eye relief, an incidence angle of a principal ray of incident light is changed by an imaged height. For example, an incidence angle of a principal ray of incident light is tilted in a right oblique direction in a pixel P1 located at a right end in the nearly center in the longitudinal direction of the solid-state imaging element 101 illustrated in FIG. 10. Therefore, in the pixel P1, a reflection light amount reflected in a lateral direction by a wire Wp1 extending in the longitudinal direction is larger than a reflection light amount reflected in the longitudinal direction by a wire Wh1 extending in the lateral direction.

On the other hand, the incidence angle of the principal ray of incident light is tilted in a downward oblique direction in a pixel P2 located at a lower end in a nearly center in the lateral direction of the solid-state imaging element 101. Therefore, in the pixel P2, a reflection light amount reflected in the longitudinal direction by a wire Wh2 extending in the lateral direction is larger than a reflection light amount reflected in the lateral direction by a wire Wp2 extending in the longitudinal direction.

Consequently, the closer to the end portion of the solid-state imaging element 101 (position of high imaged height) a position is, the more a mixed color amount is increased, and for example, horizontal-striped shading in which shade appears in the above-described noise having a lateral-striped shape occurs.

Figure 11:
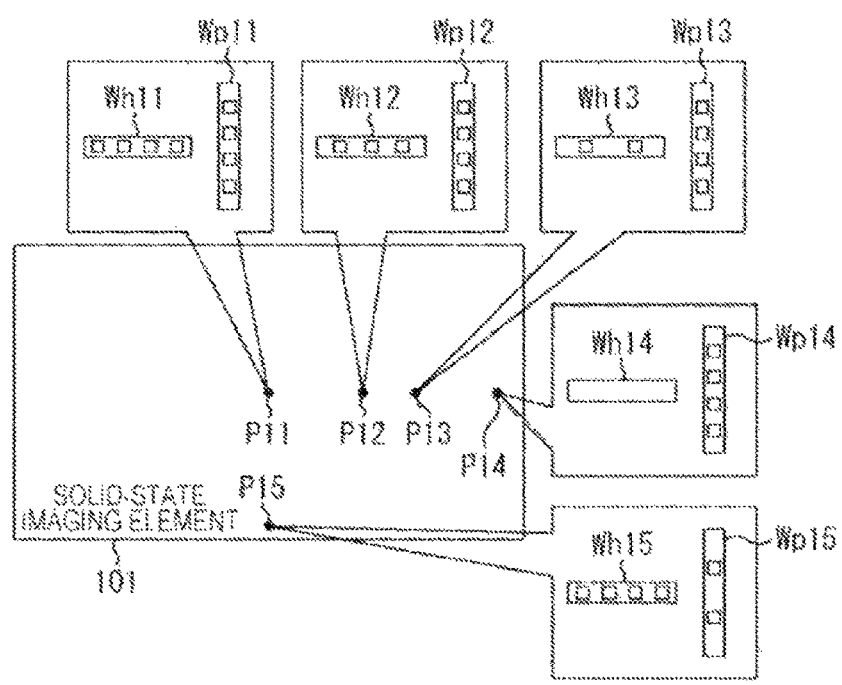
FIG. 11 is a diagram illustrating a fourth modified example of dummy via arrangement.

Therefore, for example, dummy via DV arrangement may be changed in accordance with a pixel position and a wiring direction as illustrated in FIG. 11. Note that square frames illustrated inside wires Wh11 to Wp15 represent the dummy vias DV.

An incidence angle of a principal ray of incident light is almost zero degrees in a pixel P11 located at a nearly center of the solid-state imaging element 11, and a reflection light in the lateral direction and a reflection light in the longitudinal direction have a substantially equal light amount. Therefore, in the pixel P11, a density of dummy vias DV is set substantially same between the wire Wh11 in the lateral direction and the wire Wp11 in the longitudinal direction.

Compared to the pixel P11, an incidence angle of a principal ray of incident light is more tilted in the right oblique direction in the pixel P12 located more on the right side than the pixel P11. Therefore, compared to the pixel P11, a reflection light amount in the lateral direction is increased and a reflection light amount in the longitudinal direction is reduced. Accordingly, a density of the dummy vias DV in the wire Wh12 in the lateral direction is set smaller than a density of the dummy vias DV in the wire Wh11 of the pixel P11 in order to increase the reflection light amount in the longitudinal direction. On the other hand, a density of the dummy vias DV in the wire Wp12 in the longitudinal direction is set substantially same as a density of the dummy vias DV of the wire Wp11 of the pixel P11.

In a pixel P13 located more on the right side than the pixel P12, an incidence angle of a principal ray of incident light is more tilted in the right oblique direction, compared to the pixel P12. Therefore, compared to the pixel P12, a reflection light amount in the lateral direction is increased and a reflection light amount in the longitudinal direction is reduced. Accordingly, a density of the dummy vias DV in the wire Wh13 in the lateral direction is set smaller than a density of the dummy vias DV in the wire Wh12 of the pixel P12 in order to increase the reflection light amount in the longitudinal direction. On the other hand, a density of the dummy vias DV in the wire Wp13 in the longitudinal direction is set substantially same as a density of the dummy vias DV of the wire Wp12 of the pixel P12.

Figure 10:
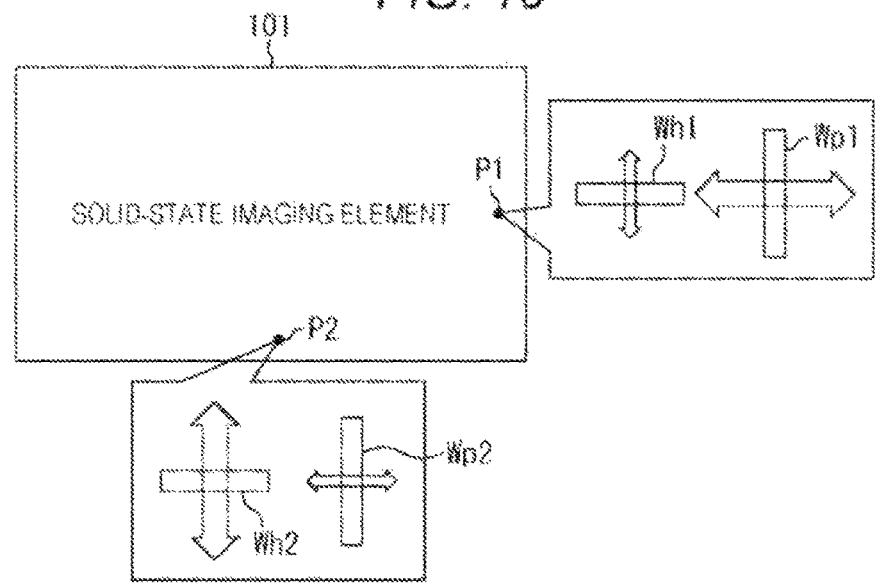
FIG. 10 is a diagram to describe a relation between a pixel position and a reflection direction of transmitted light.

In a pixel P14 located in the same position as the pixel P1 of FIG. 10, an incidence angle of a principal ray of incident light is more tilted in the right oblique direction, compared to the pixel P13. Therefore, compared to the pixel P13, a reflection light amount in the lateral direction is increased and a reflection light amount in the longitudinal direction is reduced. Therefore, a dummy via DV is not provided in the wire Wh14 in the lateral direction in order to increase the reflection light amount in the longitudinal direction. On the other hand, a density of the dummy vias DV in the wire Wp14 in the longitudinal direction is set substantially same as a density of the dummy vias DV of the wire Wp13 of the pixel P13.

In a pixel P15 located in the same position as the pixel P2 of FIG. 10, an incidence angle of a principal ray of incident light is more tilted in the downward oblique direction, compared to the pixel P11. Therefore, compared to the pixel P11, a reflection light amount in the longitudinal direction is increased and a reflection light amount in the lateral direction is reduced. Accordingly, a density of the dummy vias DV in the wire Wp15 in the longitudinal direction is set smaller than a density of the dummy vias DV in the wire Wp11 of the pixel P11 in order to increase the reflection light amount in the lateral direction. On the other hand, a density of the dummy vias DV in the wire Wh15 in the lateral direction is set substantially same as a density of the dummy vias DV of the wire Wh11 of the pixel P11.

Thus, a pixel located closer to an outer periphery of the solid-state imaging element 101 has a lower density of dummy vias DV in a direction vertical to a side of the outer periphery. Consequently, even when the incidence angle of the principal ray of the incident light is varied by a pixel position, the reflection direction of the reflection light becomes substantially uniform, and for example, occurrence of horizontal-striped shading is suppressed.

(Fifth Modified Example)

Figure 12:
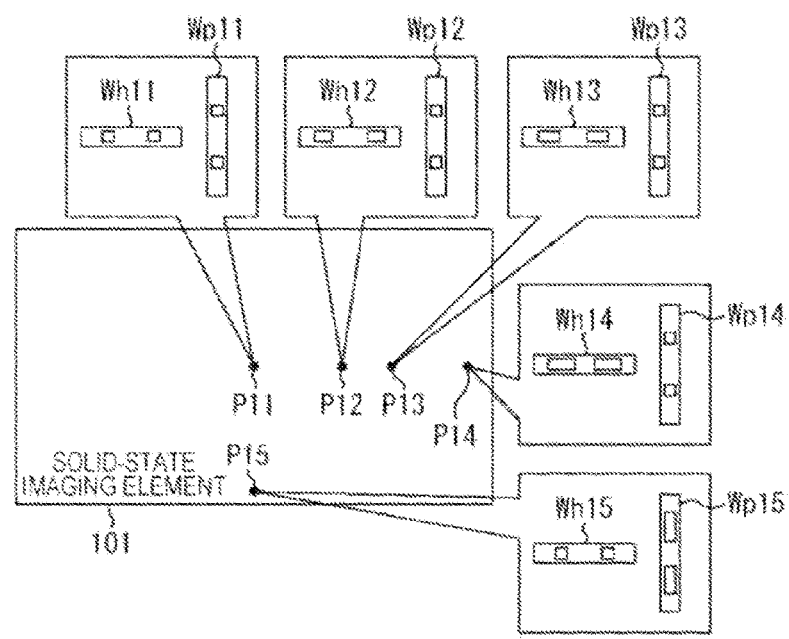
FIG. 12 is a diagram illustrating a fifth modified example of dummy via arrangement.

In FIG. 11, the example of adjusting the reflection light amount in each direction by the density of the dummy vias DV has been described, but the reflection light amount in the each direction may also be adjusted by a shape of a dummy via DV as illustrated, for example, in FIG. 12.

For example, in the pixel P11 located at the nearly center of the solid-state imaging element 11, a shape of a dummy via DV is set to a square having an almost same size in the wire Wh11 and the wire Wp11.

In the pixel P12, the dummy via DV of the wire Wh12 has a length in an extending direction of the wire Wh12 longer than a length in an extending direction of the wire Wh11 of the dummy via DV of the wire Wh11 in the pixel P11 in order to increase the reflection light amount in the longitudinal direction. On the other hand, a shape of the dummy via DV of the wire Wp12 is substantially the same as the shape of the dummy via DV of the wire Wp11 in the pixel P11.

In the pixel P13, the dummy via DV of the wire Wh13 has a length in an extending direction of the wire Wh13 longer than a length in an extending direction of the wire Wh12 of the dummy via DV of the wire Wh12 in the pixel P12 in order to increase the reflection light amount in the longitudinal direction. On the other hand, a shape of the dummy via DV of the wire Wp13 is substantially the same as the shape of the dummy via DV of the wire Wp12 in the pixel P12.

In the pixel P14, the dummy via DV of the wire Wh14 has a length in an extending direction of the wire Wh14 longer than a length in an extending direction of the wire Wh13 of the dummy via DV of the wire Wh13 in the pixel P13 in order to increase the reflection light amount in the longitudinal direction. On the other hand, a shape of the dummy via DV of the wire Wp14 is substantially the same as the shape of the dummy via DV of the wire Wp13 in the pixel P13.

In the pixel P15, the dummy via DV of the Wp15 has a length in an extending direction of the wire Wp15 longer than a length in an extending direction of the wire Wp11 of the dummy via DV of the wire Wp11 in the pixel P11 in order to increase the reflection light amount in the lateral direction. On the other hand, a shape of the dummy via DV of the wire Wp15 is substantially the same as the shape of the dummy via DV of the wire Wp11 in the pixel P11.

Thus, a pixel located closer to the outer periphery of the solid-state imaging element 101 has a dummy via DV having a longer length in a wire extending direction in the wire that extends in a direction vertical to the side of the outer periphery. Consequently, even when the incidence angle of the principal ray of the incident light is varied by a pixel position, the reflection direction of the reflection light becomes substantially uniform, and for example, occurrence of horizontal-striped shading is suppressed.

Note that two or more of the first to fifth modified examples can be combined as well.

{Manufacturing Method of Solid-State Imaging Element 101}

Next, a manufacturing method of the solid-state imaging element 101 in FIG. 3, particularly, a manufacturing method of a dummy via DV will be described with reference to FIGS. 13 to 18.

Figure 13:
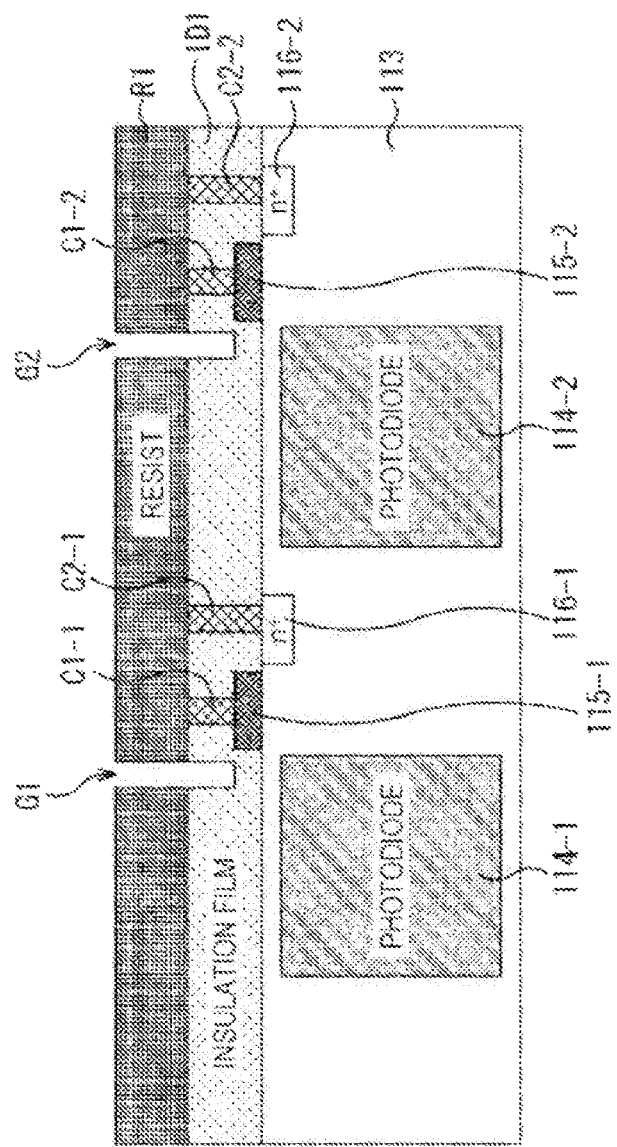
FIG. 13 is a diagram to describe a manufacturing method of the solid-state imaging element according to the first embodiment of the present technology.
Figure 14:
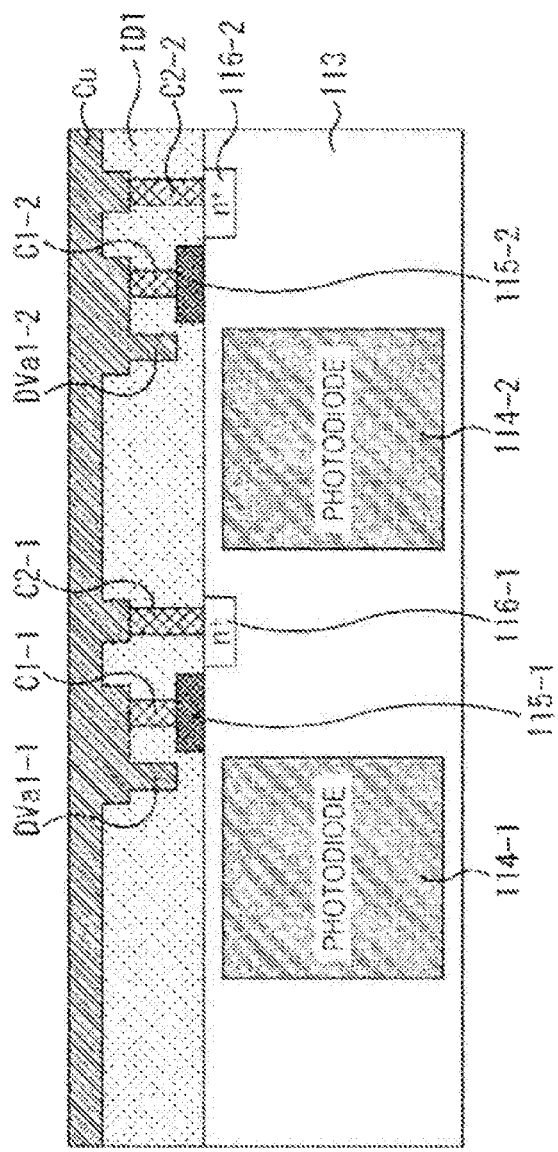
FIG. 14 is a diagram to describe the manufacturing method of the solid-state imaging element according to the first embodiment of the present technology.

The solid-state imaging element 101 is manufactured by processes similar to those of a normal solid-state imaging element until contacts C1-1 to C2-2 are formed. After that, as illustrated in FIGS. 13 to 15, a first-layer dummy vias DVa1-1 and DVa1-2 are formed together with formation of a first wiring layer.

Specifically, resist R1 is applied to a surface of an insulation film ID1, and patterning is performed at portions of the dummy vias DVa1-1 and DVa1-2. In other words, as illustrated in FIG. 13, grooves G1 and G2 which penetrate the resist R1, reach a middle of the insulation film ID1, and are shallower than the contacts C2-1 and C2-2 are formed by performing exposure and etching.

After that, the insulation film ID1 is further stacked after removal of the resist R1, and wiring grooves for wires Wa1-1 to Wa2-2 are formed in the insulation film ID1 in a normal process. Then, Cu is embedded in the grooves G1 and G2 as well as in the wiring grooves by a plating process similar to a normal dual damascene method. Consequently, the dummy vias DVa1-1, DVa1-2 are formed. FIG. 14 illustrates a state after Cu is embedded.

Figure 15:
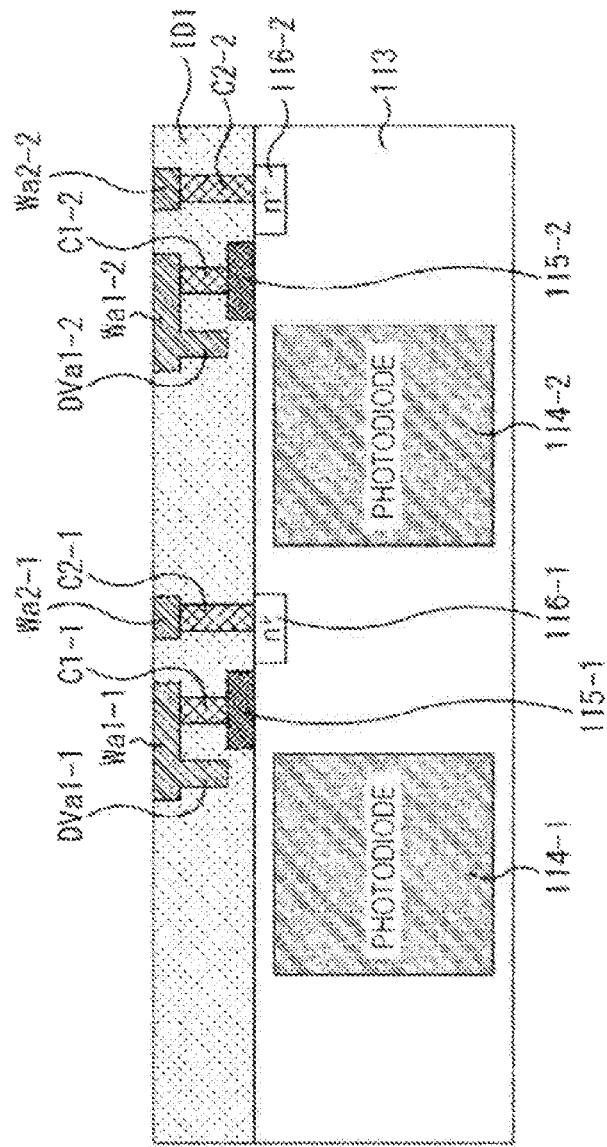
FIG. 15 is a diagram to describe the manufacturing method of the solid-state imaging element according to the first embodiment of the present technology.

Next, Cu on the insulation film ID1 is removed by chemical mechanical polishing (CMP), and the wires Wa1-1 to Wa2-2 included in the first wiring layer are formed as illustrated in FIG. 15.

Figure 16:
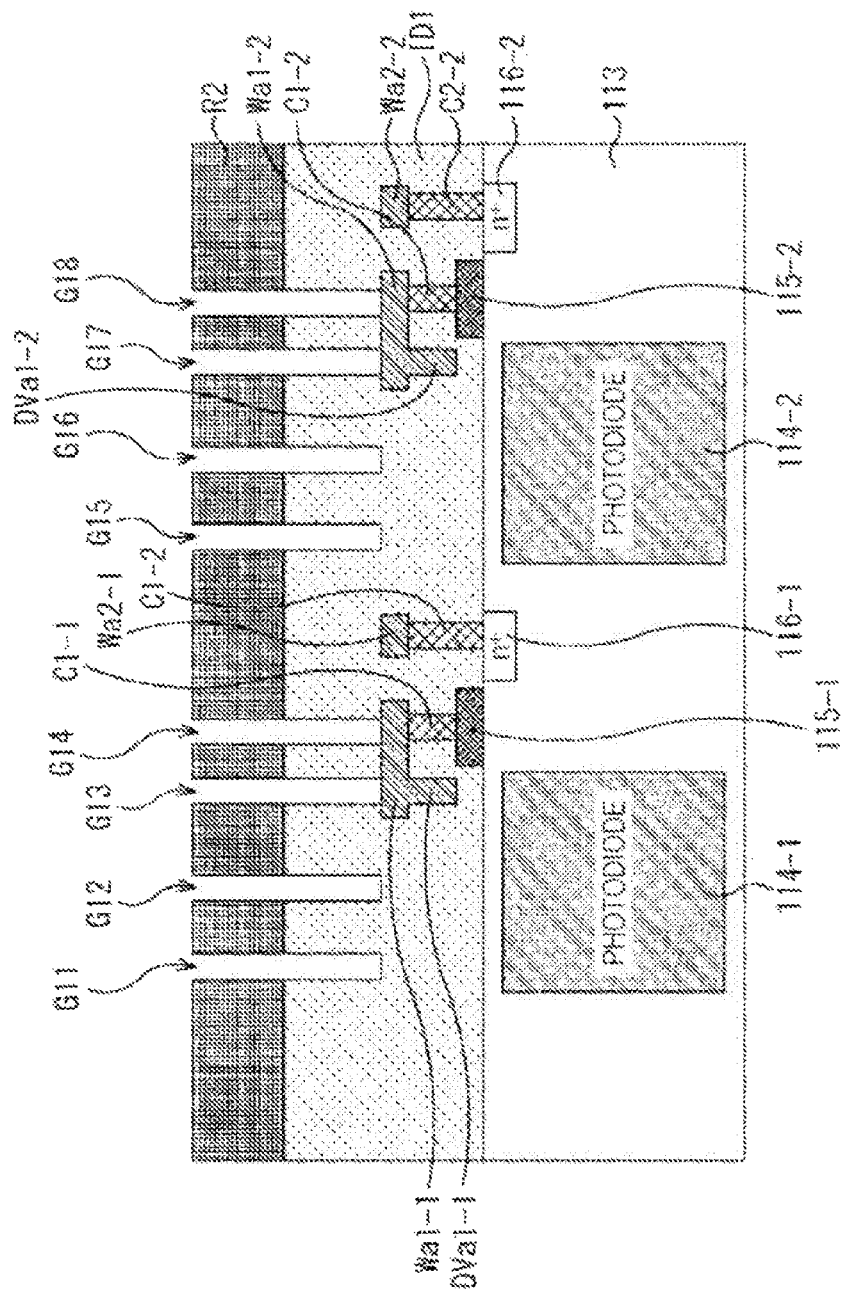
FIG. 16 is a diagram to describe the manufacturing method of the solid-state imaging element according to the first embodiment of the present technology.
Figure 17:
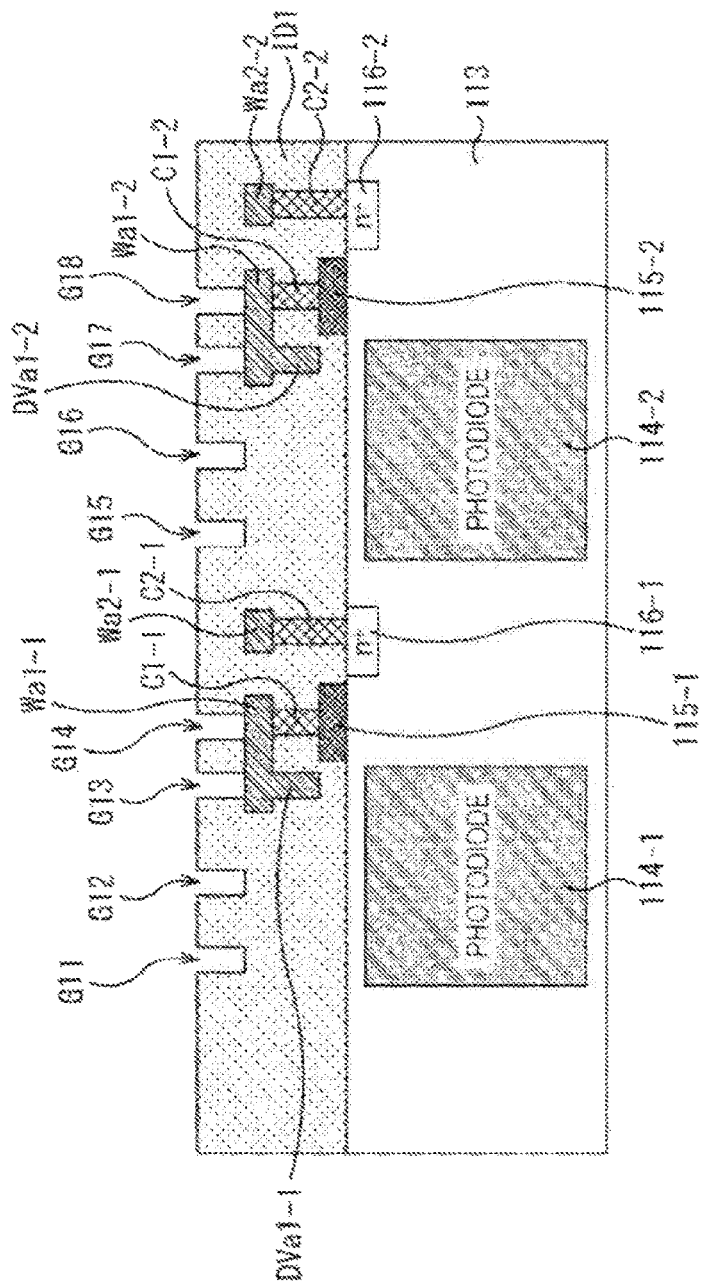
FIG. 17 is a diagram to describe the manufacturing method of the solid-state imaging element according to the first embodiment of the present technology.
Figure 18:
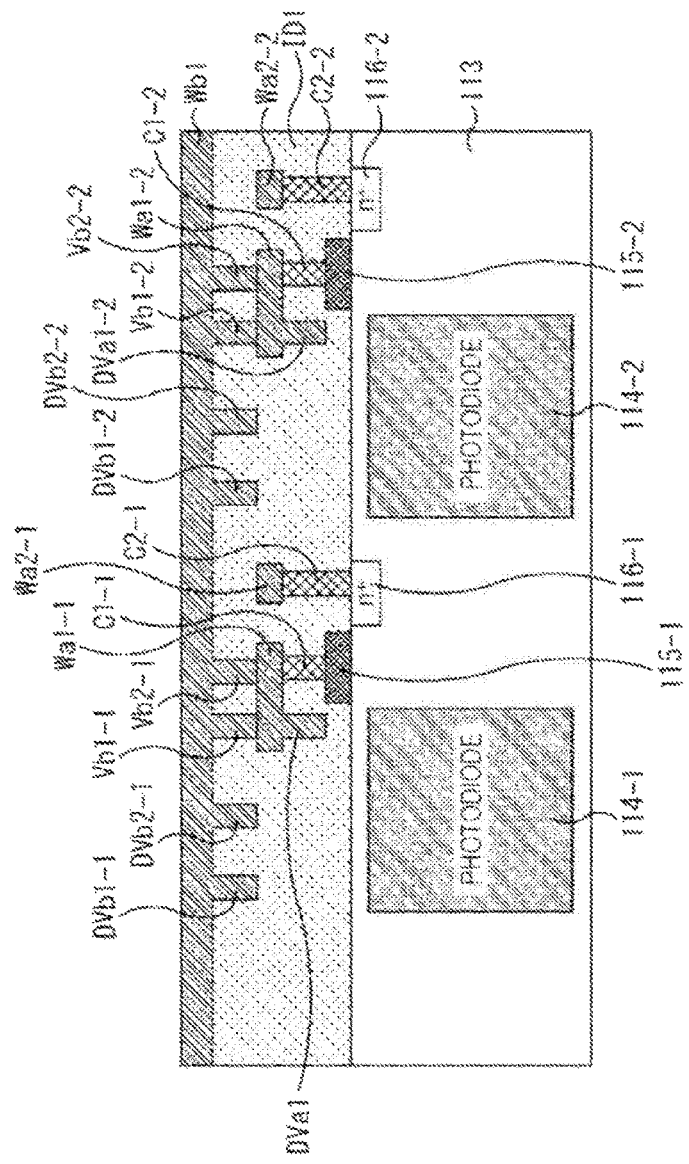
FIG. 18 is a diagram to describe the manufacturing method of the solid-state imaging element according to the first embodiment of the present technology.

Next, a second-layer dummy vias DVb1-1 to DVb2-2 are formed together with formation of a second wiring layer as illustrated in FIGS. 16 to 18.

Specifically, resist R2 is applied to a surface of the insulation film ID1 after the insulation film ID1 is further stacked, and patterning is performed for portions of vias Vb1-1 to Vb2-2 as well as dummy vias DVb1-1 to DVb2-2. In other words, as illustrated in FIG. 16, grooves G11 to G18 which penetrate the resist R2 and reach the vicinity of an upper end of the first wiring layer are formed by performing exposure and etching.

Meanwhile, there is no wire below the grooves G11, G12, G15, and G16 for the dummy vias DVb1-1 to DVb2-2. Therefore, the grooves G11, G12, G15, and G16 are the grooves deeper than the grooves G13, G14, G17, and G18 for normal vias Vb1-1 to Vb2-2 by an over-etched amount. Therefore, the grooves G11, G12, G15, and G16 are needed to be processed so as not to reach a polysilicon layer on which the transfer gate portions 115-1 and 115-2 are formed and the semiconductor substrate 113.

After that, the surface of the insulation film ID1 is polished by the CMP method as illustrated in FIG. 17 after removal of the resist R2.

Then, The grooves G11 to G18 are embedded with Cu by the plating process similar to the normal dual damascene method, and also a Cu film is formed on the surface of the insulation film ID1. Consequently, the vias Vb1-1 to Vb2-2, dummy vias DVb1-1 to DVb2-2, and wire Wb1 are formed as illustrated in FIG. 18.

Thus, the second-layer dummy vias DVb1-1 to DVb2-2 can be formed in the same process as the normal vias Vb1-1 to Vb2-2 (process to connect a wire of the first wiring layer to a wire of the second wiring layer) without adding any manufacturing process.

Figure 19:
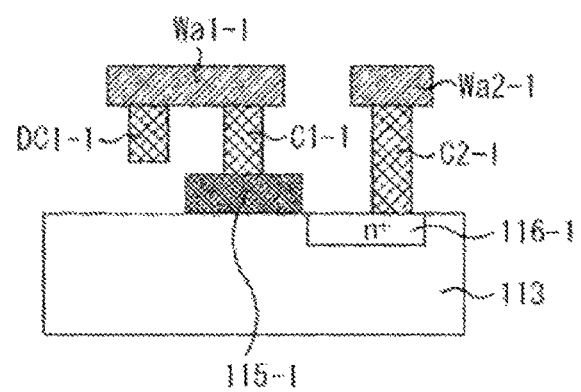
FIG. 19 is a diagram to describe a manufacturing method of a dummy contact.

Meanwhile, a dummy contact DC1-1 may be formed instead of the dummy via DVa1-1 as illustrated in FIG. 19. The dummy contact DC1-1 is formed by the process same as that of the contacts C1-1 and C2-1 (process to connect the semiconductor substrate 113 to the wire of the first wiring layer). Additionally, the dummy contact DC1-1 is formed shallower than the contacts C1-1 and C2-1 so as not to contact the semiconductor substrate 113 and a gate electrode shaped like the semiconductor substrate 113.

Meanwhile, a dummy contact DC1-2 similar to the dummy contact DC1-1 is formed instead of the dummy via DVa1-2 although not illustrated.

{Modified Examples of Dummy Via Shape}

Next, modified examples of the dummy via shape will be described with reference to FIGS. 20 to 23.

Figure 20:
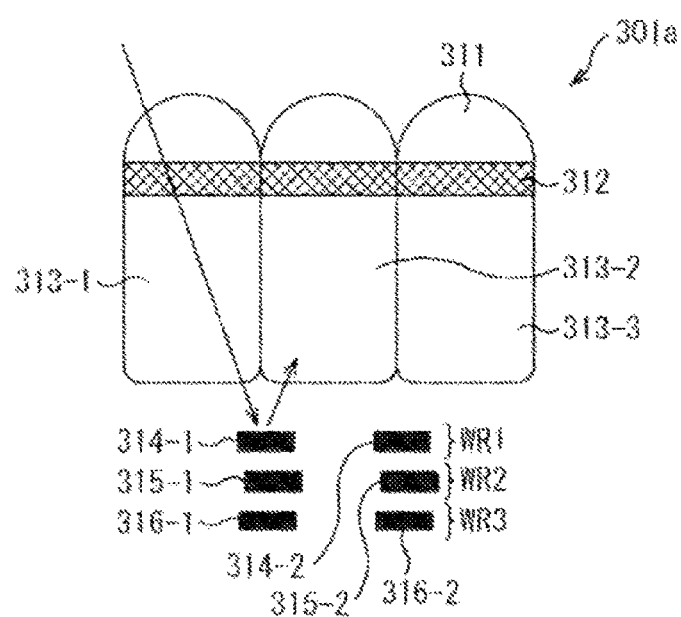
FIG. 20 is a diagram illustrating an exemplary reflection direction of transmitted light in the case of not providing any dummy via.

FIG. 20 schematically illustrates an exemplary configuration in three pixels in a back-illumination type solid-state imaging element 301a in the case where no dummy via is provided.

The solid-state imaging element 301a is adapted to include an on-chip microlens 311, a color filter 312, photodiodes 313-1 to 313-3, and wiring layers WR1 to WR3.

The on-chip microlens 311 and color filter 312 are stacked on incident surfaces of the photodiodes 313-1 to 313-3. The wiring layers WR1 to WR3 are formed on bottom surface sides of the photodiodes 313-1 to 313-3.

In the wiring layer WR1, wires including wires 314-1 and 314-2 are arranged. In the wiring layer WR2, wires including wires 315-1 and 315-2 are arranged. In the wiring layer WR3, wires including wires 316-1 and 316-2 are arranged. The wires 314-1 to 316-1 are arranged in an overlapping manner in a substantially vertical direction at a boundary portion between the photodiode 313-1 and the photodiode 313-2. The wires 314-2 to 316-2 are arranged in an overlapping manner in a substantially vertical direction at a boundary portion between the photodiode 313-2 and the photodiode 313-3.

Incident light upon the solid-state imaging element 301a enters the photodiodes 313-1 to 313-3 via the on-chip microlens 311 and the color filter 312. Then, part of the incident light is absorbed by the photodiodes 313-1 to 313-3, and remainder thereof passes through the photodiodes 313-1 to 313-3. The part of transmitted light having passed through the photodiodes 313-1 to 313-3 is reflected at, for example, incident-side surfaces of the wires 314-1 and 314-2 arranged in the first wiring layer WR1.

Here, the incident-side surfaces of the wires 314-1 and 314-2 are smooth. Therefore, as illustrated in the drawings, when incident light incident in an oblique direction passes through the photodiode 313-1, the incident light is reflected at the incident-side surface of the wire 314-1, and most thereof enters the photodiode 313-2.

Consequently, a mixed color amount between the pixels is biased, and for example, noise having a lateral-striped shape is generated as described above.

(First Modified Example)

Figure 21:
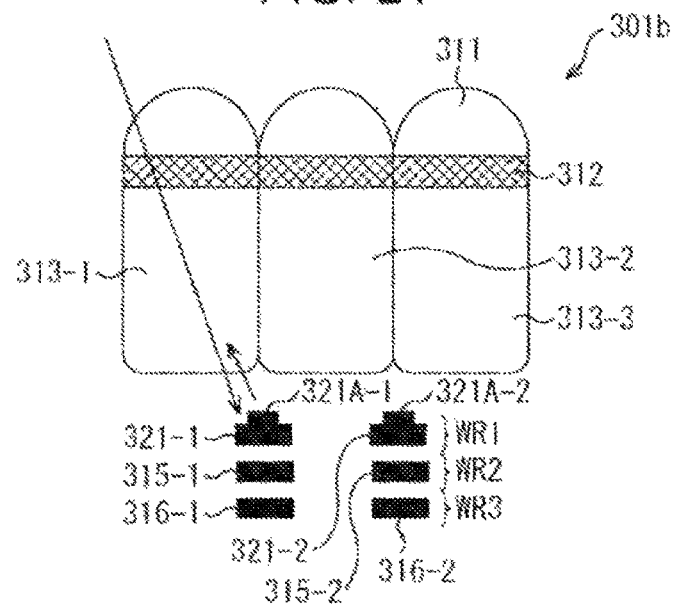
FIG. 21 is a diagram illustrating a first modified example of a dummy via shape.

FIG. 21 is a diagram illustrating a first modified example of a dummy via shape. Note that a portion corresponding to the portion in FIG. 20 is denoted by a same reference sign in the drawing.

Comparing a solid-state imaging element 301b of FIG. 21 with the solid-state imaging element 301a of FIG. 20, wires 321-1 and 321-2 are provided instead of the wires 314-1 and 314-2.

The wires 321-1 and 321-2 are arranged at positions substantially same as the wires 314-1 and 314-2. However, comparing the wires 321-1 and 321-2 with the wires 314-1 and 314-2, dummy vias 321A-1 and 321A-2 are respectively formed on incident-side surfaces thereof.

The dummy via 321A-1 has a square protruding shape extending along a boundary line of two photodiodes in a boundary portion between the photodiode 313-1 and the photodiode 313-2. The dummy via 321A-2 has a square protruding shape extending along a boundary line of two photodiodes in a boundary portion between the photodiode 313-2 and the photodiode 313-3.

Therefore, for example, in the case where incident light incident in an oblique direction passes through the photodiode 313-1 as illustrated in the drawing, most of the transmitted light is reflected by the dummy via 321A-1 in a direction of the photodiode 313-1 and enters the photodiode 313-1 again. Consequently, generation of color mixture is suppressed.

(Second Modified Example)

Figure 22:
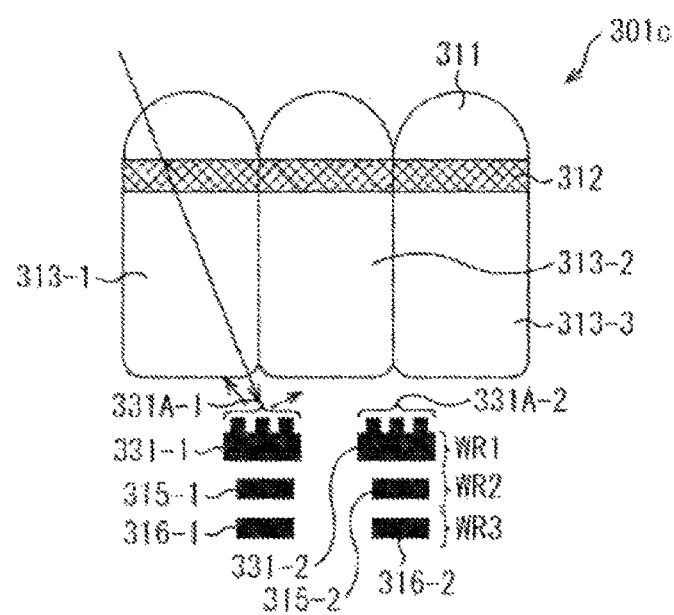
FIG. 22 is a diagram illustrating a second modified example of a dummy via shape.

FIG. 22 is a diagram illustrating a second modified example of a dummy via shape. Note that a portion corresponding to the portion in FIG. 20 is denoted by a same reference sign in the drawing.

Comparing a solid-state imaging element 301c of FIG. 22 with the solid-state imaging element 301a of FIG. 20, wires 331-1 and 331-2 are provided instead of the wires 314-1 and 314-2.

The wires 331-1 and 331-2 are arranged at positions substantially same as the wires 314-1 and 314-2. However, comparing the wires 331-1 and 331-2 with the wires 314-1 and 314-2, dummy vias 331A-1 and 331A-2 are respectively formed on incident-side surfaces thereof.

The dummy via 331A-1 and the dummy via 331A-2 are formed of multiple small square-shaped protrusions respectively.

Therefore, for example, in the case where incident light incident in an oblique direction passes through the photodiode 313-1 as illustrated in the drawing, a reflection direction of the transmitted light is dispersed by the dummy via 331A-1. Consequently, bias of a mixed color amount between the pixels is suppressed, and for example, generation of noise having a lateral-striped shape is suppressed.

(Third Modified Example)

Figure 23:
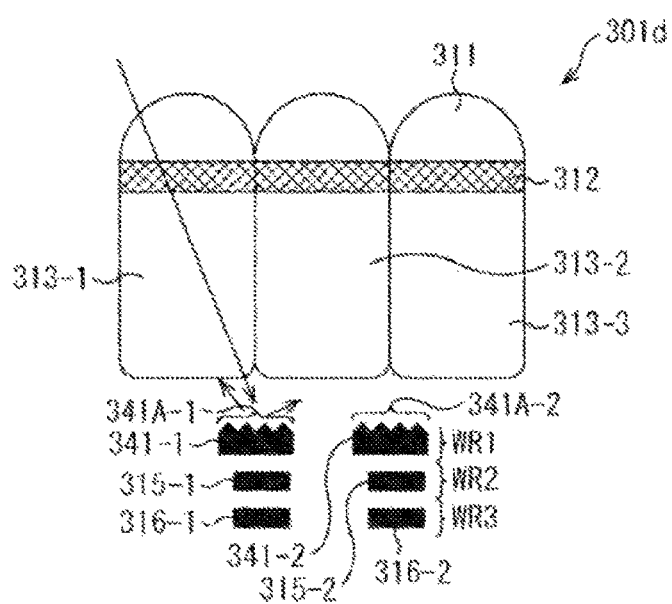
FIG. 23 is a diagram illustrating a third modified example of a dummy via shape.

FIG. 23 is a diagram illustrating a third modified example of a dummy via shape. Note that a portion corresponding to the portion in FIG. 20 is denoted by a same reference sign in the drawing.

Comparing a solid-state imaging element 301d of FIG. 23 with the solid-state imaging element 301a of FIG. 20, wires 341-1 and 341-2 are provided instead of the wires 314-1 and 314-2.

The wires 341-1 and 341-2 are arranged at positions substantially same as the wires 314-1 and 314-2. However, comparing the wires 341-1 and 341-2 with the wires 314-1 and 314-2, dummy vias 341A-1 and 341A-2 are respectively formed on incident-side surfaces thereof.

The dummy via 331A-1 and the dummy via 331A-2 are respectively formed of multiple protrusions each having a small quadrangular pyramid shape.

Therefore, for example, in the case where incident light incident in an oblique direction passes through the photodiode 313-1 as illustrated in the drawing, a reflection direction of the transmitted light is dispersed by the dummy via 341A-1. Consequently, bias of a mixed color amount between the pixels is suppressed, and for example, generation of noise having a lateral-striped shape is suppressed.

{Other Modified Example of First Embodiment}

Next, a modified example of the first embodiment other than the above-described modified examples will be described.

For example, a dummy via and a dummy contact may also be arranged only for the photodiode 114 in a pixel (e.g., R pixel) where transmitted light is often generated and light having a predetermined wavelength or more is detected.

Also, for example, a dummy via and a dummy contact may not be constantly formed in a wire of the first wiring layer closest to the bottom surface of the semiconductor substrate 113. Consequently, all of dummy vias can be formed without any additional process.

<3. Second Embodiment>

Next, a second embodiment of the present technology will be described with reference to FIGS. 24 to 33. The second embodiment is an embodiment in which the present technology is applied to a solid-state imaging element of an image plane phase difference auto-focus (AF) system embedded with a focal point detecting pixel in addition to a normal imaging pixel.

Figure 24:
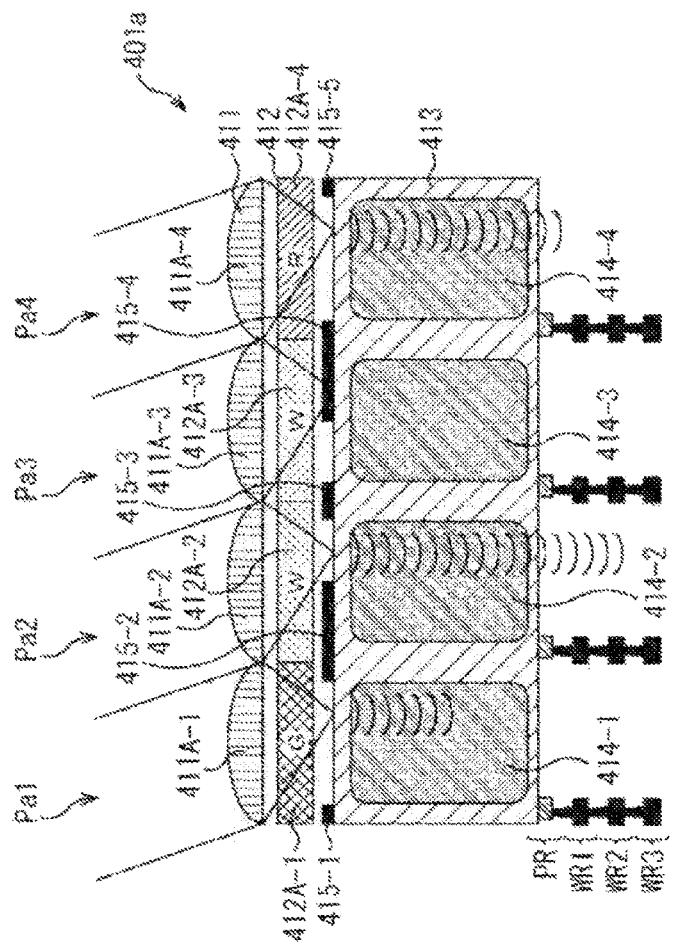
FIG. 24 is a cross-sectional view schematically illustrating an exemplary configuration of a solid-state imaging element of an image plane phase difference AF system.

FIG. 24 is a cross-sectional view schematically illustrating a partial configuration of a solid-state imaging element 401a of the image plane phase difference AF system that is one embodiment of a solid-state imaging element 11 of FIG. 1. In FIG. 24, a portion including pixels Pa1 to Pa4 in the solid-state imaging element 401a are illustrated.

The solid-state imaging element 401a is a back-illumination type solid-state imaging element. The solid-state imaging element is 401a is adapted to include: an on-chip microlens 411 including microlenses 411A-1 to 411A-4; a color filter array 412 including filters 412A-1 to 412A-4; a semiconductor substrate 413, photodiodes 414-1 to 414-4, and shielding metals (light shielding films) 415-1 to 415-5. The semiconductor substrate 413 is formed of a silicon substrate, for example. Furthermore, in the solid-state imaging element 401a, a polysilicon layer PR and first to third wiring layers WR1 to WR3 are stacked on a bottom surface of the semiconductor substrate 413.

Meanwhile, in the case where there is no need to differentiate each one of the photodiodes 414-1 to 414-4, each thereof will be simply referred to as a photodiode 414 in the following.

The pixel Pa1 is adapted to include the microlens 411A-1, filter 412A-1, and photodiode 414-1. The filter 412A-1 is a G filter that transmits a component of a green (G) wavelength band. The pixel Pa1 detects a G component of incident light.

The pixel Pa2 is adapted to include the microlens 411A-2, filter 412A-2, and photodiode 414-2. The filter 412A-2 is a white (W) filter that transmits components of wavelength bands of red (R), green (G), blue (B), and infrared light (IR light). The pixel Pa2 detects an R component, a B component, a G component, and an IR component of incident light and is used as a focal point detecting pixel.

The pixel Pa3 is adapted to include the microlens 411A-3, filter 412A-3, and photodiode 414-3. The filter 412A-3 is a W filter similar to the filter 412A-2. The pixel Pa3 detects an R component, a B component, a G component, and an IR component of incident light and is used as a focal point detecting pixel in a manner similar to the pixel Pa2.

The pixel Pa4 is adapted to include the microlens 411A-4, filter 412A-4, and photodiode 414-4. The filter 412A-4 is an R filter that transmits a component of the red (R) wavelength band. The pixel Pa4 detects an R component of incident light.

The shielding metals 415-1 to 415-5 are arranged in a manner covering at least spaces between adjacent photodiodes 414 between the color filter array 412 and the semiconductor substrate 413. The shielding metals 415-1 to 415-5 prevent incident light from entering a photodiodes 414 of an adjacent pixel.

Furthermore, the shielding metal 415-2 is formed in a manner covering not only the space between the photodiode 414-1 and the photodiode 414-2 but also a left half of an incident surface of the photodiode 414-2. Therefore, incident light entering the left half of the photodiode 414-2 is shielded by the shielding metal 415-2, and the incident light enters only a substantially right half of the photodiode 414-2.

Furthermore, the shielding metal 415-4 is formed in a manner covering not only the space between the photodiode 414-3 and the photodiode 414-4 but also a right half of an incident surface of the photodiode 414-3. Therefore, incident light entering the right half of the photodiode 414-3 is shielded by the shielding metal 415-4, and the incident light enters only a substantially left half of the photodiode 414-3. Therefore, a difference of a received light amount in a photodiode 414 is generated between the pixel Pa2 and the pixel Pa3 due to an incidence angle of the incident light.

Additionally, a first image is formed by a plurality of pixels each having the left half of the incident surface of the photodiode 414 shielded like the pixel Pa2. Furthermore, a second image is formed by a plurality of pixels each having the right half of the incident surface of the photodiode 414 shielded like the pixel Pa3. Then, deviation of a focal point position is detected on the basis of a deviation amount between the first image and the second image (phase deviation amount). Additionally, focal point adjustment is performed so as to eliminate the detected deviation of the focal point position.

Note that the focal point detecting pixel that is a pixel type to shield incident light like the pixels Pa2 and Pa3 will be referred to as a shield-type focal point detecting pixel in the following.

Meanwhile, since an approximately half of the incident light is shielded in the pixels Pa2 and Pa3, sensitivity is degraded compared to other imaging pixels (e.g., pixels Pa1 and Pa4). Accordingly, the sensitivity is improved in the pixels Pa2 and Pa3 by receiving light of all of the wavelength bands of the R, G, B, and IR light by using the filters 412A-1 and 412A-2 each formed of the W filter. However, still the sensitivity is degraded compared to other imaging pixels. Therefore, there may be a risk of degrading focal point detection accuracy for a subject with low illumination.

Therefore, a method of improving the sensitivity of a focal point detecting pixel and improving the focal point detection accuracy for a subject with low illumination will be described with reference to FIGS. 25 to 32.

{Method of Improving Sensitivity of Focal Point Detecting Pixel}

Figure 25:
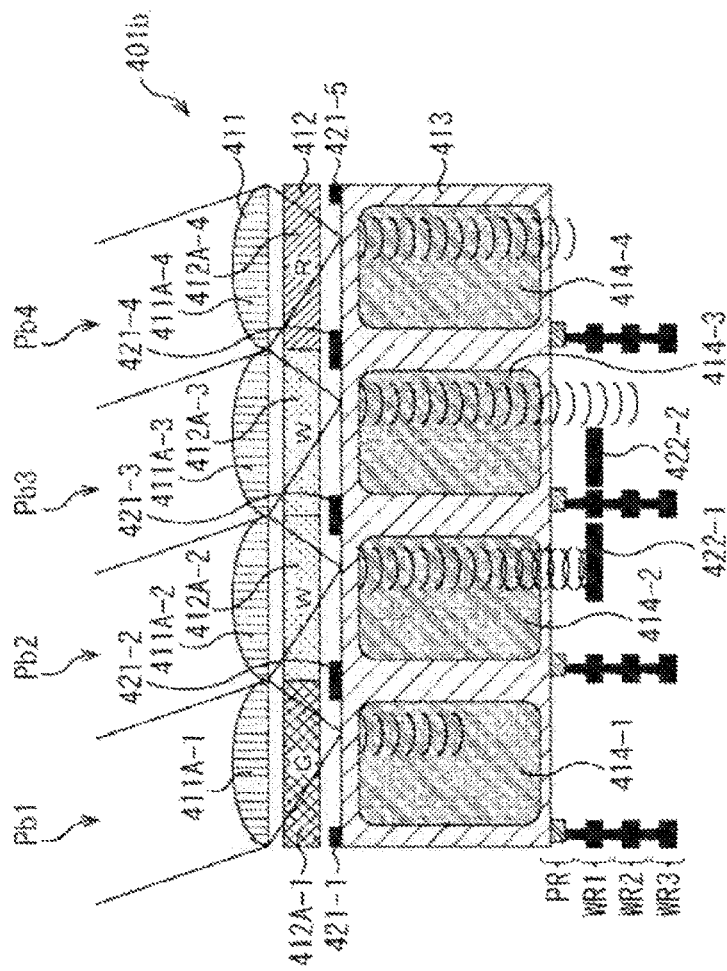
FIG. 25 is a cross-sectional view schematically illustrating a first exemplary configuration of a solid-state imaging element according to a second embodiment of the present technology.

FIG. 25 is a cross-sectional view schematically illustrating a partial configuration of a solid-state imaging element 401b adapted to improve sensitivity of a focal point detecting pixel. In FIG. 25, a portion including pixels Pb1 to Pb4 in the solid-state imaging element 401b are illustrated. Note that a portion corresponding to the portion in FIG. 24 is denoted by a same reference sign in the drawing.

The solid-state imaging element 401b of FIG. 25 is provided with the pixels Pb1 to Pb4 having a configuration similar to that of the pixels Pa1 to Pa4 in the solid-state imaging element 401a of FIG. 24. Additionally, comparing the solid-state imaging element 401b with the solid-state imaging element 401a, shielding metals 421-1 to 421-5 are provided instead of the shielding metals 415-1 to 415-5. Furthermore, comparing the solid-state imaging element 401b with the solid-state imaging element 401a, reflection metals (reflection films) 422-1 and 422-2 are provided.

Specifically, the shielding metals 421-1, 421-3, and 421-5 out of the shielding metals 421-1 to 421-5 have a shape similar to that of the shielding metals 415-1, 415-3, and 415-5 in FIG. 24, and formed at similar positions.

On the other hand, the shielding metal 421-2 covers only the space between the photodiode 414-1 and the photodiode 414-2 and does not cover the incident surface of the photodiode 414-2, different from the shielding metal 415-2 of FIG. 24. In a similar manner, the shielding metal 421-4 covers only the space between the photodiode 414-3 and the photodiode 414-4 and does not cover the incident surface of the photodiode 414-3, different from the shielding metal 415-4 of FIG. 24.

The reflection metals 422-1 and 422-2 are formed in the first wiring layer WR1. The reflection metal 422-1 is formed in a manner overlapping with a substantially right half of a bottom surface of the photodiode 414-2. The reflection metal 422-2 is formed in a manner overlapping with a substantially left half of a bottom surface of the photodiode 414-3. In other words, a range where the shielding metal overlap with the bottom surface of the photodiode 414 is split into two patterns formed of the left half and the right half in each pixel.

Therefore, an opening on an incident side of the photodiode 414-2 coincides with the photodiodes 414 of other imaging pixels, and incident light enters the photodiode 414-2 without being shielded. Additionally, transmitted light having passed through the substantially right half of the bottom surface of the photodiode 414-2 out of transmitted light having passed through the photodiode 414-2 is reflected by the reflection metal 422-1 and enters the photodiode 414-2 again.

In a similar manner, an opening on an incident side of the photodiode 414-3 coincides with the photodiodes 414 of other imaging pixels, and incident light enters the photodiode 414-3 without being shielded. Additionally, transmitted light having passed through the substantially left half of the bottom surface of the photodiode 414-3 out of transmitted light having passed through the photodiode 414-3 is reflected by the reflection metal 422-2 and enters the photodiode 414-3 again.

Therefore, sensitivity of the focal point detecting pixels Pb2 and Pb3 is degraded less than other imaging pixels. Rather, since the filters 412A-2 and 412A-3 formed of the W filters are used and the reflection light reflected by the reflection metals 422-1 and 422-2 is made to be incident again, the sensitivity of the focal point detecting pixels Pb2 and Pb3 is improved more than other imaging pixels.

Furthermore, the pixel Pb2 differs from the pixel Pb3 in a position of the reflection metal 416 relative to the photodiode 414. Therefore, a difference is generated between received light amounts in the photodiodes 414 of the pixel Pb2 and the pixel Pb3 due to an incidence angle of incident light in a manner similar to a relation between the pixel Pa2 and the pixel Pa3 in FIG. 24.

Additionally, a first image is formed by a plurality of pixels each formed with a reflection surface in a right half of the bottom surface of the photodiode 414 like the pixel Pb2. Also, a second image is formed by a plurality of pixels each formed with a reflection surface in a left half of the bottom surface of the photodiode 414 like the pixel Pb3. Then, deviation of a focal point position is detected on the basis of a deviation amount between the first image and the second image (phase deviation amount). Additionally, focal point adjustment is performed so as to eliminate the detected deviation of the focal point position.

Note that the focal point detecting pixel that is a type to reflect transmitted light like the pixels Pb2 and Pb3 will be referred to as a reflection-type focal point detecting pixel in the following.

Figure 26:
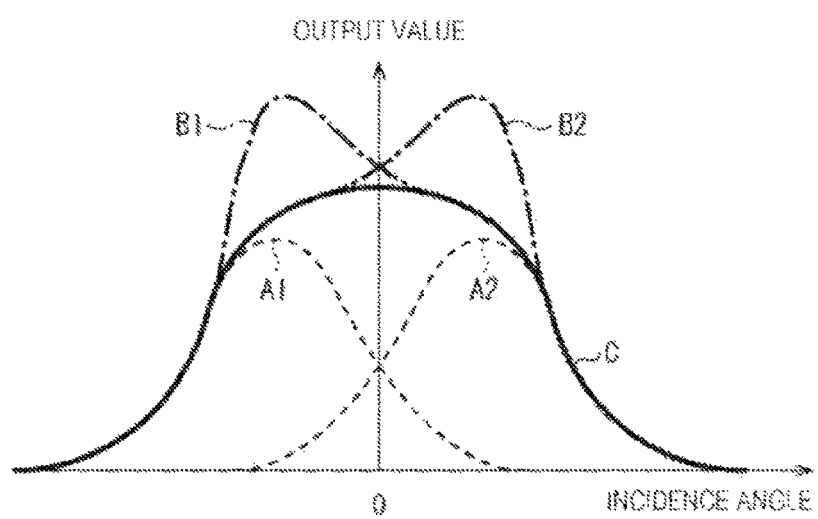
FIG. 26 is a graph in which sensitivity of a focal point detecting pixel is compared.

FIG. 26 is a graph in which sensitivity is compared among the pixels Pa2, Pa3 which are the focal point detecting pixels in FIG. 24, the pixels Pb2, Pb3 which are the focal point detecting pixels in FIG. 25, and a normal imaging pixel. A horizontal axis of the graph represents an incidence angle of incident light, and a vertical axis represents an output value of each pixel. Curves A1 and A2 represent change of the output values of the pixels Pa2 and Pa3 (namely, sensitivity) relative to the incidence angle of the incident light. Curves B1 and B2 represent change of the output values of the pixels Pb2 and Pb3 (namely, sensitivity) relative to the incidence angle of the incident light. A curve C represents change of the output value of the normal imaging image (namely, sensitivity) relative to the incidence angle.

As illustrated in the graph, the pixel Pa2 and the pixel Pa3 have sensitivity more degraded by the incidence angle than the normal imaging pixel does. On the other hand, the pixel Pb2 and the pixel Pb3 have sensitivity more improved by the incidence angle than the normal imaging pixel does.

Therefore, compared to the solid-state imaging element 401a, the solid-state imaging element 401b has the sensitivity of the focal point detecting pixel more improved, and particularly, focal point detection accuracy for a subject with low illumination is improved.

Meanwhile, a position in a vertical direction of the reflection metal adapted to reflect transmitted light having passed through the photodiode 414 that is the focal point detecting pixel is not limited to the above-described first wiring layer WR1. For example, the reflection metal can be provided in a second wiring layer WR2 and a third wiring layer WR3, and also the reflection metal can be provided in the polysilicon layer PR.

Figure 27:
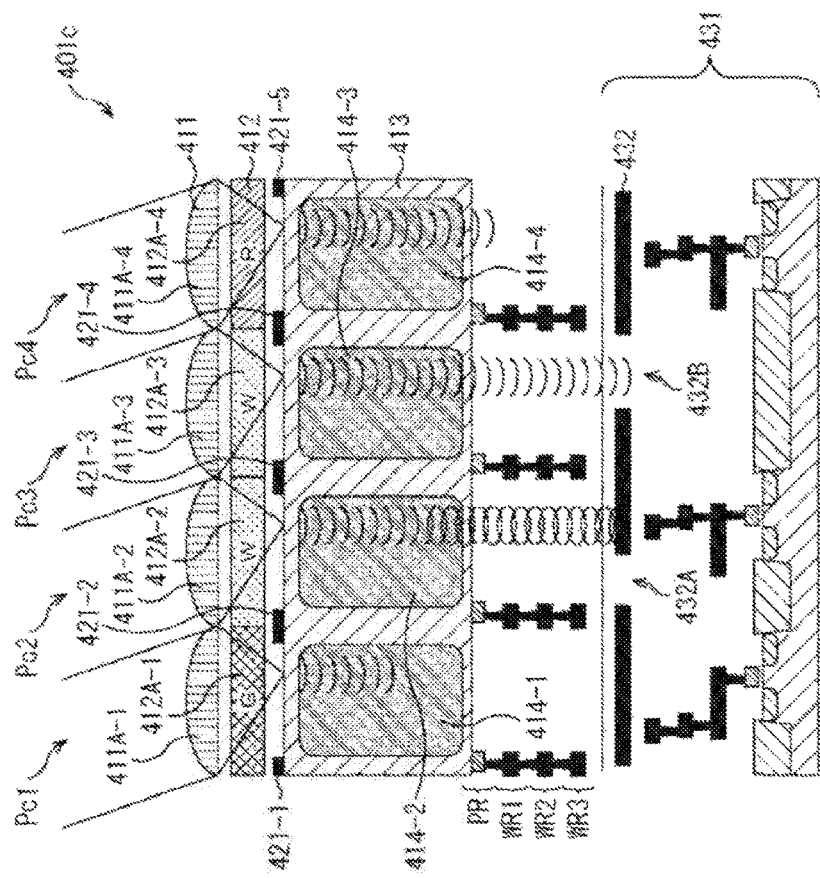
FIG. 27 is a cross-sectional view schematically illustrating a second exemplary configuration of the solid-state imaging element according to the second embodiment of the present technology.

Furthermore, as illustrated in FIG. 27, the reflection metal can also be provided on a logic substrate 431 stacked on a pixel substrate formed with respective pixels and provided with a signal processing circuit and the like adapted to process pixel signals of the respective pixels. Note that a portion corresponding to the portion in FIG. 25 is denoted by a same reference sign in FIG. 27.

A solid-state imaging element 401c of FIG. 27 is provided with pixels Pc1 to Pc4 each having a configuration similar to that of the pixels Pb1 to Pb4 of the solid-state imaging element 401b of FIG. 25. Furthermore, comparing the solid-state imaging element 401c with the solid-state imaging element 401b, reflection metal 432 is provided instead of the reflection metals 422-1 and 422-2.

Specifically, the reflection metal 432 is provided on the logic substrate 431 located below the pixels Pc1 to Pc4. Additionally, opened portions 432A and 432B are formed in the reflection metal 432.

The opened portion 432A is formed in a manner overlapping with a substantially left half of a bottom surface of the photodiode 414-2 below the pixel Pc2. Therefore, transmitted light having passed through a substantially right half of the bottom surface of the photodiode 414-2 out of transmitted light having passed through the photodiode 414-2 is reflected by the reflection metal 432.

The opened portion 432B is formed in a manner overlapping with a substantially right half of a bottom surface of the pixel Pc3 below the pixel Pc3. Therefore, transmitted light having passed through a substantially left half of a bottom surface of the photodiode 414-3 out of transmitted light having passed through the photodiode 414-3 is reflected by the reflection metal 432.

Therefore, the opening on the incident side of the photodiode 414-2 coincides with the photodiodes 414 of other imaging pixels, and incident light enters the photodiode 414-2 without being shielded. Additionally, transmitted light having passed through the substantially right half of the bottom surface of the photodiode out of transmitted light having passed through the photodiode 414-2 is reflected by the reflection metal 432 and enters the photodiode 414-2 again.

In a similar manner, the opening on the incident side of the photodiode 414-3 coincides with the photodiodes 414 of other imaging pixels, and incident light enters the photodiode 414-3 without being shielded. Additionally, transmitted light having passed through the substantially left half of the bottom surface of the photodiode 414-3 out of transmitted light having passed through the photodiode 414-3 is reflected by the reflection metal 432, and enters the photodiode 414-3 again.

Therefore, sensitivity of the focal point detecting pixels Pc2 and Pc3 becomes high in a manner similar to that of the pixels Pb2 and Pb3 of the solid-state imaging element 401*b* in FIG. 25.

Additionally, a first image is formed by a plurality of pixels each formed with a reflection surface in a right half of the bottom surface of the photodiode 414 like the pixel Pc2. Also, a second image is formed by a plurality of pixels each formed with a reflection surface in a left half of the bottom surface of the photodiode 414 like the pixel Pc3. Then, deviation of a focal point position is detected on the basis of a deviation amount between the first image and the second image (phase deviation amount). Additionally, focal point adjustment is performed so as to eliminate the detected deviation of the focal point position.

Therefore, compared to the solid-state imaging element 401*a*, the solid-state imaging element 401*c* has the sensitivity of the focal point detecting pixel more improved, and particularly, focal point detection accuracy for a subject with low illumination is improved.

Furthermore, a separation layer may also be formed between the pixels in order to prevent degradation of extraction accuracy for an angle component of incident light caused by electron transmission inside the semiconductor substrate 413 and color mixture of reflection light.

Figure 28:
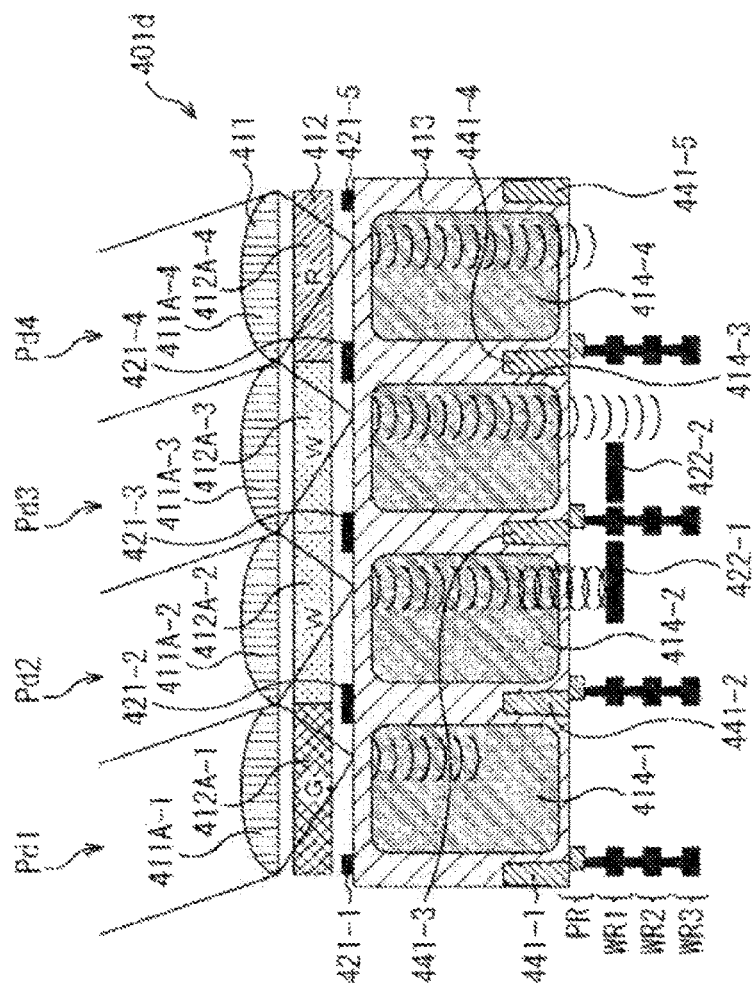
FIG. 28 is a cross-sectional view schematically illustrating a third exemplary configuration of the solid-state imaging element according to the second embodiment of the present technology.

FIG. 28 illustrates an example of providing separation layers 441-1 to 441-5 on a bottom surface side of the semiconductor substrate 413. Note that a portion corresponding to the portion in FIG. 25 is denoted by a same reference sign in the drawing.

A solid-state imaging element 401*d* of FIG. 28 is provided with pixels Pd1 to Pd4 each having a configuration similar to that of the pixels Pb1 to Pb4 of the solid-state imaging element 401*b* of FIG. 25. Furthermore, comparing the solid-state imaging element 401*d* with the solid-state imaging element 401*b*, the separation layers 441-1 to 441-5 are provided.

The separation layers 441-1 to 441-5 are formed in a manner embedded in the bottom surface side of the semiconductor substrate 413. The separation layer 441-1 is formed between the pixel Pd1 and a pixel not illustrated on the left of the pixel Pd1 in a manner extending upward from the bottom surface of the semiconductor substrate 413, and adapted to separate the pixel Pd1 from the pixel on the left thereof not illustrated. The separation layer 441-2 is formed between the pixel Pd1 and the pixel Pd2 in a manner extending upward from the bottom surface of the semiconductor substrate 413, and adapted to separate the pixel Pd1 from the pixel Pd2. The separation layer 441-3 is formed between the pixel Pd2 and the pixel Pd3 in a manner extending upward from the bottom surface of the semiconductor substrate 413, and adapted to separate the pixel Pd2 from the pixel Pd3. The separation layer 441-4 is formed between the pixel Pd3 and the pixel Pd4 in a manner extending upward from the bottom surface of the semiconductor substrate 413, and adapted to separate the pixel Pd3 from the pixel Pd4. The separation layer 441-5 is formed between the pixel Pd4 and a pixel not illustrated on the right of the pixel Pd4 in a manner extending upward from the bottom surface of the semiconductor substrate 413, and adapted to separate the pixel Pd4 from the pixel on the right thereof not illustrated.

Electrons generated by incident light entering the respective photodiodes 414 are transmitted to the inside of the semiconductor substrate 413 and prevented from being mixed into a photodiode 414 in an adjacent pixel by these separation layers 441-1 to 441-5. Furthermore, transmitted light reflected by the reflection metals 422-1 and 422-2 is prevented from entering an adjacent pixel by the separation layers 441-1 to 441-5.

Consequently, degradation of extraction accuracy for an angle component of incident light of the focal point detecting pixel can be prevented, and detection accuracy for a focal point is improved.

Figure 29:
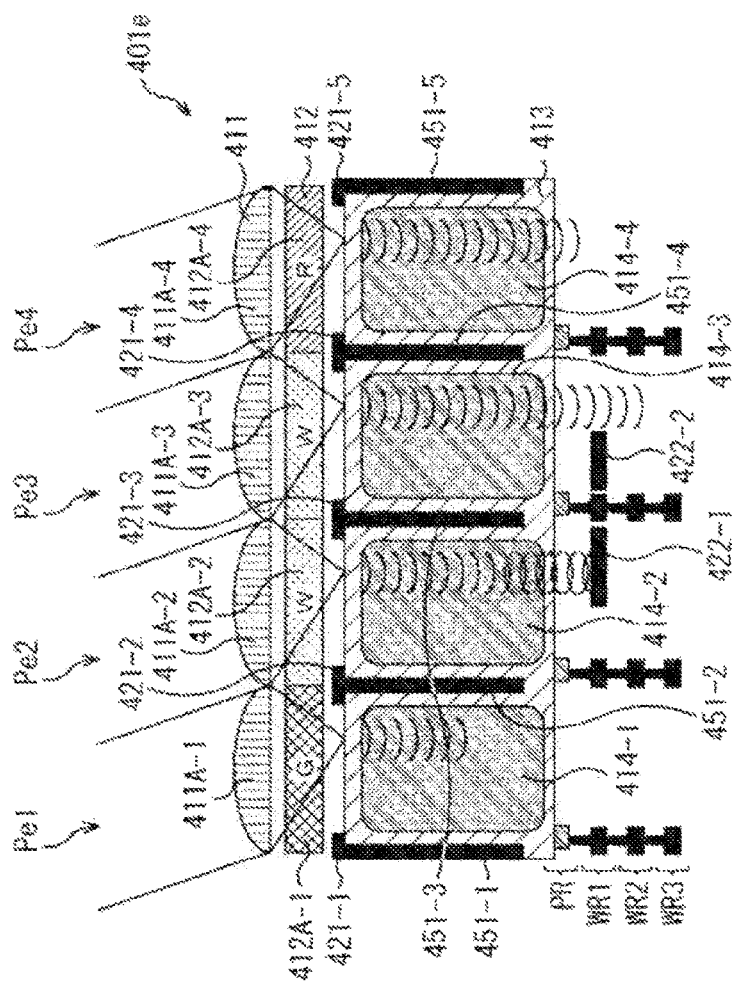
FIG. 29 is a cross-sectional view schematically illustrating a fourth exemplary configuration of the solid-state imaging element according to the second embodiment of the present technology.

FIG. 29 illustrates an example of providing separation layers 451-1 to 451-5 on an incident surface of the semiconductor substrate 413. Note that a portion corresponding to the portion in FIG. 25 is denoted by a same reference sign in the drawing.

A solid-state imaging element 401*e* of FIG. 28 is provided with pixels Pd1 to Pd4 each having a configuration similar to that of the pixels Pb1 to Pb4 of the solid-state imaging element 401*b* of FIG. 25. Furthermore, comparing the solid-state imaging element 401*e* with the solid-state imaging element 401*b*, the separation layers 451-1 to 451-5 are provided.

The separation layers 451-1 to 451-5 are formed in a manner embedded in the incident surface side of the semiconductor substrate 413. The separation layer 451-1 is formed in a manner extending downward below the shielding metal 421-1, and adapted to separate the pixel Pe1 from a pixel not illustrated and located on the left side thereof. The separation layer 451-2 is formed in a manner extending downward below the shielding metal 421-2, and adapted to separate the pixel Pe1 from the pixel Pe2. The separation layer 451-3 is formed in a manner extending downward below the shielding metal 421-3, and adapted to separate the pixel Pe2 from the pixel Pe3. The separation layer 451-4 is formed in a manner extending downward below the shielding metal 421-4, and adapted to separate the pixel Pe3 from the pixel Pe4. The separation layer 451-5 is formed in a manner extending downward below the shielding metal 421-5, and adapted to separate the pixel Pe4 from a pixel not illustrated and located on the right side thereof.

Electrons generated by incident light entering the respective photodiodes 414 are transmitted to the inside of the semiconductor substrate 413 and prevented from being mixed into a photodiode 414 of an adjacent pixel by these separation layers 451-1 to 451-5. Furthermore, transmitted light reflected by the reflection metals 422-1 and 422-2 is prevented from entering an adjacent pixel by the separation layers 451-1 to 451-5.

Consequently, degradation of extraction accuracy for an angle component of incident light of the focal point detecting pixel can be prevented, and detection accuracy for a focal point is improved.

Additionally, while the example of using a W pixel which uses a W filter for the focal point detecting pixel has been described, a pixel using a different color filter may also be used.

Figure 30:
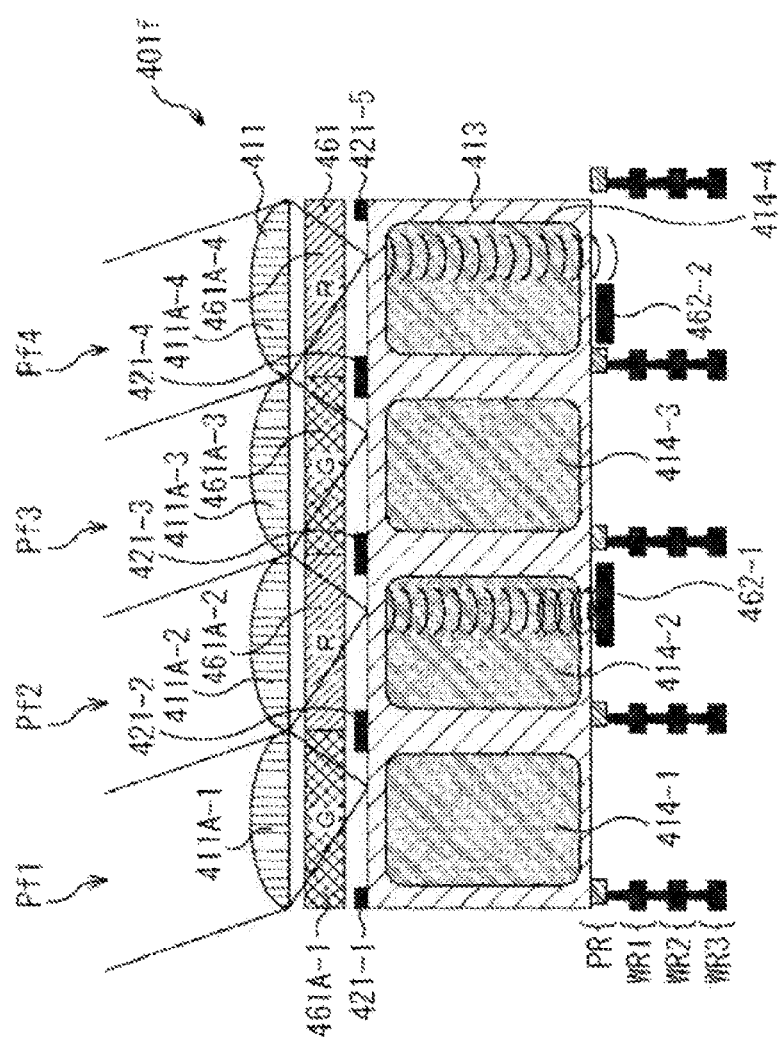
FIG. 30 is a cross-sectional view schematically illustrating a fifth exemplary configuration of the solid-state imaging element according to the second embodiment of the present technology.

FIG. 30 is an example in which an R pixel is used as the focal point detecting pixel. Note that a portion corresponding to the portion in FIG. 25 is denoted by a same reference sign in the drawing.

Comparing a solid-state imaging element 401*f* of FIG. 30 with the solid-state imaging element 401*b* of FIG. 25, pixels Pf1 to Pf4, a color filter array 461, and reflection metals 462-1 and 462-2 are provided instead of the pixels Pb1 to Pb4, color filter array 412, and the reflection metals 422-1 and 422-2. Furthermore, the color filter array 461 is adapted to include filters 461A-1 to 461A-4.

The pixel Pf1 is adapted to include a microlens 411A-1, a filter 461A-1, and a photodiode 414-1. The filter 461A-1 is a G filter, and the pixel Pf1 is a G pixel.

The pixel Pf2 is adapted to include a microlens 411A-2, a filter 461A-2, and photodiode 414-2. The filter 461A-2 is an R filter, and the pixel Pf2 is an R pixel.

The pixel Pf3 is adapted to include a microlens 411A-3, a filter 461A-3, and photodiode 414-3. The filter 461A-3 is a G filter, and the pixel Pf3 is a G pixel.

The pixel Pf4 is adapted to include a microlens 411A-4, a filter 461A-4, and photodiode 414-4. The filter 461A-4 is an R filter, and the pixel Pf4 is an R pixel.

The reflection metals 462-1 and 462-2 are formed on a surface of the bottom surface of the semiconductor substrate 413 in a manner similar to the polysilicon layer formed with the gate electrode of the semiconductor substrate 413. The reflection metal 462-1 is formed in a manner overlapping with a substantially right half of a bottom surface of the photodiode 414-2. The reflection metal 422-2 is formed in a manner overlapping with a substantially left half of a bottom surface of the photodiode 414-4.

Therefore, pixels Pf2 and Pf4 are used as focal point detecting pixels in a manner similar to the pixels Pb2 and Pb3 of the solid-state imaging element 401b in FIG. 25.

Furthermore, reflection light can be surely made to enter again the photodiodes 414-2 and 414-4 by forming the reflection metals 462-1 and 462-2 on the surface of the bottom surface of the semiconductor substrate 413.

Moreover, since light having a longer wavelength easily passes through the semiconductor substrate 413, the R pixel more easily transmits the incident light, compared to the G pixel and the B pixel. Therefore, the reflection light reflected by the reflection metals 462-1 and 462-2 are more enhanced, and a phase deviation amount can be more correctly detected. Therefore, focal point detection accuracy for a subject with low illumination is particularly improved.

Figure 31:
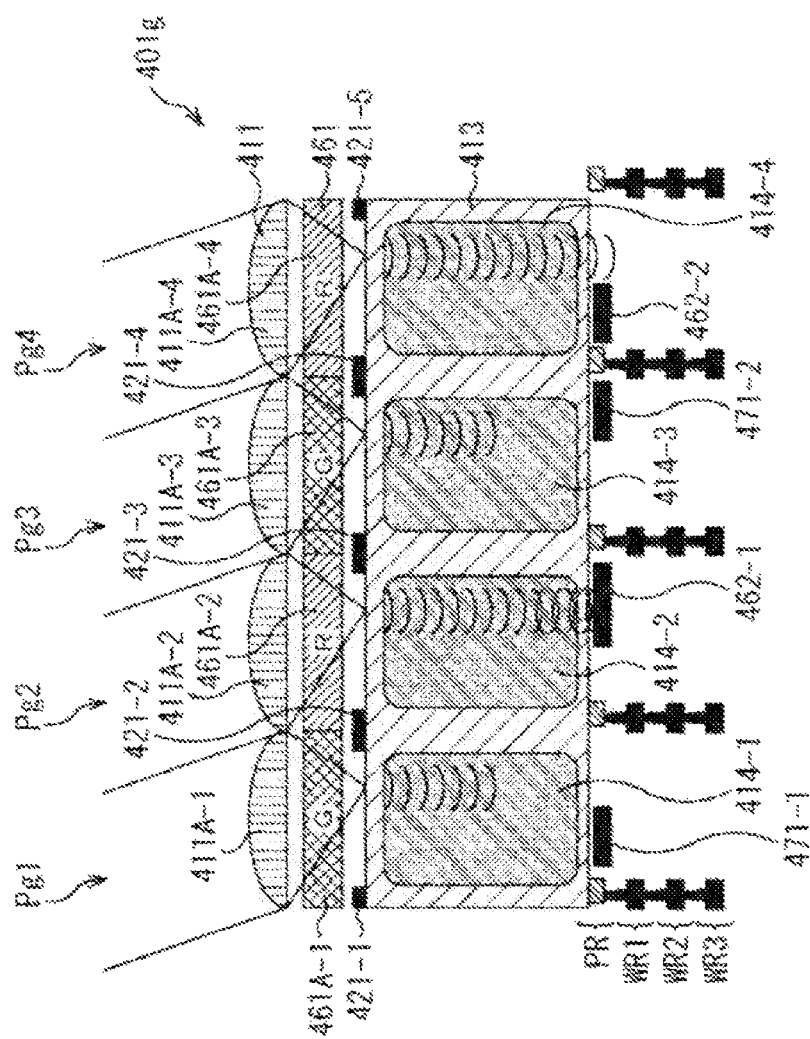
FIG. 31 is a cross-sectional view schematically illustrating a sixth exemplary configuration of the solid-state imaging element according to the second embodiment of the present technology.

Additionally, pixels of multiple colors may also be used as focal point detecting pixels as illustrated in FIG. 31. Note that a portion corresponding to the portion in FIG. 30 is denoted by a same reference sign in the drawing.

A solid-state imaging element 401g of FIG. 31 is provided with pixels Pg1 to Pg4 each having a configuration similar to that of the pixels Pf1 to Pf4 of the solid-state imaging element 401f of FIG. 30. Additionally, comparing the solid-state imaging element 401g with the solid-state imaging element 401f, reflection metals 471-1 and 471-2 are added.

The reflection metals 471-1 and 471-2 are formed on the surface of the bottom surface of the semiconductor substrate 413 in a manner similar to the reflection metals 462-1 and 462-2. The reflection metal 471-1 is formed in a manner overlapping with a substantially left half of a bottom surface of the photodiode 414-1. The reflection metal 471-2 is formed in a manner overlapping with a substantially right half of a bottom surface of the photodiode 414-3.

Therefore, all of the pixels Pg1 to Pg4 are used as the focal point detecting pixels.

Meanwhile, as described above, the R pixel more easily transmits incident light than the G pixel and the B pixel do, and a reflection light amount is increased. Therefore, for example, detection accuracy for a focal point can be improved by differently using the focal point detecting pixels in accordance with an incident light amount. For example, in the case where the incident light amount exceeds a predetermined threshold and the R pixel is saturated, detection accuracy is improved by using the pixels Pg1 and Pg3, namely, G pixels as the focal point detecting pixels. On the other hand, in the case where the incident light amount is lower than the predetermined threshold and the R pixel is not saturated, detection accuracy for a focal point is improved by using the pixels Pg2 and Pg4, namely, R pixels as the focal point detecting pixels.

Figure 32:
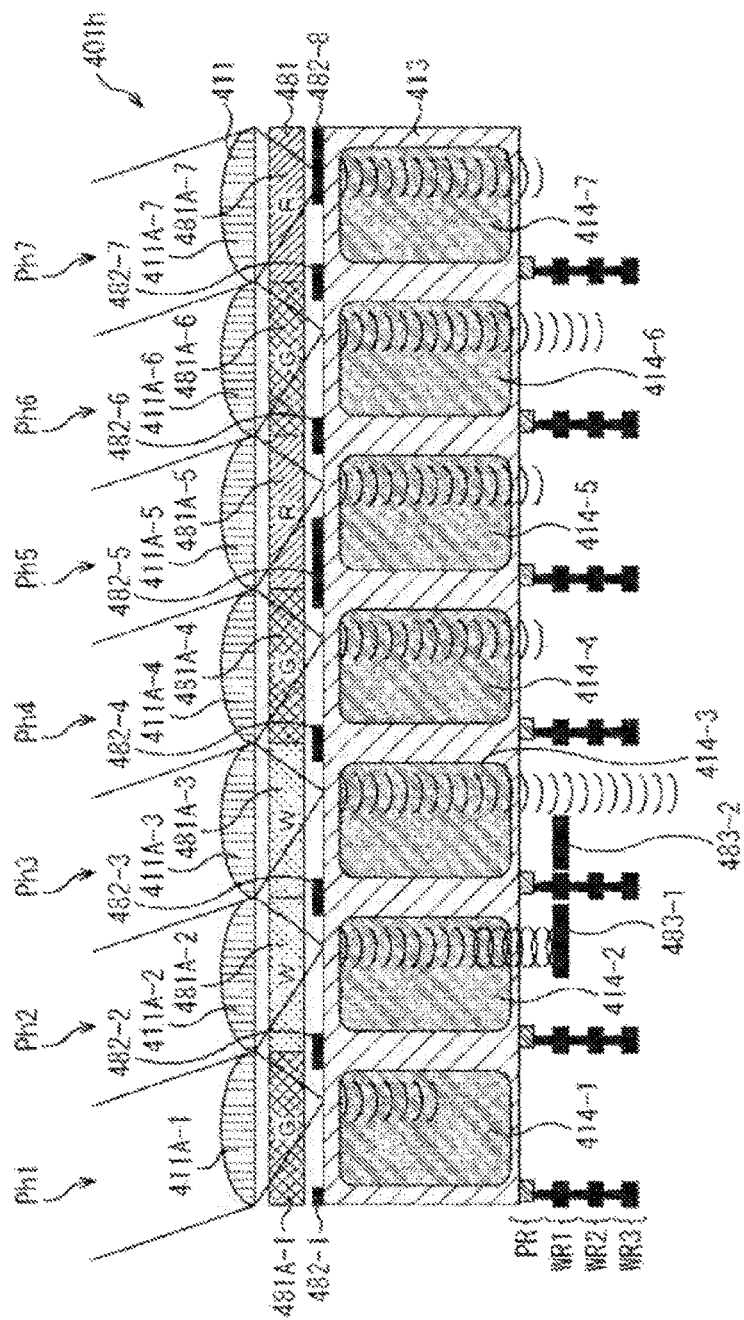
FIG. 32 is a cross-sectional view schematically illustrating a seventh exemplary configuration of the solid-state imaging element according to the second embodiment of the present technology.

Additionally, shield-type focal point detecting pixels and reflection-type focal point detecting pixels may be mixed as illustrated in FIG. 32. Note that a portion corresponding to the portion in FIG. 25 is denoted by a same reference sign in the drawing.

Comparing a solid-state imaging element 401h of FIG. 32 with the solid-state imaging element 401b of FIG. 25, pixels Ph1 to Ph7, a color filter array 481, shielding metals 482-1 to 482-8, and reflection metals 483-1 and 483-2 are provided instead of the pixels Pb1 to Pb4, color filter array 412, shielding metals 421-1 to 421-5, and reflection metals 422-1 and 422-2. Furthermore, the color filter array 481 is adapted to include filters 481A-1 to 481A-7.

The pixel Ph1 is adapted to include a microlens 411A-1, a filter 481A-1, and a photodiode 414-1. The filter 481A-1 is a G filter, and the pixel Ph1 is a G pixel.

The pixel Ph2 is adapted to include a microlens 411A-2, a filter 481A-2, and a photodiode 414-2. The filter 481A-2 is a W filter, and the pixel Ph2 is a W pixel.

The pixel Ph3 is adapted to include a microlens 411A-3, a filter 481A-3, and a photodiode 414-3. The filter 481A-3 is a W filter, and the pixel Ph3 is a W pixel.

The pixel Ph4 is adapted to include a microlens 411A-4, a filter 481A-4, and a photodiode 414-4. The filter 481A-4 is a G filter, and the pixel Ph4 is a G pixel.

The pixel Ph5 is adapted to include a microlens 411A-5, a filter 481A-5, and a photodiode 414-5. The filter 481A-5 is an R filter, and the pixel Ph5 is an R pixel.

The pixel Ph6 is adapted to include a microlens 411A-6, a filter 481A-6, and a photodiode 414-6. The filter 481A-6 is a G filter, and the pixel Ph6 is a G pixel.

The pixel Ph7 is adapted to include a microlens 411A-7, a filter 481A-7, and a photodiode 414-7. The filter 481A-7 is an R filter, and the pixel Ph7 is an R pixel.

The shielding metals 482-1 to 482-8 are arranged in a manner covering at least spaces between the adjacent photodiodes 414 between the color filter array 481 and the semiconductor substrate 413. The shielding metals 482-1 to 482-8 prevent incident light from entering a photodiodes 414 in an adjacent pixel.

Furthermore, the shielding metal 482-5 is formed in a manner covering not only the space between the photodiode 414-4 and the photodiode 414-5 but also a substantially left half of an incident surface of the photodiode 414-5. Furthermore, the shielding metal 482-8 is formed in a manner covering not only the space between the photodiode 414-7 and a photodiode not illustrated and adjacent on the right side thereof but also a substantially right half of an incident surface of the photodiode 414-7.

The reflection metals 483-1 and 483-2 are formed in the first wiring layer WR1. The reflection metal 483-1 is formed in a manner overlapping with a substantially right half of a bottom surface of the photodiode 414-2. The reflection metal 483-2 is formed in a manner overlapping with the substantially left half of the bottom surface of the photodiode 414-3.

Consequently, the pixels Ph2 and Ph3 are used as reflection-type focal point detecting pixels, and the pixels Ph5 and Ph7 are used as shield-type focal point detecting pixels.

Furthermore, for example, detection accuracy for a focal point can be improved by differently using the two kinds of focal point detecting pixels in accordance with an incident light amount. Specifically, in the case where the incident light amount is a predetermined threshold or lower, focal point detection is performed by using the reflection-type focal point detecting pixels, and in the case where the incident light amount exceeds the predetermined threshold, focal point detection is performed by using the shield-type focal point detecting pixels. Consequently, saturation of the focal point detecting pixels and insufficiency of the incident light amount are prevented, and detection accuracy for a focal point is improved.

Figure 33:
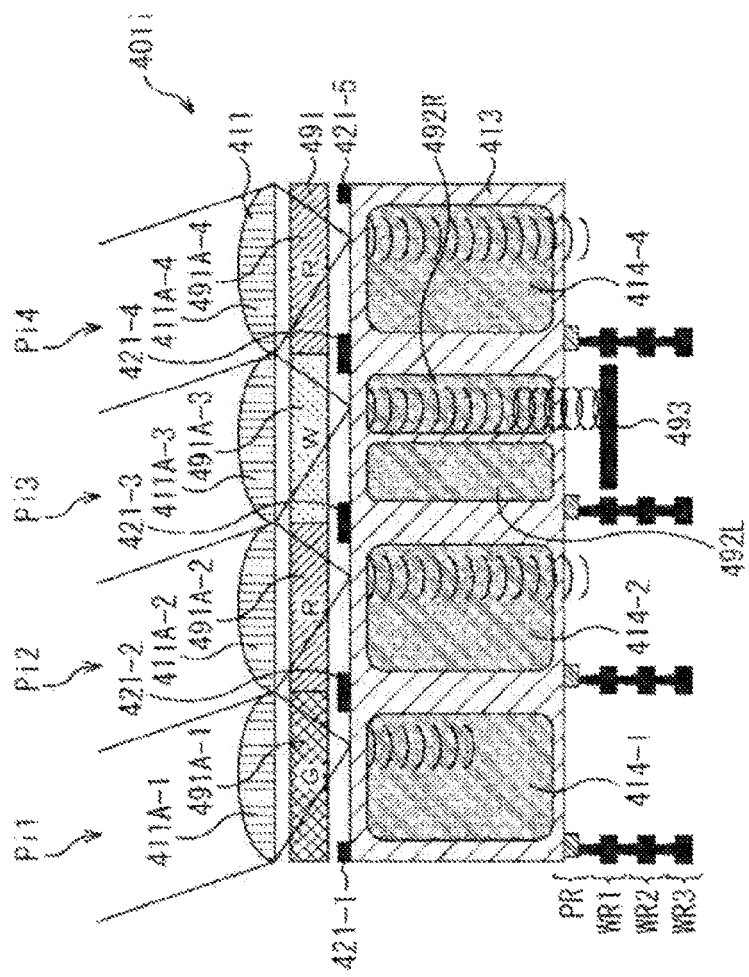
FIG. 33 is a cross-sectional view schematically illustrating an eighth exemplary configuration of the solid-state imaging element according to the second embodiment of the present technology.

Additionally, a photodiode of the reflection-type focal point detecting pixel can also be divided as illustrated in FIG. 33. Note that a portion corresponding to the portion in FIG. 25 is denoted by a same reference sign in FIG. 33.

A solid-state imaging element 401*i* of FIG. 33 is adapted to include pixels Pi1 to Pi4. Additionally, comparing a solid-state imaging element 401*i* with the solid-state imaging element 401*b* of FIG. 25, a color filter array 491, photodiodes 492L, 492R, and a reflection metal 493 are provided instead of the color filter array 412, photodiode 414-3, and reflection metals 422-1 and 422-2. Furthermore, the color filter array 491 is adapted to include filters 491A-1 to 491A-4.

The pixel Pi1 is adapted to include a microlens 411A-1, a filter 491A-1, and a photodiode 414-1. The filter 491A-1 is a G filter, and the pixel Pi1 is a G pixel.

The pixel Pi2 is adapted to include a microlens 411A-2, a filter 491A-2, and a photodiode 414-2. The filter 491A-2 is an R filter, and the pixel Pi2 is an R pixel.

The pixel Pi3 is adapted to include a microlens 411A-3, a filter 491A-3, and the photodiodes 492L, 492R. The filter 491A-3 is a W filter, and the pixel Pi3 is a W pixel.

The photodiodes 492L, 492R are provided by dividing a photodiode 414 into right and left portions. The photodiode 492L corresponds to a substantially left half of the photodiode 414, and the photodiode 492R corresponds to a substantially right half of the photodiode 414.

The pixel Pi4 is adapted to include a microlens 411A-4, a filter 491A-4, and a photodiode 414-4. The filter 491A-4 is an R filter, and the pixel Pi4 is an R pixel.

The reflection metal 493 is formed in the wiring layer WR1 in a manner overlapping with substantially bottom surfaces of the photodiodes 492L, 492R.

Additionally, the pixel Pi3 constitutes a reflection-type focal point detecting pixel. Specifically, a difference is generated between an incident light amount upon the photodiode 492L and an incident light amount upon the photodiode 492R by an incidence angle of the incident light upon the microlens 411A-3. Therefore, deviation of a focal point is detected on the basis of a deviation amount (phase deviation amount) between an image formed by the photodiodes 492L of a plurality of pixels having configurations similar to that of the pixel Pi3 and an image formed by the photodiode 492R. Then, focal point adjustment is performed so as to eliminate the detected deviation of the focal point position.

Here, since the photodiode 492L or 492R each have an opening of a half size compared to the photodiode 414, sensitivity is degraded.

On the other hand, most of transmitted light having passed through the photodiode 492L is reflected by the reflection metal 493, and enters the photodiode 492L again. Most of transmitted light having passed through the photodiode 492R is reflected by reflection metal 493, and enters the photodiode 492R again. Consequently, sensitivity of the photodiodes 492L and 492R can be improved. As a result, focal point detection accuracy for a subject with low illumination is improved, for example.

Note that a position in the vertical direction of the reflection metal 493 is not limited to the wiring layer WR1 and can also be set at an optional position.

Furthermore, the reflection metal 493 can be formed in a manner covering only the bottom surface of any one of the photodiodes 492L and 492R.

Moreover, the number of divisions in the photodiode is not limited to two divisions, and can also be optionally set to, for example, four divisions.

Meanwhile, the second embodiment of the present technology can be applied to not only a back-illumination type solid-state imaging element but also a front-illumination type solid-state imaging element.

Additionally, while the example of dividing a range where the shielding metal overlaps with the bottom surface of the photodiode into two patterns formed of the right half and the left half in each pixel has been provided in the above description, the range may also be divided into three patterns or more. For example, the range may be divided into four patterns by dividing the bottom surface of the photodiode into four portions.

<4. Third Embodiment>

Next, a third embodiment of the present technology will be described with reference to FIGS. 34 to 73.

A method of elongating a photodiode in a light incident direction and elongating a path where infrared light passes through is effective in order to improve sensitivity of a solid-state imaging element for the infrared light. However, considering a technological aspect and a cost aspect, elongating the photodiode may be difficult. Therefore, in the related arts, used is a technology in which sensitivity is improved by reflecting infrared light having passed through a photodiode and making the infrared light incident again.

On the other hand, in the case of making the infrared light enter the photodiode diode, when an incidence angle of the infrared light is increased, there may be a risk in which reflection light enters an adjacent pixel and causes color mixture and resolution degradation.

Additionally, since incidence angles of infrared light are different between a pixel at a center and a pixel at an end portion of a viewing angle, a difference is caused in an optical path length inside the photodiode. Consequently, a difference of sensitivity may be caused between the pixels, and shading may occur.

Therefore, the third embodiment of the present technology relates to a solid-state imaging element capable of improving sensitivity for infrared light without deteriorating image quality.

{Third Embodiment 1}

To begin with, a first example of the third embodiment will be described with reference to FIGS. 34 to 47.

Figure 34:
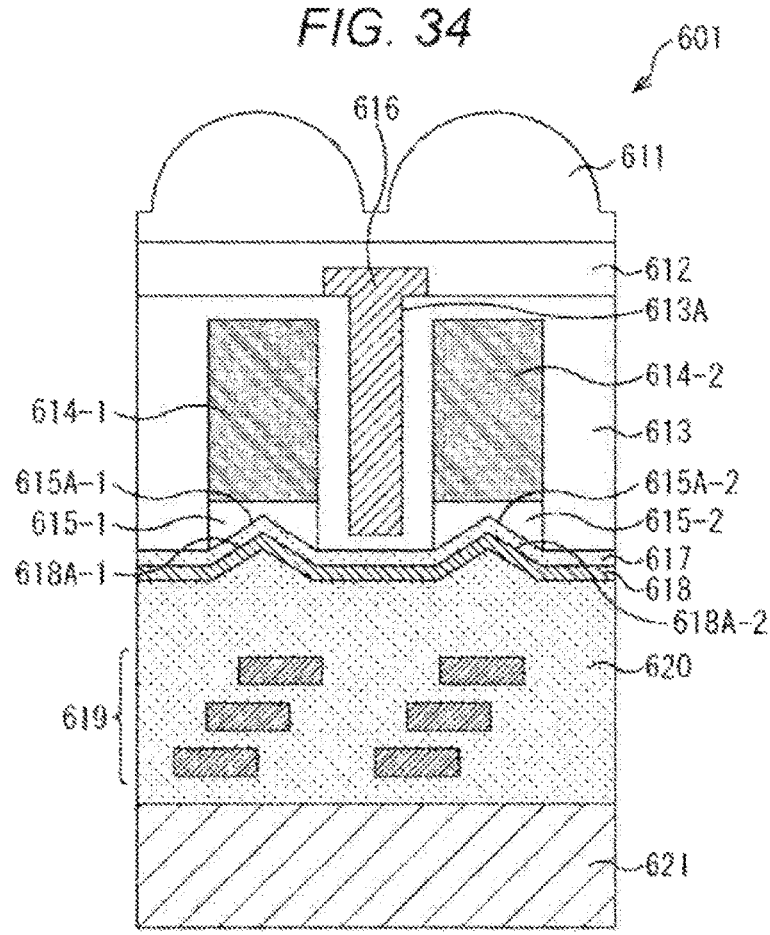
FIG. 34 is a cross-sectional view schematically illustrating a first exemplary configuration of a solid-state imaging element according to a third embodiment of the present technology.

FIG. 34 is a cross-sectional view illustrating a configuration formed of two adjacent pixels in a solid-state imaging element 601 that is one embodiment of a solid-state imaging element 11 of FIG. 1.

The solid-state imaging element 601 is a back-illumination type solid-state imaging element capable of imaging an image by light having a wavelength band from visible light to infrared light. The solid-state imaging element 601 is adapted to include an on-chip microlens 611, a flattened film 612, a semiconductor substrate 613, photoelectric conversion units (PD) 614-1, 614-2, P+ layers (HAD) 615-1, 615-2, a reflection film 616, an insulation film 617, a reflection film 618, a wire 619, an interlayer insulation film 620, and a support substrate 621. Additionally, one photodiode is formed of the photoelectric conversion unit 614-1 and the P+ layer 615-1, and one photodiode is formed of the photoelectric conversion unit 614-2 and the P+ layer 615-2.

Note that the on-chip microlens 611 side of the solid-state imaging element 601, namely, a side where light enters will be referred to as an incident side and the support substrate 621 side located on an opposite side of the incident side will be referred to as a substrate side in the following.

The semiconductor substrate 613 is formed of a silicon substrate, for example. The on-chip microlens 611 is formed on an incident-side surface (incident surface) of the semiconductor substrate 613 via the flattened film 612. The photoelectric conversion unit 614-1 and the photoelectric conversion unit 614-2 are formed inside the semiconductor substrate 613 in a manner aligned in a lateral direction. The P+ layer 615-1 is formed under the photoelectric conversion unit 614-1 and on a surface on an opposite surface of the incident surface (bottom surface) of the semiconductor substrate 613. The P+ layer 615-2 is formed under the photoelectric conversion unit 614-2 and on a surface of the bottom surface of the semiconductor substrate 613.

A groove 615A-1 having a quadrangular pyramid shape is formed on a surface of the P+ layer 615-1. A groove 615A-2 having a shape similar to the groove 615A-1 is formed on a surface of the P+ layer 615-2.

The reflection film 616 is formed between the photoelectric conversion unit 614-1 and the photoelectric conversion unit 614-2 adjacent to each other. The reflection film 616 is formed in a manner extending to the inside of the semiconductor substrate 613 from the incident surface of the semiconductor substrate 613. Meanwhile, although not illustrated in the drawing, the reflection film 616 is formed in a manner surrounding respective side surfaces of the photoelectric conversion unit 614-1 and the P+ layer 615-1 as well as respective side surfaces of the photoelectric conversion unit 614-2 and the P+ layer 615-2.

The bottom surface of the semiconductor substrate 613 is covered with the insulation film 617. Additionally, a surface of the insulation film 617 is covered with the reflection film 618 formed of a metal film. The reflection film 618 is formed with protruding portions 618A-1 and 618A-2 having a shape same as that of the groove 615A-1 of the P+ layer 615-1 and groove 615A-2 of the P+ layer 615-2.

The wire 619 and the interlayer insulation film 620 are formed between the semiconductor substrate 613 and the support substrate 621. The wire 619 is formed across a plurality of wiring layers, and a space between respective wiring layers is insulated by the interlayer insulation film 620.

Note that a pixel not illustrated in the drawing also has a configuration similar to that of the pixel illustrated.

Meanwhile, in the case where there is no need to differentiate each one of the photoelectric conversion units 614-1, 614-2, each thereof will be simply referred to as a photoelectric conversion unit 614 in the following. In the following, in the case where there is no need to differentiate each one of the P+ layers 615-1, 615-2, each thereof will be simply referred to as a P+ layer 615. In the following, in the case where there is no need to differentiate each one of the grooves 615A-1, 615A-2 and the protruding portions 618A-1, 618A-2, each thereof will be simply referred to as a groove 615A and a protruding portion 618A.

When incident light including infrared light enters a pixel including the photoelectric conversion unit 614-1 via the on-chip microlens 611 and the flattened film 612, part of the incident light is absorbed by the photoelectric conversion unit 614-1 and remainder thereof passes through without being absorbed by the photoelectric conversion unit 614-1.

At this point, the incident light is prevented from being leaked to an adjacent pixel by the reflection film 616.

The transmitted light having passed through the photoelectric conversion unit 614-1 is reflected by the reflection film 618 toward the photoelectric conversion unit 614-1, and part of the reflection light enters the photoelectric conversion unit 614-1 again and is absorbed. At this point, the reflection light is reflected in multiple directions by the protruding portions 618A-1 of the reflection film 618. Furthermore, the reflection light is prevented from being leaked to an adjacent pixel by the reflection film 616.

In other pixels also, incident light and reflection light are absorbed by the photoelectric conversion unit 714 in a similar manner.

Therefore, in each pixel, the incident light and the reflection light are prevented from being leaked to an adjacent pixel, and as a result, color mixture and resolution degradation are prevented.

Additionally, since the reflection light is reflected in the multiple directions, an optical path length of the light (incident light and reflection light) that passes through the photoelectric conversion unit 614 of each pixel is uniformed regardless of a difference of an incidence angle of incident light. Consequently, it is possible to suppress occurrence of shading caused by the difference of the incidence angle of the incident light due to a positional difference of each pixel.

Next, a manufacturing method of the solid-state imaging element 601 will be described with reference to FIGS. 35 to 47.

Figure 35:
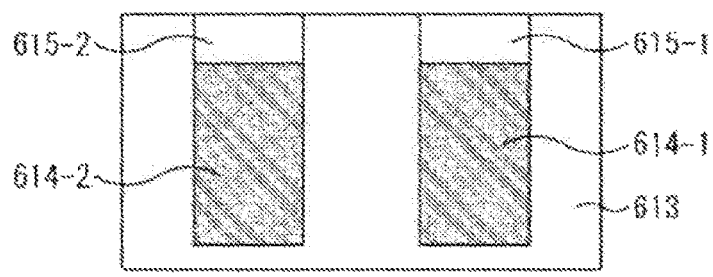
FIG. 35 is a diagram to describe a manufacturing method of the first exemplary configuration of the solid-state imaging element according to the third embodiment of the present technology.

First, the photoelectric conversion units 614-1 and 614-2 are formed inside the semiconductor substrate 613 as illustrated in FIG. 35. Furthermore, the P+ layers 615-1 and 615-2 which are upper layers of the photoelectric conversion units 614-1 and 614-2 are formed on the surface of the semiconductor substrate 613.

Figure 36:
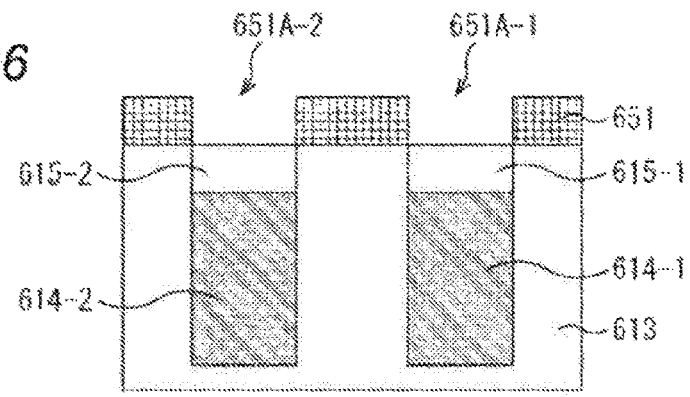
FIG. 36 is a diagram to describe the manufacturing method of the first exemplary configuration of the solid-state imaging element according to the third embodiment of the present technology.

Next, photoresist 651 is applied to the surface of the semiconductor substrate 613, and exposure is performed by using a predetermined photomask. Consequently, opened portions 651A-1 and 651A-2 are formed in the photoresist 651 so as to expose the surfaces of the P+ layers 615-1 and 615-2 as illustrated in FIG. 36.

Figure 37:
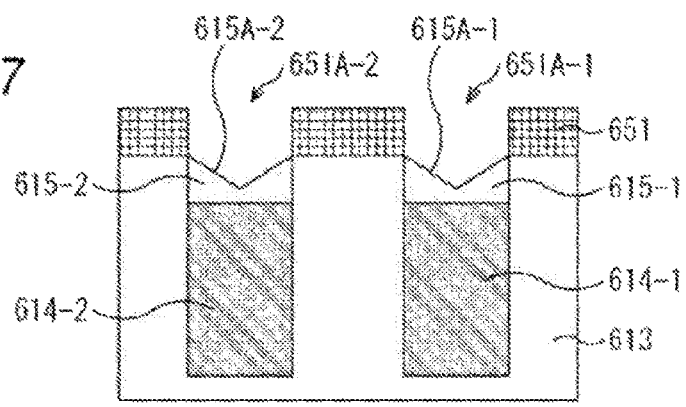
FIG. 37 is a diagram to describe the manufacturing method of the first exemplary configuration of the solid-state imaging element according to the third embodiment of the present technology.

Next, grooves 615A-1 and 615A-2 each having a quadrangular pyramid shape are formed respectively on the surfaces of the P+ layers 615-1 and 615-2 by dry etching or wet etching as illustrated in FIG. 37.

Figure 38:
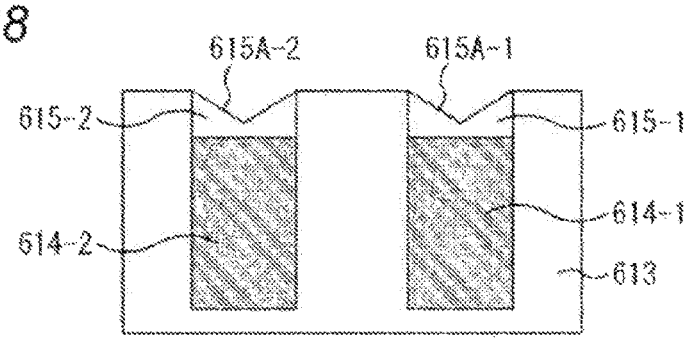
FIG. 38 is a diagram to describe the manufacturing method of the first exemplary configuration of the solid-state imaging element according to the third embodiment of the present technology.

Next, the photoresist 651 is stripped by post-treatment such as asking as illustrated in FIG. 38.

Figure 39:
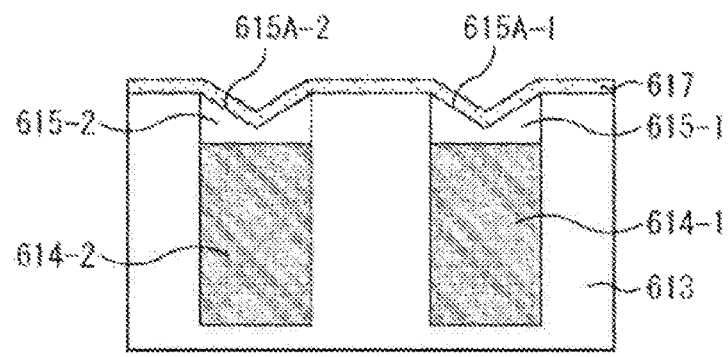
FIG. 39 is a diagram to describe the manufacturing method of the first exemplary configuration of the solid-state imaging element according to the third embodiment of the present technology.

Next, the insulation film 617 is formed on the surface of the semiconductor substrate 613 as illustrated in FIG. 39.

Figure 40:
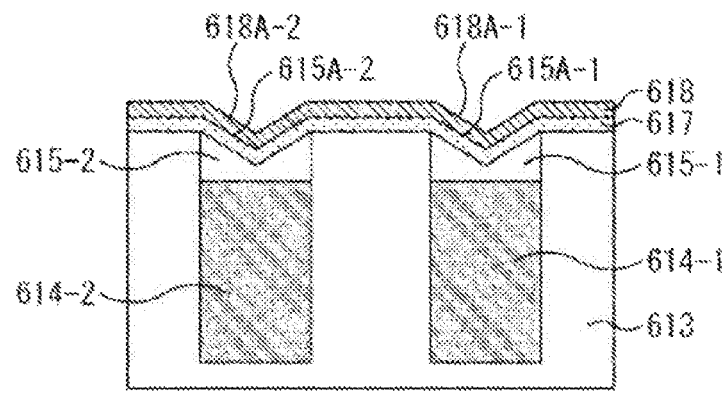
FIG. 40 is a diagram to describe the manufacturing method of the first exemplary configuration of the solid-state imaging element according to the third embodiment of the present technology.

Next, the reflection film 618 is formed on the surface of the insulation film 617 as illustrated in FIG. 40. The reflection film 618 is formed with the protruding portions 618A-1 and 618A-2 conforming to the groove 615A-1 of the P+ layer 615-1 and the groove 615A-2 of the P+ layer 615-2.

Note that part of the reflection film 618 is removed by processing in order to be connected to the wire 619 although not illustrated.

Figure 41:
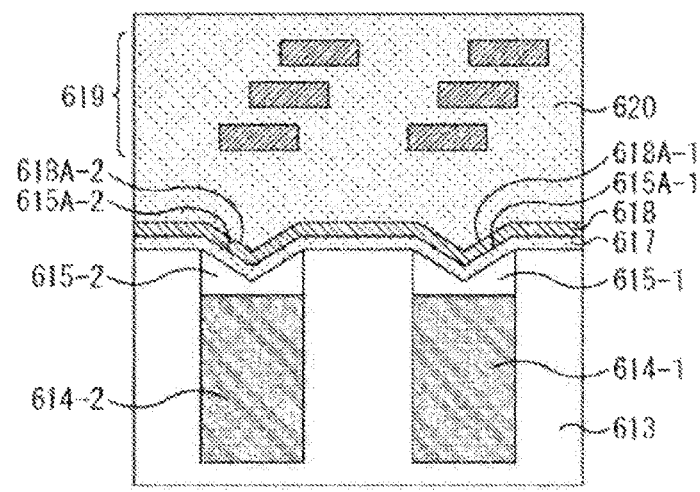
FIG. 41 is a diagram to describe the manufacturing method of the first exemplary configuration of the solid-state imaging element according to the third embodiment of the present technology.

Next, the wire 619 and the interlayer insulation film 620 are formed on the reflection film 618 as illustrated in FIG. 41.

Figure 42:
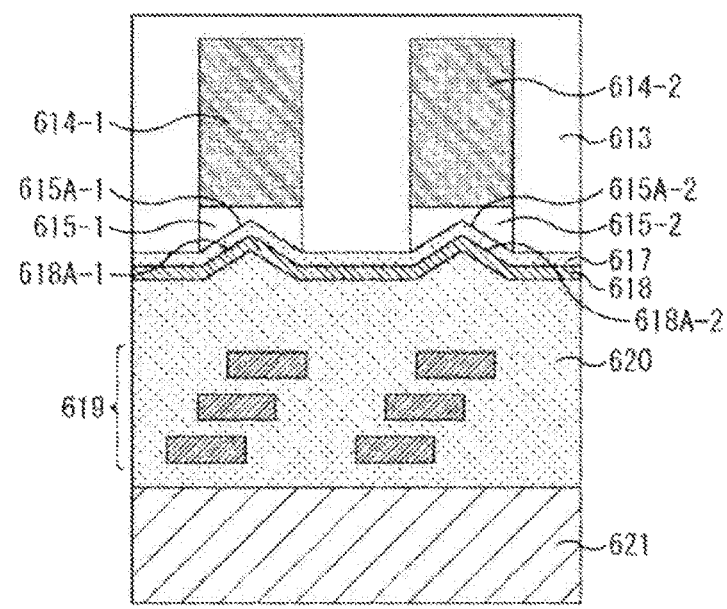
FIG. 42 is a diagram to describe the manufacturing method of the first exemplary configuration of the solid-state imaging element according to the third embodiment of the present technology.

Next, a surface of the interlayer insulation film 620 is bonded to the surface of the support substrate 621 as illustrated in FIG. 42. Note that an upper side and a lower side of the configuration illustrated in FIG. 41 are illustrated in an inverted manner in FIG. 42.

Figure 43:
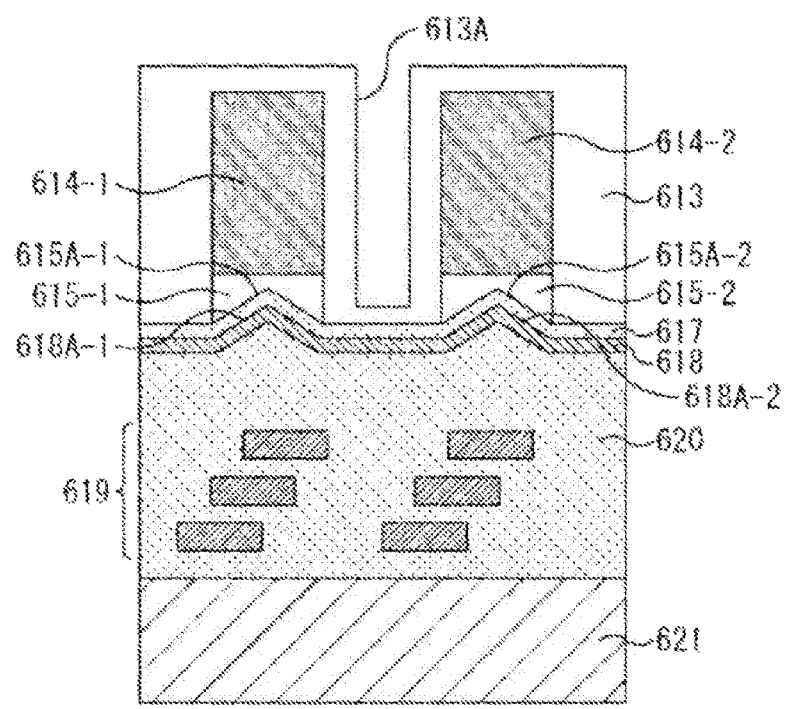
FIG. 43 is a diagram to describe the manufacturing method of the first exemplary configuration of the solid-state imaging element according to the third embodiment of the present technology.

Next, a groove 613A adapted to separate a space between the photoelectric conversion unit 614-1 and the photoelectric conversion unit 614-2 is formed in the semiconductor substrate 613 by mask processing using photoresist as illustrated in FIG. 43.

The groove 613A extends to the inside of the substrate from the incident surface of the semiconductor substrate 613 and is formed in a manner surrounding the respective side surfaces of the photoelectric conversion unit 614-1 and the P+ layer 615-1 as well as the respective side surfaces of the photoelectric conversion unit 614-2 and the P+ layer 615-2. Since the photoelectric conversion units 614 of each pixel are two-dimensionally arrayed, the groove 613A is formed in a grid pattern, for example, when viewed from the incident surface side of the semiconductor substrate 613.

Figure 44:
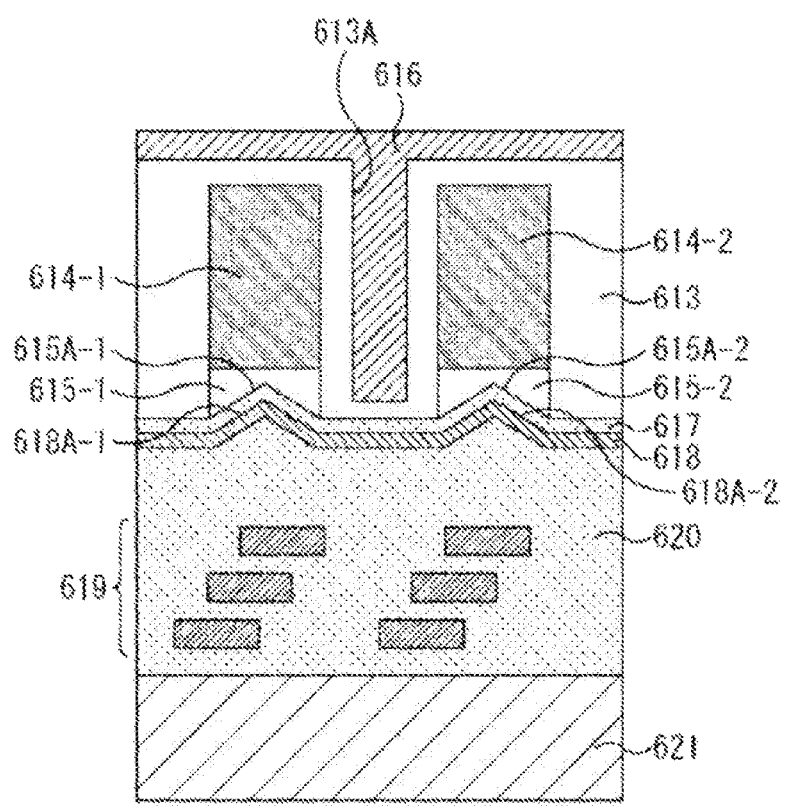
FIG. 44 is a diagram to describe the manufacturing method of the first exemplary configuration of the solid-state imaging element according to the third embodiment of the present technology.

Next, after an insulation film (not illustrated) is formed on the surface of the incident surface of the semiconductor substrate 613, the reflection film 616 is formed on the surface of this insulation film as illustrated in FIG. 44. The reflection film 616 is embedded to the groove 613A of the semiconductor substrate 613 and also covers the incident surface of the semiconductor substrate 613.

Figure 45:
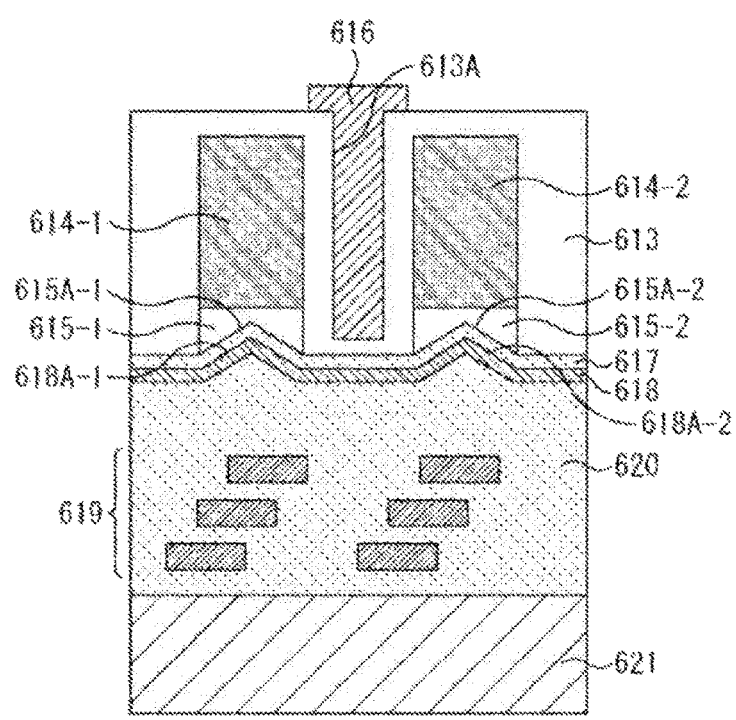
FIG. 45 is a diagram to describe the manufacturing method of the first exemplary configuration of the solid-state imaging element according to the third embodiment of the present technology.

Next, part of the reflection film 616 is removed so as to expose the incident surfaces of the photoelectric conversion units 614-1 and 614-2 as illustrated in FIG. 45.

Figure 46:
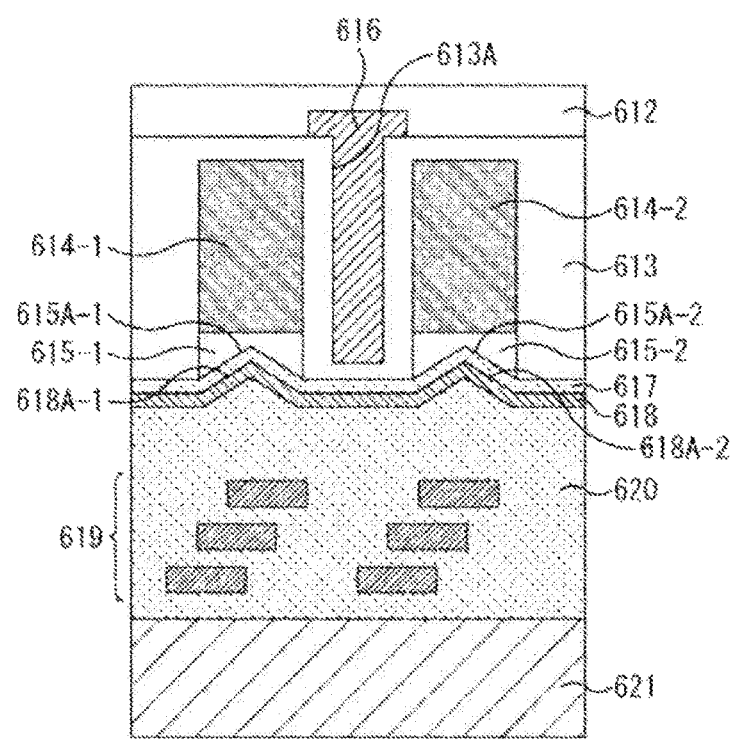
FIG. 46 is a diagram to describe the manufacturing method of the first exemplary configuration of the solid-state imaging element according to the third embodiment of the present technology.

Next, the flattened film 612 is formed on the surfaces of the semiconductor substrate 613 and the reflection film 616 as illustrated in FIG. 46.

Figure 47:
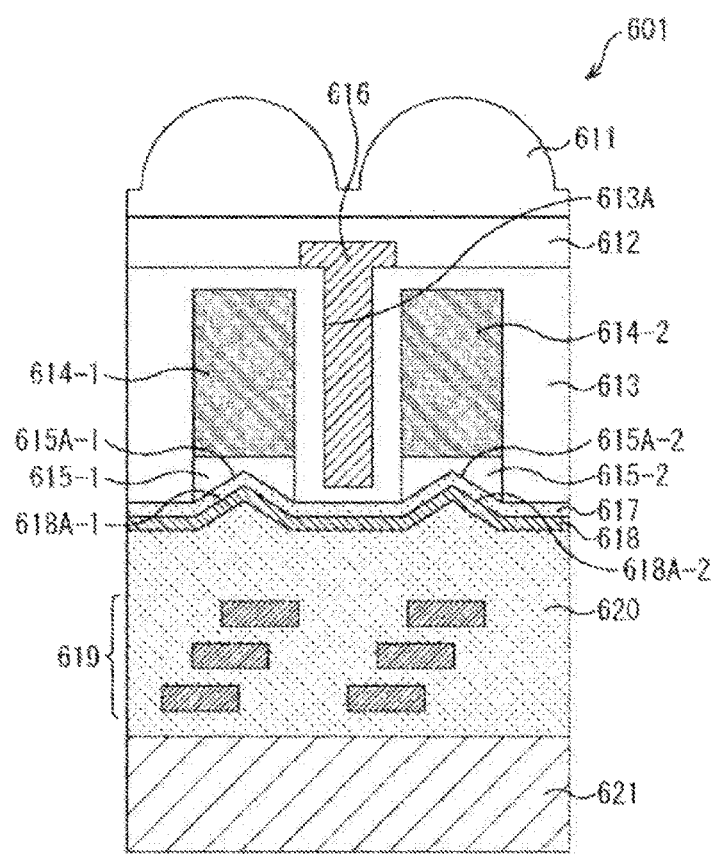
FIG. 47 is a diagram to describe the manufacturing method of the first exemplary configuration of the solid-state imaging element according to the third embodiment of the present technology.

Finally, the on-chip microlens 611 is formed on a surface of the flattened film 612 as illustrated in FIG. 47.

Meanwhile, a shape and a position of the protruding portion 618A of the reflection film 618 may be changed per pixel. In other words, since the incidence angle of the incident light is varied by the position of the pixel, variation between pixels in terms of the optical path length of the light having passed through the photoelectric conversion unit 614 can be reduced by suitably adjusting, per pixel, at least either one of the shape and the position of the protruding portion 618A in accordance with the incidence angle.

{Third Embodiment 2}

Next, a second example of the third embodiment will be described with reference to FIGS. 48 to 59.

Figure 48:
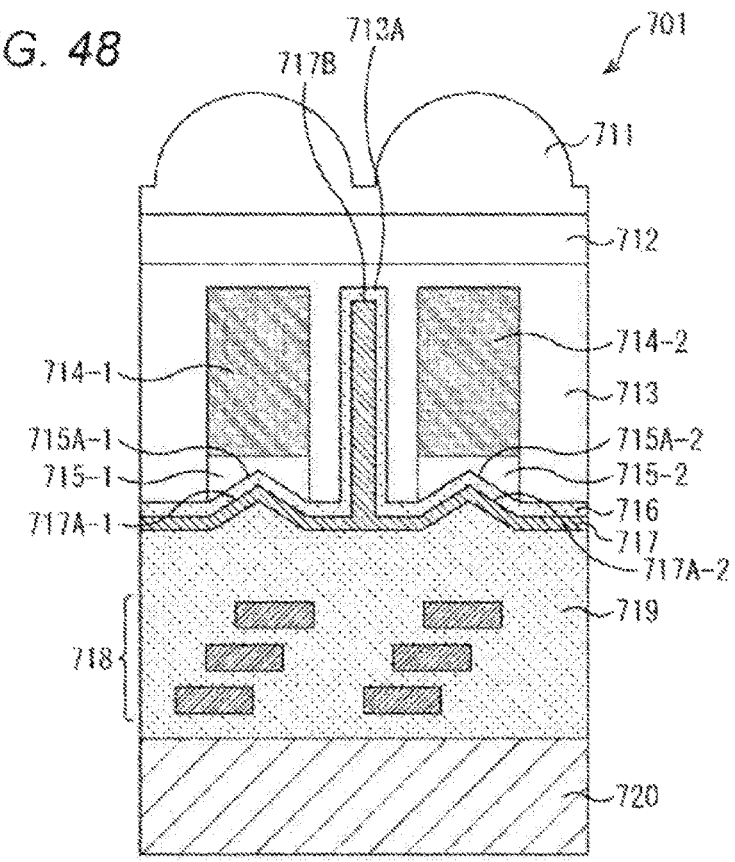
FIG. 48 is a cross-sectional view schematically illustrating a second exemplary configuration of the solid-state imaging element according to the third embodiment of the present technology.

FIG. 48 is a cross-sectional view illustrating a configuration formed of two adjacent pixels of a solid-state imaging element 701.

The solid-state imaging element 701 is a back-illumination type solid-state imaging element capable of imaging an image by light having a wavelength band from visible light to infrared light. The solid-state imaging element 701 is adapted to include an on-chip microlens 711, a flattened film 712, a semiconductor substrate 713, photoelectric conversion units (PD) 714-1, 714-2, P+ layers (HAD) 715-1, 715-2, a reflection film 716, an insulation film 717, a wire 718, an interlayer insulation film 719, and a support substrate 720. Additionally, one photodiode is formed of the photoelectric conversion unit 714-1 and the P+ layer 715-1, and one photodiode is formed of the photoelectric conversion unit 714-2 and the P+ layer 715-2.

The semiconductor substrate 713 is formed of a silicon substrate, for example. The on-chip microlens 711 is formed on an incident surface of the semiconductor substrate 713 via the flattened film 712. The photoelectric conversion unit 714-1 and the photoelectric conversion unit 714-2 are formed inside the semiconductor substrate 713 in a manner aligned in the lateral direction. The P+ layer 715-1 is formed under the photoelectric conversion unit 714-1 and on a surface of the bottom surface of the semiconductor substrate 713. The P+ layer 715-2 is formed under the photoelectric conversion unit 714-2 and on a surface of the bottom surface of the semiconductor substrate 713.

A groove 715A-1 having a quadrangular pyramid shape is formed on a surface of the P+ layer 715-1. A groove 715A-2 having a shape similar to the groove 715A-1 is formed on a surface of the P+ layer 715-2.

A groove 713A is formed in a direction extending from the bottom surface of the semiconductor substrate 713 to the inside thereof between the photoelectric conversion unit 714-1 and the photoelectric conversion unit 714-2 of the semiconductor substrate 713. Meanwhile, although not illustrated in the drawing, the groove 713A is formed in a manner surrounding respective side surfaces of the photoelectric conversion unit 714-1 and the P+ layer 715-1 as well as respective side surfaces of the photoelectric conversion unit 714-2 and the P+ layer 715-2.

The bottom surface of the semiconductor substrate 713 and a surface of the groove 713A of are covered with the insulation film 716. A surface of the insulation film 716 is formed with the reflection film 717 formed of a metal film. The reflection film 717 is formed with protruding portions 717A-1 and 717A-2 having a shape same as that of the groove 715A-1 of the P+ layer 715-1 and groove 715A-2 of the P+ layer 715-2.

Additionally, the reflection film 717 is formed with a wall portion 717B having a shape substantially same as that of the groove 713A of the semiconductor substrate 713. In other words, the reflection film 717 has a structure in which a reflection film to reflect transmitted light and a reflection film provided in a space with an adjacent photodiode are integrated. The wall 717B surrounds the respective side surfaces of the photoelectric conversion unit 714-1 and the P+ layer 715-1 as well as the respective side surfaces of the photoelectric conversion unit 714-2 and the P+ layer 715-2 in a manner similar to the groove 713A.

The wire 718 and the interlayer insulation film 719 are formed between the semiconductor substrate 713 and the support substrate 720. The wire 718 is formed across a plurality of wiring layers, and a space between respective wiring layers is insulated by the interlayer insulation film 719.

Note that a pixel not illustrated in the drawing also has a configuration similar to that of the pixel illustrated.

Meanwhile, in the following, in the case where there is no need to differentiate each one of the photoelectric conversion units 714-1, 714-2, each thereof will be simply referred to as a photoelectric conversion unit 714. In the following, in the case where there is no need to differentiate each one of the P+ layers 715-1, 715-2, each thereof will be simply referred to as a P+ layer 715. In the following, in the case where there is no need to differentiate each one of the grooves 715A-1, 715A-2 and the protruding portions 717A-1, 717A-2, each thereof will be simply referred to as a groove 715A and a protruding portion 717A.

When incident light including infrared light enters a pixel including the photoelectric conversion unit 714-1 via the on-chip microlens 711 and the flattened film 712, part of the incident light is absorbed by the photoelectric conversion unit 714-1 and remainder thereof passes through without being absorbed by the photoelectric conversion unit 714-1. At this point, the incident light is prevented from being leaked to an adjacent pixel by the wall portion 717B of the reflection film 717.

The transmitted light having passed through the photoelectric conversion unit 714-1 is reflected by the protruding portions 717A-1 of the reflection film 717 toward the photoelectric conversion unit 714-1, and part of the reflection light enters the photoelectric conversion unit 714-1 again and is absorbed. At this point, the reflection light is reflected in multiple directions by the protruding portions 717A-1 of the reflection film 717. Furthermore, the reflection light is prevented from being leaked to an adjacent pixel by the wall portion 717B of the reflection film 717.

In other pixels also, incident light and reflection light are absorbed by the photoelectric conversion unit 714 in a similar manner.

Therefore, in each pixel, the incident light and the reflection light are prevented from being leaked to an adjacent pixel, and as a result, color mixture and resolution degradation are prevented.

Additionally, since the reflection light is reflected in the multiple directions, an optical path length of the light (incident light and reflection light) that passes through the photoelectric conversion unit 714 of each pixel is uniformed regardless of a difference of an incidence angle of incident light. Consequently, it is possible to suppress occurrence of shading caused by the difference of the incidence angle of the incident light due to a positional difference of each pixel.

Next, a manufacturing method of the solid-state imaging element 701 will be described with reference to FIGS. 49 to 59.

Figure 49:
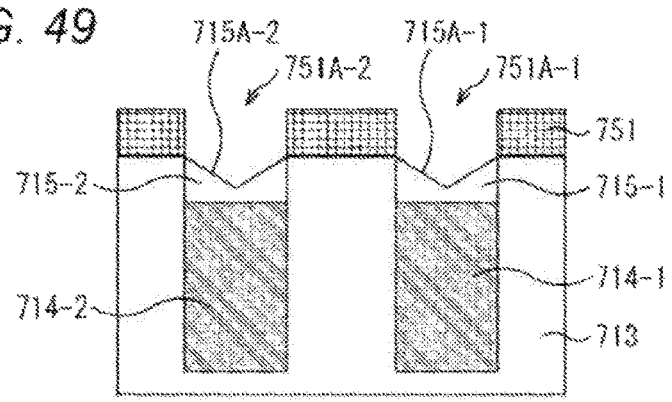
FIG. 49 is a diagram to describe a manufacturing method of the second exemplary configuration of the solid-state imaging element according to the third embodiment of the present technology.

First, processes similar to those described in FIGS. 35 and 36 are performed, and then the grooves 715A-1 and 715A-2 each having a quadrangular pyramid shape are formed respectively on the surfaces of the P+ layers 715-1 and 715-2 by dry etching or wet etching as illustrated in FIG. 49.

Figure 50:
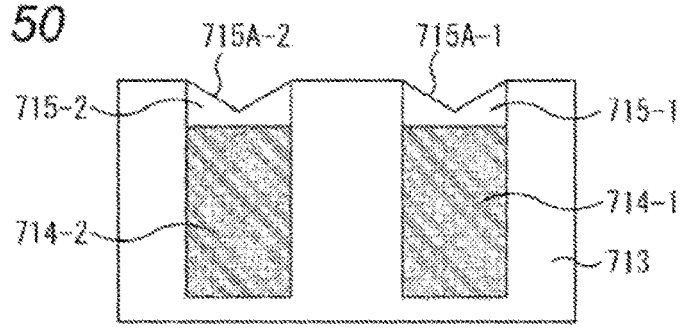
FIG. 50 is a diagram to describe the manufacturing method of the second exemplary configuration of the solid-state imaging element according to the third embodiment of the present technology.

Next, the photoresist 751 is stripped by post-treatment such as asking as illustrated in FIG. 50.

Figure 51:
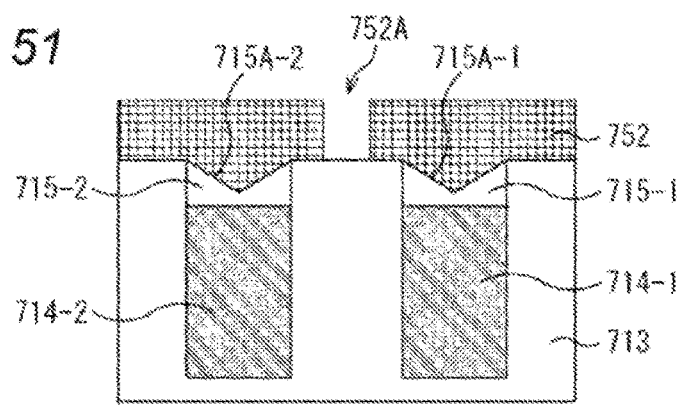
FIG. 51 is a diagram to describe the manufacturing method of the second exemplary configuration of the solid-state imaging element according to the third embodiment of the present technology.

Next, photoresist 752 is applied to the surface of the semiconductor substrate 713, and exposure is performed by using a predetermined photomask. Consequently, as illustrated in FIG. 51, an opened portion 752A is formed in the photoresist 752 between the photoelectric conversion unit 714-4 and the photoelectric conversion unit 714-2.

Meanwhile, although not illustrated in the drawing, the opened portion 752A is formed in a grid pattern in a manner surrounding the surface of the P+ layer 715 in each pixel.

Figure 52:
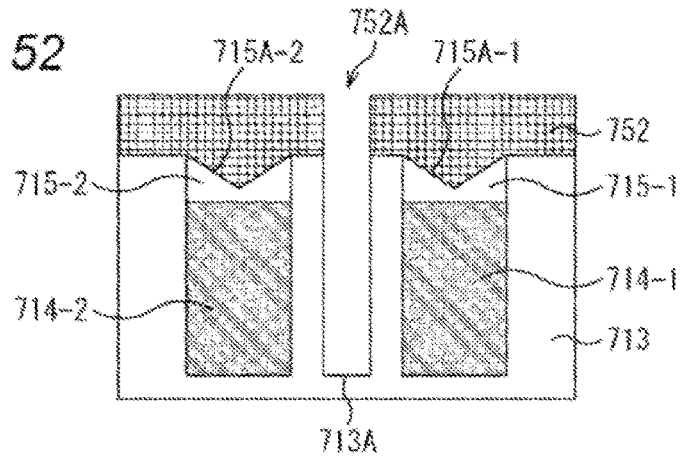
FIG. 52 is a diagram to describe the manufacturing method of the second exemplary configuration of the solid-state imaging element according to the third embodiment of the present technology.

Next, the groove 713A is formed in a manner conforming to the opened portion 752A of the photoresist 752 as illustrated in FIG. 52. The groove 713A extends to the inside of the substrate from the bottom surface of the semiconductor substrate 713 and is formed in a manner surrounding the respective side surfaces of the photoelectric conversion unit 714-1 and the P+ layer 715-1 as well as the respective side surfaces of the photoelectric conversion unit 714-2 and the P+ layer 715-2. Additionally, since the photoelectric conversion units 714 of each pixel are two-dimensionally arrayed, the groove 713A is formed in a grid pattern when viewed from the bottom surface side of the semiconductor substrate 713.

Figure 53:
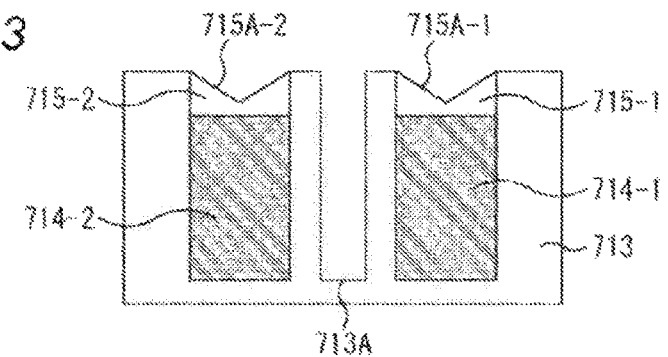
FIG. 53 is a diagram to describe the manufacturing method of the second exemplary configuration of the solid-state imaging element according to the third embodiment of the present technology.

Next, the photoresist 752 is stripped by post-treatment such as asking as illustrated in FIG. 53.

Figure 54:
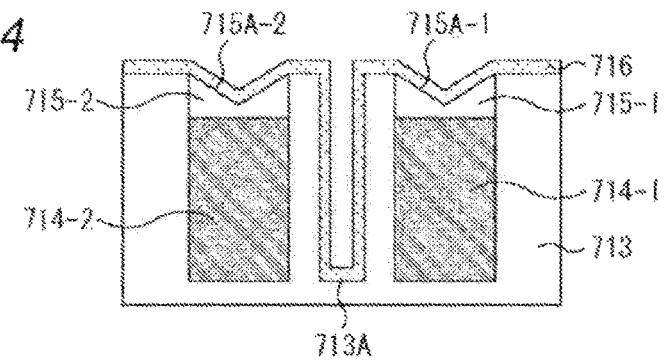
FIG. 54 is a diagram to describe the manufacturing method of the second exemplary configuration of the solid-state imaging element according to the third embodiment of the present technology.

Next, the insulation film 716 is formed on the surface of the semiconductor substrate 713 as illustrated in FIG. 54. The insulation film 716 also covers the surface of the groove 713A of the semiconductor substrate 713.

Figure 55:
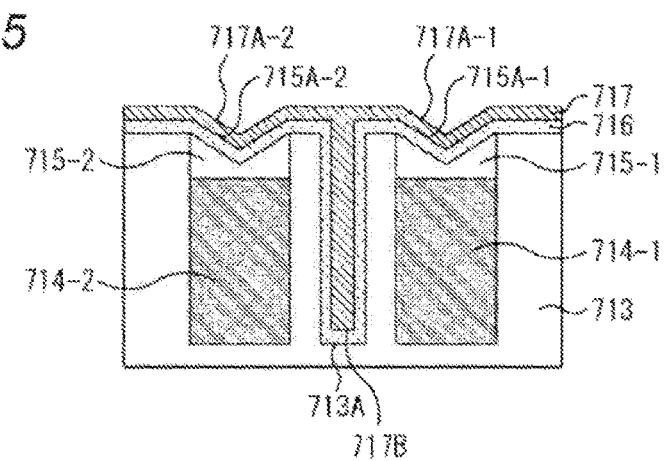
FIG. 55 is a diagram to describe the manufacturing method of the second exemplary configuration of the solid-state imaging element according to the third embodiment of the present technology.

Next, the reflection film 717 is formed on the surface of the insulation film 716 as illustrated in FIG. 55. The reflection film 717 is formed with the protruding portions 717A-1 and 717A-2 conforming to the groove 715A-1 of the P+ layer 715-1 and the groove 715A-2 of the P+ layer 715-2.

Additionally, the reflection film 717 is embedded in the groove 713A of the semiconductor substrate 713 and forms the wall portion 717B. The wall 717B surrounds the respective side surfaces of the photoelectric conversion unit 714-1 and the P+ layer 715-1 as well as the respective side surfaces of the photoelectric conversion unit 714-2 and the P+ layer 715-2 in a manner similar to the groove 713A.

Note that part of the reflection film 717 is removed by processing in order to be connected to the wire 718 although not illustrated.

Figure 56:
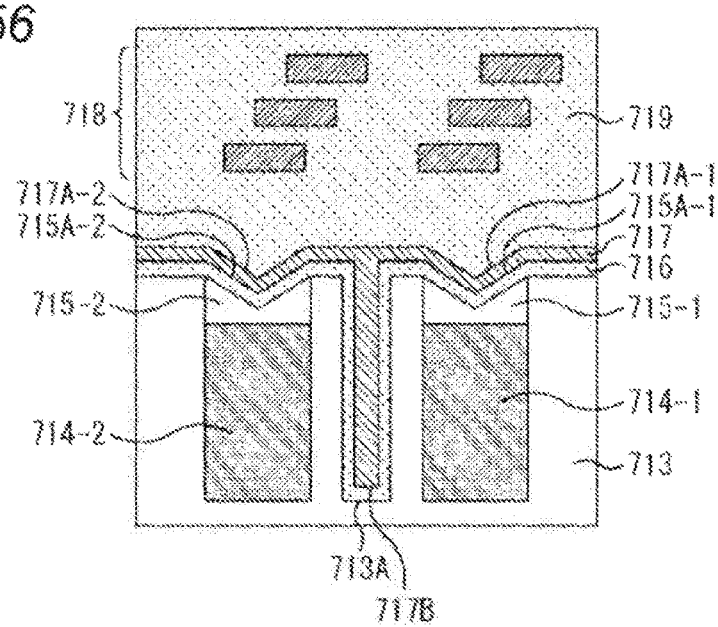
FIG. 56 is a diagram to describe the manufacturing method of the second exemplary configuration of the solid-state imaging element according to the third embodiment of the present technology.

Next, the wire 718 and the interlayer insulation film 719 are formed on the reflection film 717 as illustrated in FIG. 56.

Figure 57:
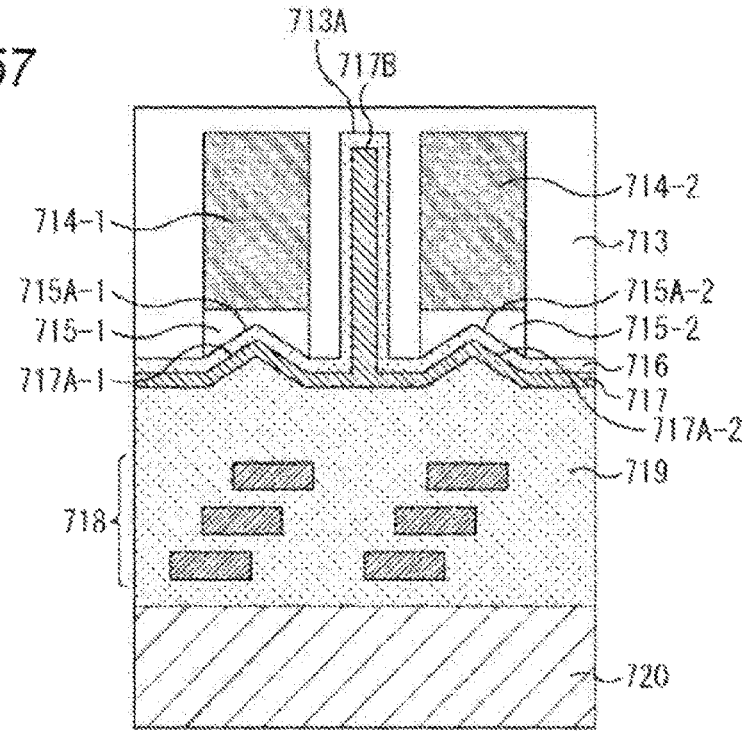
FIG. 57 is a diagram to describe the manufacturing method of the second exemplary configuration of the solid-state imaging element according to the third embodiment of the present technology.

Next, a surface of the interlayer insulation film 719 is bonded to the surface of the support substrate 720 as illustrated in FIG. 57. In FIG. 57, note that an upper side and a lower side of the configuration illustrated in FIG. 56 are illustrated in an inverted manner.

Figure 58:
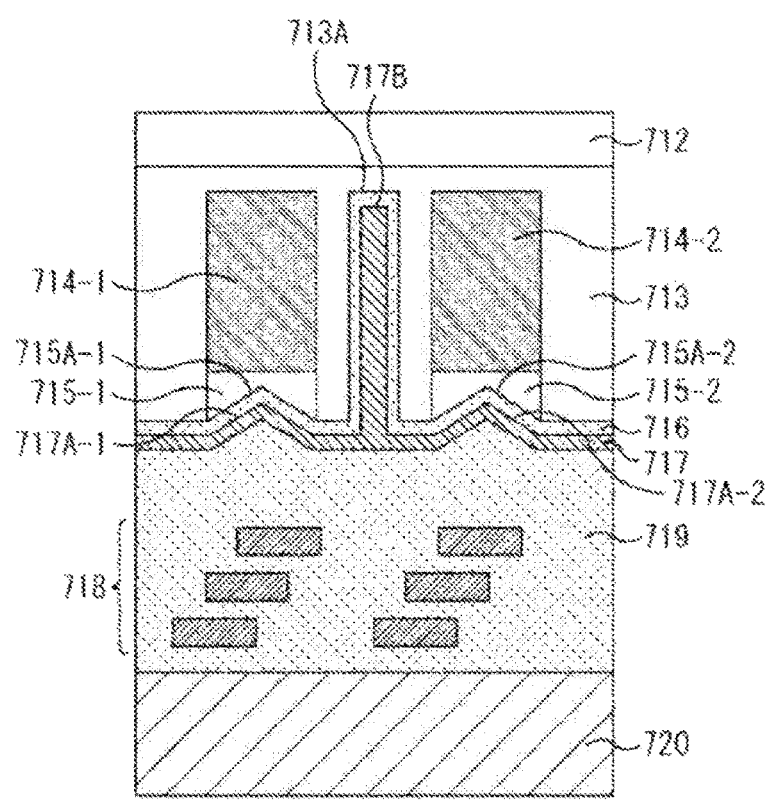
FIG. 58 is a diagram to describe the manufacturing method of the second exemplary configuration of the solid-state imaging element according to the third embodiment of the present technology.

Next, the flattened film 712 is formed on the incident surface of the semiconductor substrate 713 as illustrated in FIG. 58.

Figure 59:
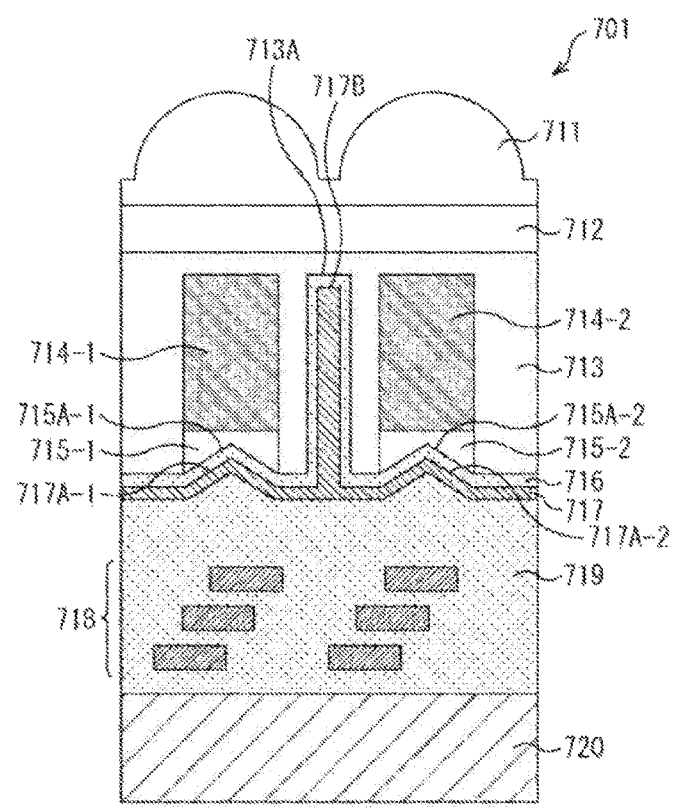
FIG. 59 is a diagram to describe the manufacturing method of the second exemplary configuration of the solid-state imaging element according to the third embodiment of the present technology.

Finally, the on-chip microlens 711 is formed on a surface of the flattened film 712 as illustrated in FIG. 59.

Meanwhile, a shape and a position of the protruding portion 717A of the reflection film 717 may be changed per pixel. In other words, since the incidence angle of the incident light is varied by the position of the pixel, variation between pixels in terms of the optical path length of the light having passed through the photoelectric conversion unit 714 can be reduced by suitably adjusting, per pixel, at least either one of the shape and the position of the protruding portion 717A in accordance with the incidence angle.

{Third Embodiment 3}

Next, a third example of the third embodiment will be described with reference to FIGS. 60 to 73.

Figure 60:
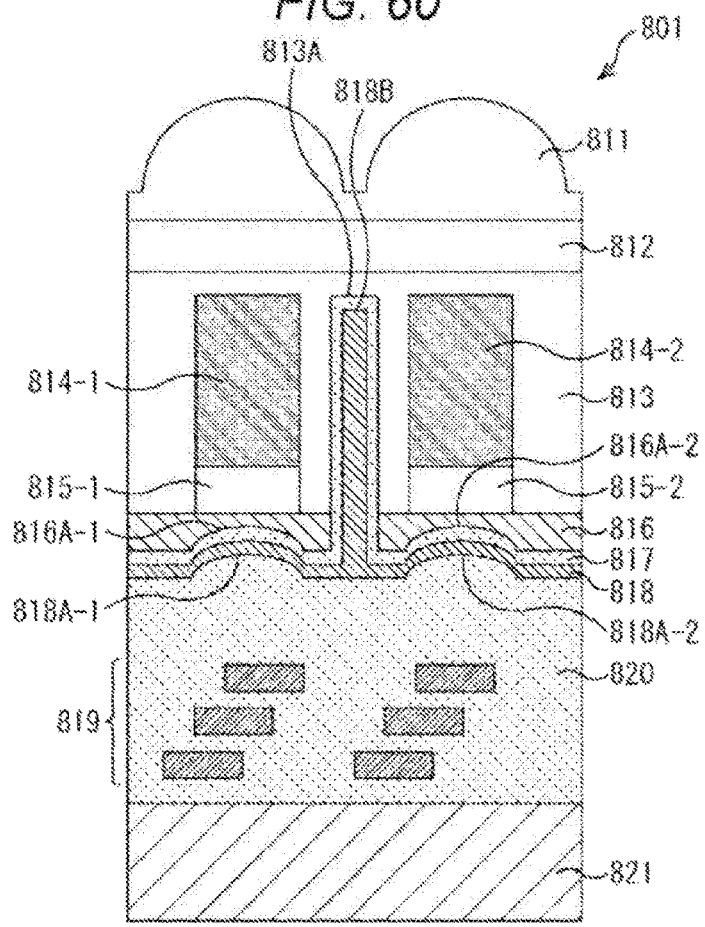
FIG. 60 is a cross-sectional view schematically illustrating a third exemplary configuration of the solid-state imaging element according to the third embodiment of the present technology.

FIG. 60 is a cross-sectional view illustrating a configuration formed of two adjacent pixels in a solid-state imaging element 801.

The solid-state imaging element 801 is a back-illumination type solid-state imaging element capable of imaging an image by light having a wavelength band from visible light to infrared light. The solid-state imaging element 801 is adapted to include an on-chip microlens 811, a flattened film 812, a semiconductor substrate 813, photoelectric conversion units (PD) 814-1, 814-2, P+ layers (HAD) 815-1, 815-2, an insulation film 816, an insulation film 817, a reflection film 818, a wire 819, an interlayer insulation film 820, and a support substrate 821. Additionally, one photodiode is formed of the photoelectric conversion unit 814-1 and the P+ layer 815-1, and one photodiode is formed of the photoelectric conversion unit 814-2 and the P+ layer 815-2.

The semiconductor substrate 813 is formed of a silicon substrate, for example. The on-chip microlens 811 is formed on an incident surface of the semiconductor substrate 813 via the flattened film 812. The photoelectric conversion unit 814-1 and the photoelectric conversion unit 814-2 are formed inside the semiconductor substrate 813 in a manner aligned in the lateral direction. The P+ layer 815-1 is formed under the photoelectric conversion unit 814-1 and on a surface of the bottom surface of the semiconductor substrate 813. The P+ layer 815-2 is formed under the photoelectric conversion unit 814-2 and on a surface of the bottom surface of the semiconductor substrate 813.

The bottom surface of the semiconductor substrate 813 is covered with the insulation film 816. A groove 816A-1 is formed at a position overlapping with the P+ layer 815-1 on the surface of the insulation film 816. An outer periphery of the groove 816A-1 has a square shape slightly larger than a surface of the P+ layer 815-1. Additionally, the groove 816A-1 is recessed on a curve. In a similar manner, a groove 816A-2 having a shape same as that of the groove 816A-1 is formed at a position overlapping with the P+ layer 815-2 on the surface of the insulation film 816.

A groove 813A is formed in a direction extending from the surface of the insulation film 816 to the inside of the semiconductor substrate 813 between the photoelectric conversion unit 814-1 and the photoelectric conversion unit 814-2. Meanwhile, although not illustrated in the drawing, the groove 813A is formed in a manner surrounding respective side surfaces of the photoelectric conversion unit 814-1 and the P+ layer 815-1 as well as respective side surfaces of the photoelectric conversion unit 814-2 and the P+ layer 815-2.

The surface of the insulation film 817 and the surface of the groove 813A are covered with the insulation film 817. The surface of the insulation film 817 is formed with the reflection film 818 formed of a metal film. The reflection film 818 is formed with protruding portions 818A-1 and 818A-2 having a shape same as that of the groove 816A-1 and groove 816A-2 of the insulation film 816.

Additionally, the reflection film 818 is formed with a wall portion 818B having a shape substantially same as that of the groove 813A of the semiconductor substrate 815. In other words, the reflection film 818 has a structure in which a reflection film to reflect transmitted light and a reflection film provided in a space with an adjacent photodiode are integrated. The wall 818B surrounds the respective side surfaces of the photoelectric conversion unit 814-1 and the P+ layer 815-1 as well as the respective side surfaces of the photoelectric conversion unit 814-2 and the P+ layer 815-2 in a manner similar to the groove 813A.

The wire 819 and the interlayer insulation film 820 are formed between the reflection film 818 and the support substrate 821. The wire 819 is formed across a plurality of wiring layers, and a space between respective wiring layers is insulated by the interlayer insulation film 820.

Note that a pixel not illustrated in the drawing also has a configuration similar to that of the pixel illustrated.

Meanwhile, in the following, in the case where there is no need to differentiate each one of the photoelectric conversion units 814-1, 814-2, each thereof will be simply referred to as a photoelectric conversion unit 814. In the following, in the case where there is no need to differentiate each one of the P+ layers 815-1, 815-2, each thereof will be simply referred to as a P+ layer 815. In the following, in the case where there is no need to differentiate each one of the grooves 816A-1, 816A-2 and the protruding portions 818A-1, 818A-2, each thereof will be simply referred to as a groove 816A and a protruding portion 818A.

When incident light including infrared light enters a pixel including the photoelectric conversion unit 814-1 via the on-chip microlens 811 and the flattened film 812, part of the incident light is absorbed by the photoelectric conversion unit 814-1 and remainder thereof passes through without being absorbed by the photoelectric conversion unit 814-1. At this point, the incident light is prevented from being leaked to an adjacent pixel by the reflection film 818 and the wall portion 818B.

The transmitted light having passed through the photoelectric conversion unit 814-1 is reflected by the protruding portions 818A-1 of the reflection film 818 toward the photoelectric conversion unit 814-1, and part of the reflection light enters the photoelectric conversion unit 814-1 again and is absorbed. At this point, the reflection light is reflected in multiple directions by the protruding portions 818A-1 of the reflection film 818. Furthermore, the reflection light is prevented from being leaked to an adjacent pixel by the wall portion 818B of the reflection film 818.

In other pixels also, incident light and reflection light are absorbed by the photoelectric conversion unit 814 in a similar manner.

Therefore, in each pixel, the incident light and the reflection light are prevented from being leaked to an adjacent pixel, and as a result, color mixture and resolution degradation are prevented.

Additionally, since the reflection light is reflected in the multiple directions, an optical path length of the light (incident light and reflection light) that passes through the photoelectric conversion unit 814 of each pixel is uniformed regardless of a difference of an incidence angle of incident light. Consequently, it is possible to suppress occurrence of shading caused by the difference of the incidence angle of the incident light due to a positional difference of each pixel.

Furthermore, since the solid-state imaging element 801 is provided with the insulation film 816, anti-noise performance is more improved compared to the solid-state imaging elements 601 and 701 although sensitivity is more degraded.

Next, a manufacturing method of the solid-state imaging element 801 will be described with reference to FIGS. 61 to 73.

Figure 61:
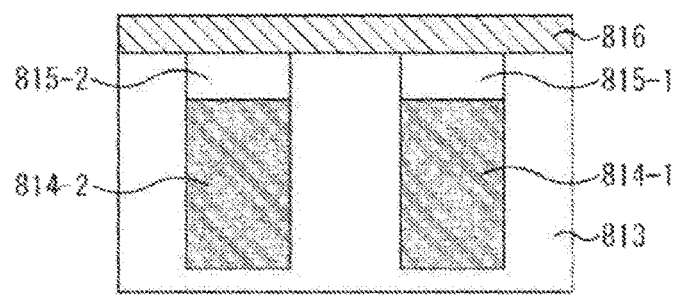
FIG. 61 is a cross-sectional view schematically illustrating the third exemplary configuration of the solid-state imaging element according to the third embodiment of the present technology.

First, the insulation film 816 is formed on the surface of the bottom surface of the semiconductor substrate 813 as illustrated in FIG. 61 after a process similar to that of FIG. 35 described above is performed.

Figure 62:
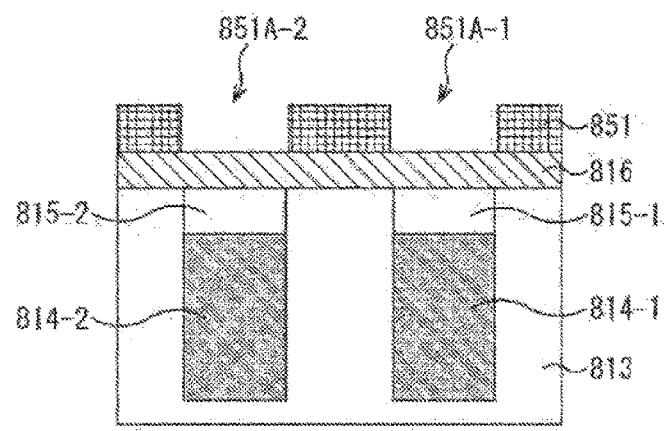
FIG. 62 is a cross-sectional view schematically illustrating the third exemplary configuration of the solid-state imaging element according to the third embodiment of the present technology.

Next, photoresist 851 is applied to the surface of the insulation film 816, and exposure is performed by using a predetermined photomask. Consequently, opened portions 851A-1 and 851A-2 are formed in the photoresist 851 at positions substantially same as the surfaces of the P+ layers 815-1 and 815-2 as illustrated in FIG. 62.

Figure 63:
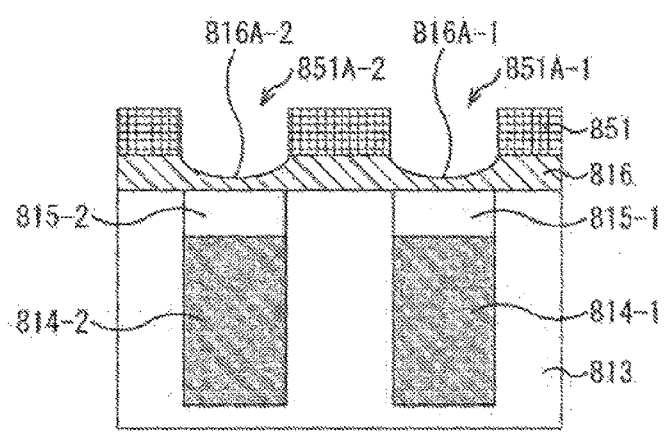
FIG. 63 is a cross-sectional view schematically illustrating the third exemplary configuration of the solid-state imaging element according to the third embodiment of the present technology.

Next, the grooves 816A-1 and 816A-2 are respectively formed at positions substantially same as the surfaces of the P+ layers 615-1 and 615-2 of the insulation film 816 by dry etching or wet etching as illustrated in FIG. 63. The grooves 816A-1 and 816A-2 each have a square shape slightly larger than the surfaces of the P+ layer 815-1 and 815-2 and recessed on a curve.

Figure 64:
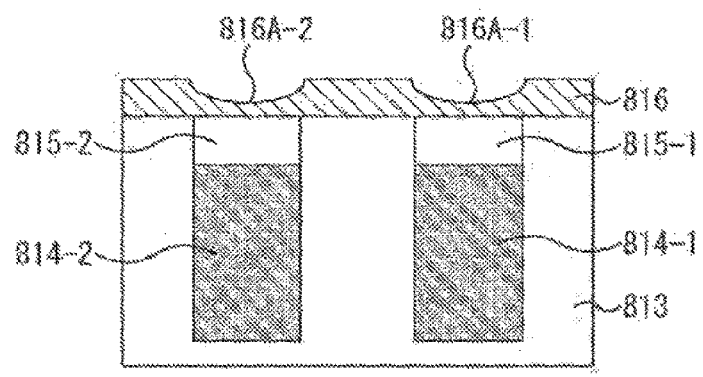
FIG. 64 is a cross-sectional view schematically illustrating the third exemplary configuration of the solid-state imaging element according to the third embodiment of the present technology.

Next, the photoresist 851 is stripped by post-treatment such as asking as illustrated in FIG. 64.

Figure 65:
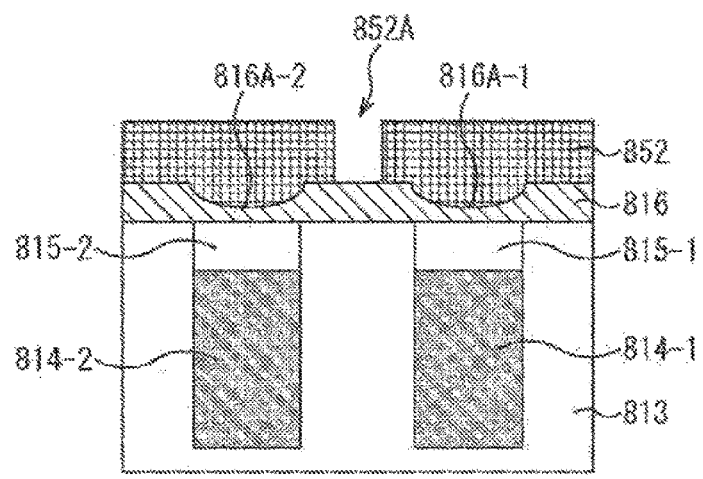
FIG. 65 is a cross-sectional view schematically illustrating the third exemplary configuration of the solid-state imaging element according to the third embodiment of the present technology.

Next, photoresist 852 is applied to the surface of the insulation film 816, and exposure is performed by using a predetermined photomask. Consequently, as illustrated in FIG. 65, an opened portion 852A is formed in the photoresist 852 between the photoelectric conversion unit 814-4 and the photoelectric conversion unit 814-2.

Meanwhile, although not illustrated in the drawing, the opened portion 852A is formed in a grid pattern in a manner surrounding the surface of the P+ layer 815 in each pixel.

Figure 66:
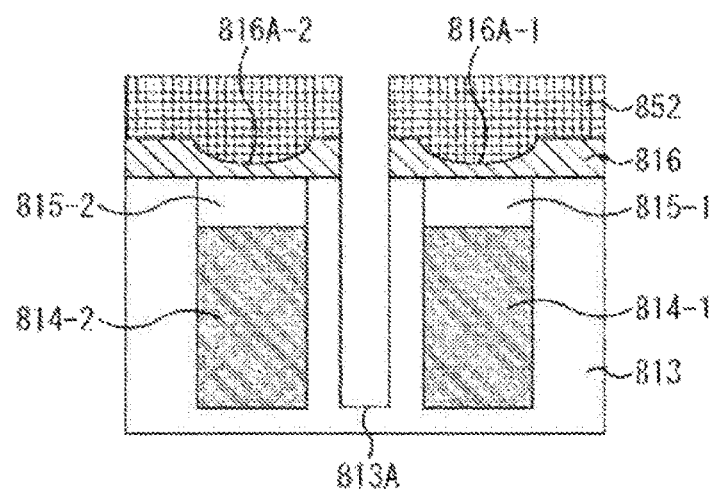
FIG. 66 is a cross-sectional view schematically illustrating the third exemplary configuration of the solid-state imaging element according to the third embodiment of the present technology.

Next, the groove 813A is formed in a manner conforming to the opened portion 852A of the photoresist 852 as illustrated in FIG. 66. The groove 813A penetrates the insulation film 816, extends to the inside of the substrate from the bottom surface of the semiconductor substrate 813, and is formed in a manner surrounding the respective side surfaces of the photoelectric conversion unit 814-1 and the P+ layer 815-1 as well as the respective side surfaces of the photoelectric conversion unit 814-2 and the P+ layer 815-2. Additionally, since the photoelectric conversion units 814 of each pixel are two-dimensionally arrayed, the groove 813A is formed in a grid pattern when viewed from the bottom surface side of the semiconductor substrate 813.

Figure 67:
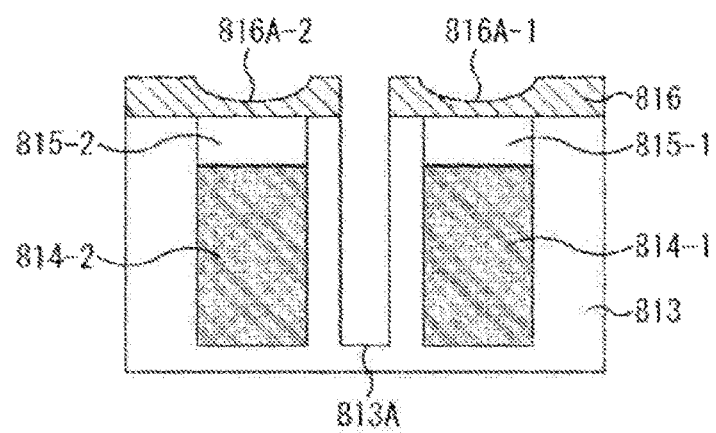
FIG. 67 is a cross-sectional view schematically illustrating the third exemplary configuration of the solid-state imaging element according to the third embodiment of the present technology.

Next, the photoresist 852 is stripped by post-treatment such as asking as illustrated in FIG. 67.

Figure 68:
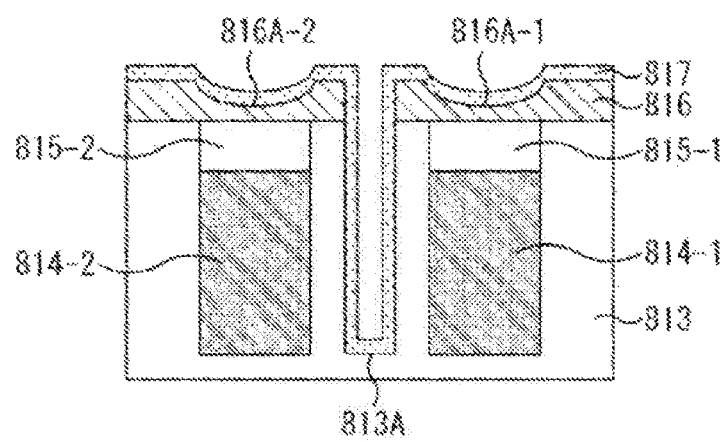
FIG. 68 is a cross-sectional view schematically illustrating the third exemplary configuration of the solid-state imaging element according to the third embodiment of the present technology.

Next, the insulation film 817 is formed on the surface of the groove 813A and the surface of the insulation film 816 as illustrated in FIG. 68.

Figure 69:
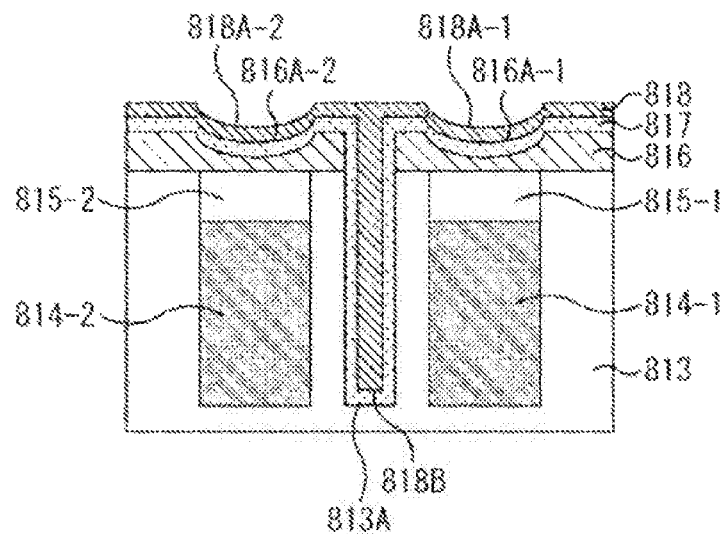
FIG. 69 is a cross-sectional view schematically illustrating the third exemplary configuration of the solid-state imaging element according to the third embodiment of the present technology.

Next, the reflection film 818 is formed on the surface of the insulation film 817 as illustrated in FIG. 69. The reflection film 818 is formed with the protruding portions 818A-1 and 818A-2 conforming to the grooves 816A-1 and 816A-2 of the insulation film 816.

Additionally, the reflection film 818 is embedded in the groove 813A of the semiconductor substrate 813 and forms the wall portion 818B. The wall 818B surrounds the respective side surfaces of the photoelectric conversion unit 814-1 and the P+ layer 815-1 as well as the respective side surfaces of the photoelectric conversion unit 814-2 and the P+ layer 815-2 in a manner similar to the groove 813A.

Note that part of the reflection film 818 is removed by processing in order to be connected to the wire 819 although not illustrated.

Figure 70:
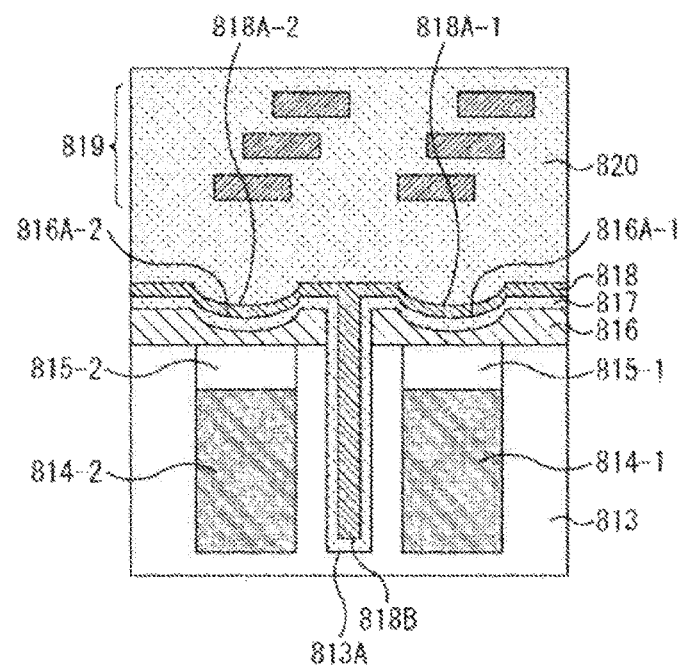
FIG. 70 is a cross-sectional view schematically illustrating the third exemplary configuration of the solid-state imaging element according to the third embodiment of the present technology.

Next, the wire 819 and the interlayer insulation film 820 are formed on the reflection film 818 as illustrated in FIG. 70.

Figure 71:
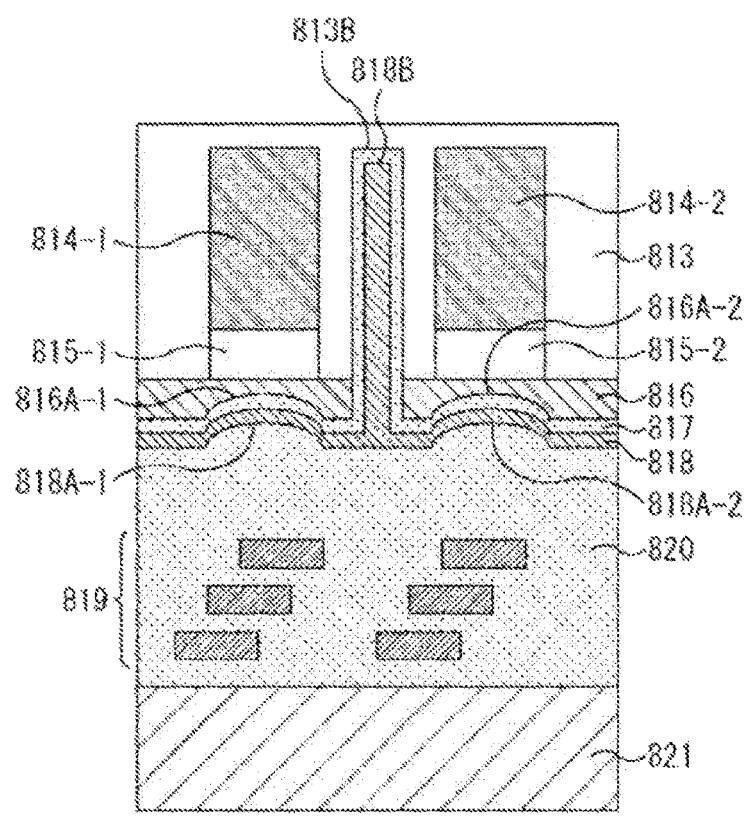
FIG. 71 is a cross-sectional view schematically illustrating the third exemplary configuration of the solid-state imaging element according to the third embodiment of the present technology.

Next, a surface of the interlayer insulation film 821 is bonded to a surface of the support substrate 820 as illustrated in FIG. 71. Note that an upper side and a lower side of the configuration illustrated in FIG. 70 are illustrated in an inverted manner in FIG. 71.

Figure 72:
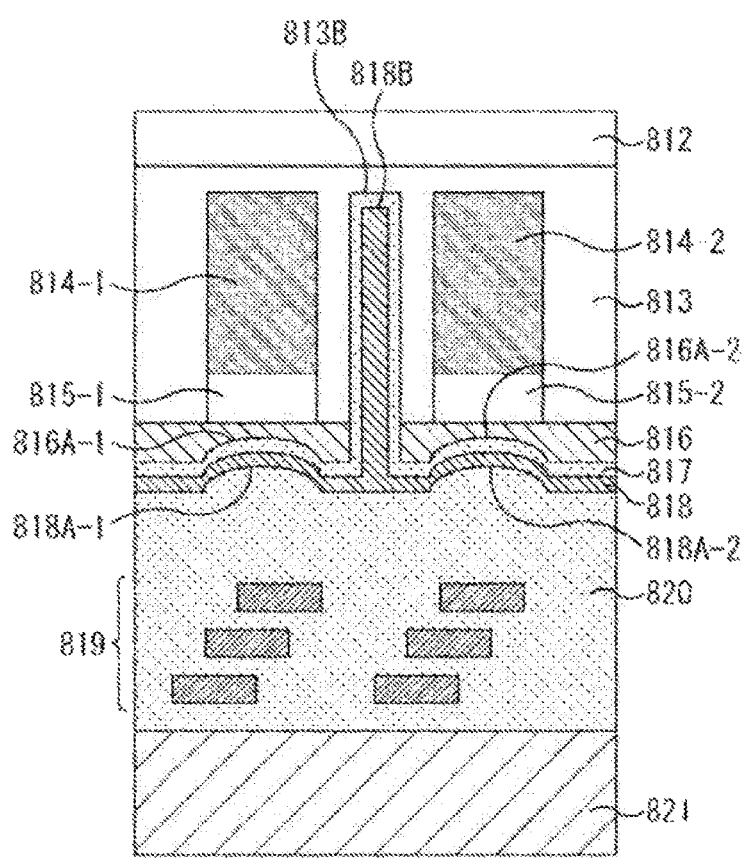
FIG. 72 is a cross-sectional view schematically illustrating the third exemplary configuration of the solid-state imaging element according to the third embodiment of the present technology.

Next, the flattened film 812 is formed on the incident surface of the semiconductor substrate 813 as illustrated in FIG. 72.

Figure 73:
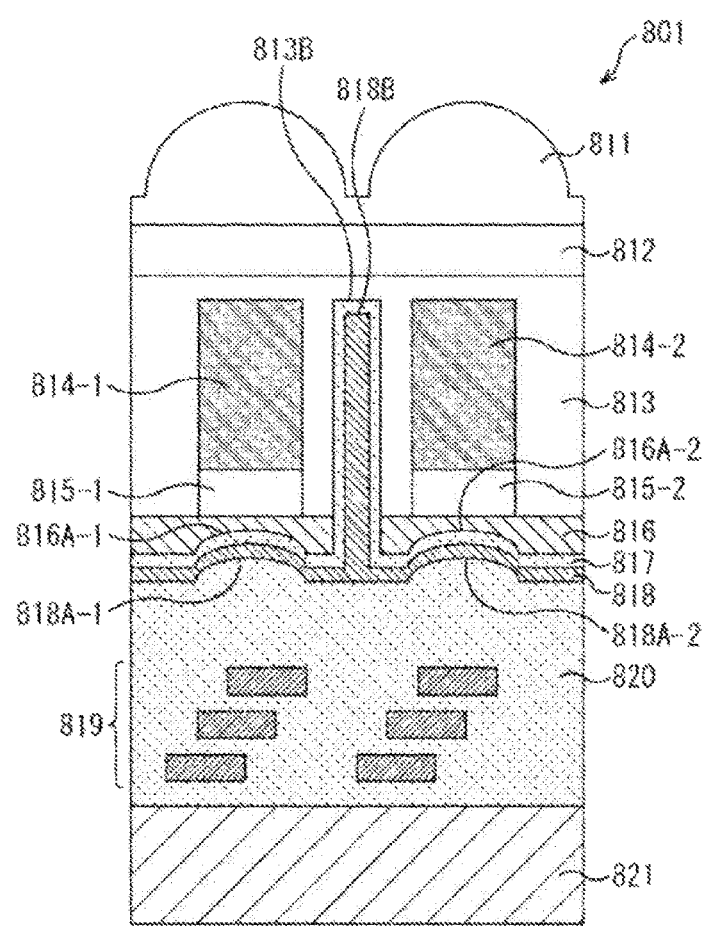
FIG. 73 is a cross-sectional view schematically illustrating the third exemplary configuration of the solid-state imaging element according to the third embodiment of the present technology.

Finally, the on-chip microlens 811 is formed on a surface of the flattened film 812 as illustrated in FIG. 73.

Meanwhile, a shape and a position of the protruding portion 818A of the reflection film 818 may be changed per pixel. In other words, since an incidence angle of incident light is varied by the position of the pixel, variation between pixels in terms of the optical path length of the light having passed through the photoelectric conversion unit 814 can be reduced by suitably adjusting, per pixel, at least either one of the shape and the position of the protruding portion 818A in accordance with the incidence angle.

<5. Exemplary Use of Solid-State Imaging Element>

Figure 74:
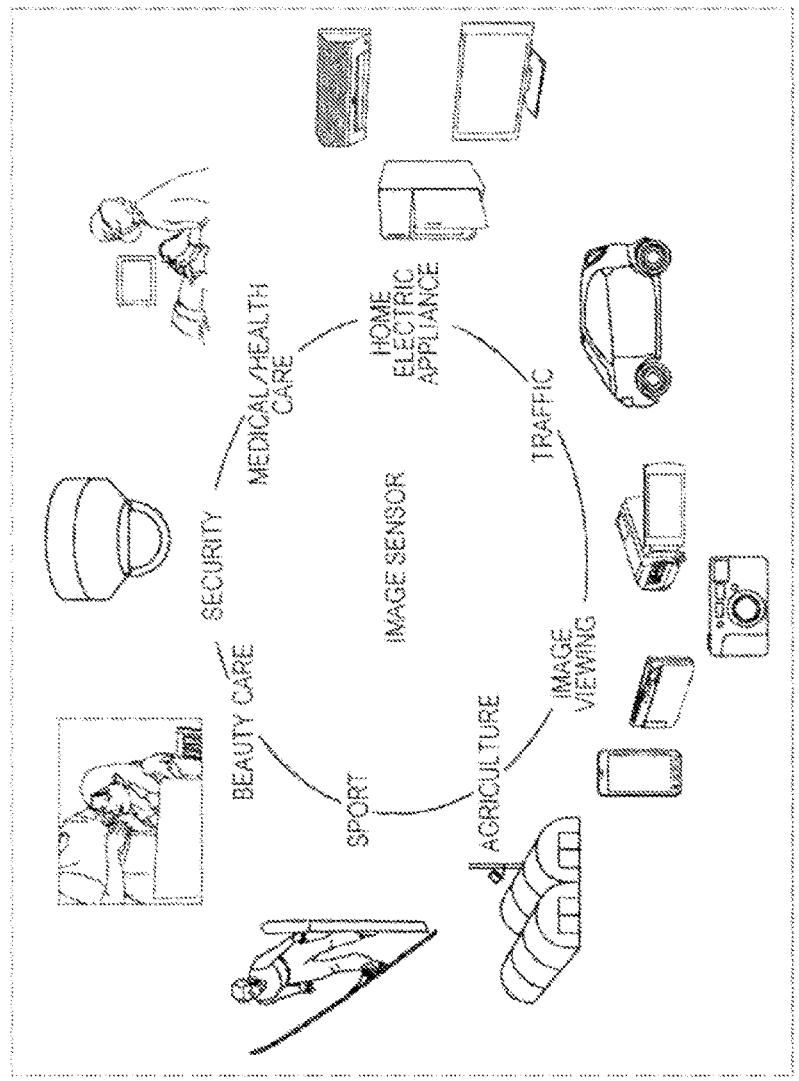
FIG. 74 is a diagram illustrating an exemplary use of a solid-state imaging element.

FIG. 74 is a diagram illustrating an exemplary use of the above-described solid-state imaging element.

The above-described solid-state imaging element can be used in various cases of sensing light such as visible light, infrared light, ultraviolet light, and X-rays as described below.

Device adapted to image an image provided for image viewing in a digital camera, a portable device incorporated with a camera function, and so on Device provided for traffic, such as an on-vehicle sensor adapted to image a front side, a rear side, a periphery of a vehicle, a car interior, etc., a monitoring camera adapted to monitor a traveling vehicle and a road, and a ranging sensor adapted to measure a distance between vehicles in order to perform safety drive such as automatic stop and recognize driver's condition Device provided for home electric appliances such as a television, a refrigerator, and an air conditioner in order to image a user's gesture and operate the electric appliances in accordance with the gesture Device provided for medical and health care, such as an endoscope and a device adapted to image a vessel by receiving infrared light Device provided for security, such as a monitoring camera for crime prevention, and a camera for person authentication Device provided for beauty care, such as skin measurement instrument adapted to image skin, and a microscope adapted to image a scalp Device provided for sport and the like, such as an action camera and a wearable camera used in sports Device provided for agriculture, such as a camera to monitor state of farms and products {Imaging Device}

FIG. 75 is a block diagram illustrating an exemplary configuration of an imaging device (camera device) 901 that is an example of an electronic device to which the present technology is applied.

As illustrated in FIG. 75, the imaging device 901 includes an optical system including a lens group 911 and the like, an imaging element 912, a DSP circuit 913 that is a camera signal processing unit, a frame memory 914, a display device 915, a recording device 916, an operation system 917, a power supply system 918, and the like. Furthermore, provided is a configuration in which the DSP circuit 913, frame memory 914, display device 915, recording device 916, operation system 917, and power supply system 918 are mutually connected via a bus line 919.

The lens group 911 takes in incident light (image light) from a subject and forms an image on an imaging surface of the imaging element 912. The imaging element 912 converts, to an electrical signal, an amount of the incident light formed on the imaging surface by the lens group 911 per pixel, and outputs the electrical signal as a pixel signal.

The display unit 915 is formed of, for example, a panel type display device such as a liquid crystal display device or an organic electro luminescence (EL) display device, and displays a moving image or a still image imaged by the imaging element 912. The recording device 916 records the moving image or the still image imaged by the imaging element 912 in a recording medium such as a memory card, a video tape, or a digital versatile disk (DVD).

The operation unit 917 provides an operational command with respect to various kinds of functions owned by the present imaging device 901 under control of a user. The power supply system 918 suitably supplies various kinds of power sources to work as operational power sources of the DSP circuit 913, frame memory 914, display device 915, recording device 916, and operation system 917 to these supply targets.

The imaging device 901 thus configured is applied to a video camera and a digital still camera, and also to a camera module for a mobile device such as a smartphone or a mobile phone. Furthermore, the solid-state imaging elements according to the above-described respective embodiments can be used as the imaging element 912 in the imaging device 901. This can improve image quality of the imaging device 901.

Meanwhile, the embodiments of the present technology are not limited to the above-described embodiments, and various kinds of modifications can be made within a range without departing from a gist of the present technology.

For example, the above-described respective embodiments can be combined in an available range.

Furthermore the present technology may also adopt the following configurations.

(1)

A solid-state imaging element including:

a photoelectric conversion unit adapted to photoelectrically convert incident light incident from a predetermined incident surface; and a wire arranged on a bottom surface side that is an opposite surface of the incident surface of the photoelectric conversion unit, and formed with a protruding pattern on a surface facing the photoelectric conversion unit.

(2)

The solid-state imaging element recited in above (1), wherein a plurality of the patterns is arranged in the one photoelectric conversion unit.

(3)

The solid-state imaging element recited in above (2), wherein the patterns are arranged at different intervals in an extending direction of the wire.

(4)

The solid-state imaging element recited in above (2) or (3), wherein the patterns are arranged so as not be aligned in a straight line.

(5)

The solid-state imaging element recited in any one of above (2) to (4), wherein a pixel located closer to an outer periphery of the solid-state imaging element has a lower density of the patterns in a direction vertical to a side of the outer periphery.

(6)

The solid-state imaging element recited in any one of above (1) to (5), wherein the pattern is arranged at a position not overlapping with a wire located at a position closer to the photoelectric conversion unit than a wire formed with the pattern when viewed from the photoelectric conversion unit side.

(7)

The solid-state imaging element recited in any one of above (1) to (6), wherein a width of the pattern is set in accordance with a width of the wire.

(8)

The solid-state imaging element recited in any one of above (1) to (7), wherein a pixel located closer to an outer periphery of the solid-state imaging element has the pattern having a longer length in a wire extending direction in the wire that extends in a direction vertical to the side of the outer periphery.

(9)

The solid-state imaging element recited in any one of (1) to (8), wherein the pattern is not formed in a wire of a wiring layer closest to the bottom surface of the photoelectric conversion unit.

(10)

The solid-state imaging element recited in any one of above (1) to (9), wherein the pattern is arranged only in the photoelectric conversion unit of a pixel that receives light having a predetermined wavelength or more.

(11)

The solid-state imaging element recited in any one of above (1) to (10), wherein the pattern is formed in at least one process out of a process of connecting wires of adjacent wiring layers and a process of connecting a wire to a semiconductor substrate formed with the photoelectric conversion unit.

(12)

An electronic device including a solid-state imaging element that includes:

a photoelectric conversion unit adapted to photoelectrically convert incident light incident from a predetermined incident surface; and a wire arranged on a bottom surface side that is an opposite surface of the incident surface of the photoelectric conversion unit, and formed with a protruding pattern on a surface facing the photoelectric conversion unit.

(13)

A solid-state imaging element including:

a pixel array unit on which a plurality of pixels each provided with photoelectric conversion unit is arrayed; and a reflection film arranged in a manner overlapping with part of a bottom surface that is an opposite surface of an incident surface of the photoelectric conversion unit in at least some of the pixels in the pixel array unit, and adapted to reflect part of light having passed through the photoelectric conversion unit in a direction to the photoelectric conversion unit.

(14)

The solid-state imaging element recited in above (13), wherein a range of the reflection film overlapping with the bottom surface of the photoelectric conversion unit is divided into a plurality patterns per pixel.

(15)

The solid-state imaging element recited in above (14), including:

a pixel in which the reflection film overlaps with a first range that is an approximately half of the bottom surface of the photoelectric conversion unit; and a pixel in which the reflection film overlaps with a second range that is an approximately half of the bottom surface of the photoelectric conversion unit and different from the first range.

(16)

The solid-state imaging element recited in any one of (13) to (15), wherein the reflection film is arranged in a wiring layer formed on the bottom surface side of the photoelectric conversion unit.

(17)

The solid-state imaging element recited in any one of above (13) to (15), wherein the reflection film is arranged on a substrate stacked on a substrate formed with the pixel array unit.

(18)

The solid-state imaging element recited in any one of above (13) to (15), wherein the reflection film is arranged in a layer formed with a gate electrode of a semiconductor substrate formed with the pixel array unit.

(19)

The solid-state imaging element recited in any one of above (13) to (18), further including a separation layer adapted to separate a pixel arranged with the reflection film from an adjacent pixel.

(20)

The solid-state imaging element recited in any one of above (13) to (19), wherein deviation of a focal point is detected on the basis of a pixel signal of a pixel arranged with the reflection film.

(21)

The solid-state imaging element recited in above (20), wherein a light shielding film is arranged in a manner overlapping with part of the incident surface of the photoelectric conversion unit at least in some of pixels each not arranged with the reflection film, and deviation of a focal point is detected by differently using, in accordance with an incident light amount, a pixel signal of a pixel arranged with the reflection film and a pixel signal of a pixel arranged with the light shielding film.

(22)

The solid-state imaging element recited in above (20), wherein filter colors used in a pixel arranged with the reflection film are various, and deviation of a focal point is detected by differently using pixel signals of the pixels of different colors in accordance with the incident light amount.

(23)

The solid-state imaging element recited in any one of above claims (13) to (22), wherein a white color filter is used in at least some of pixels each arranged with the reflection film.

(24)

An electronic device including a solid-state imaging element that includes:

a pixel array unit on which a plurality of pixels each provided with photoelectric conversion unit is arrayed; and a reflection film arranged in a manner overlapping with part of a bottom surface that is an opposite surface of an incident surface of the photoelectric conversion unit in at least some of the pixels in the pixel array unit, and adapted to reflect part of light having passed through the photoelectric conversion unit in a direction to the photoelectric conversion unit.

(25)

A solid-state imaging element including:

a pixel array unit on which a plurality of pixels is arrayed and a plurality of photoelectric conversion units is provided in at least some of the pixels; and a reflection film arranged in a manner overlapping with bottom surfaces that are opposite surfaces of incident surfaces of the plurality of photoelectric conversion units of the pixel provided with the plurality of photoelectric conversion units, and adapted to reflect the light having passed through the photoelectric conversion unit in a direction to the photoelectric conversion unit.

(26)

An electronic device including a solid-state imaging element that includes:

a pixel array unit on which a plurality of pixels is arrayed and a plurality of photoelectric conversion units is provided in at least some of the pixels; and a reflection film arranged in a manner overlapping with bottom surfaces that are opposite surfaces of incident surfaces of the plurality of photoelectric conversion units of the pixel provided with the plurality of photoelectric conversion units, and adapted to reflect the light having passed through the photoelectric conversion unit in a direction to the photoelectric conversion unit.

(27)

A solid-state imaging element including:

a pixel array unit on which a plurality of pixels each provided with a photoelectric conversion unit adapted to receive incident light including infrared light is arranged;

a first reflection film provided per the photoelectric conversion element, and adapted to reflect transmitted light having passed through the photoelectric conversion element in multiple directions toward the photoelectric conversion element where the transmitted light has passed through; and a second reflection film formed between the photoelectric conversion elements adjacent to each other.

(28)

The solid-state imaging element recited in above (27), wherein a protruding portion having a predetermined shape is formed on the first reflection film.

(29)

The solid-state imaging element recited in above (28), wherein at least either one of a shape and a position of the protruding portion is varied by a position of the pixel.

(30)

The solid-state imaging element recited in above (28) or (29), wherein the protruding portion has a quadrangular pyramid shape.

(31)

The solid-state imaging element recited in any one of above (28) to (30), wherein the protruding portion is formed in a manner conforming to a groove formed on an opposite surface of a light incident surface of a semiconductor substrate formed with the photoelectric conversion element.

(32)

The solid-state imaging element recited in any one of above (28) to (30), wherein the protruding portion is formed in a manner conforming to a groove formed on a film stacked on an opposite surface of a light incident surface of a semiconductor substrate formed with the photoelectric conversion element.

(33)

The solid-state imaging element recited in any one of above (27) to (32), wherein the second reflection film is formed in a manner extending to the inside of a semiconductor substrate from a light incident surface of the semiconductor substrate formed with the photoelectric conversion element.

(34)

The solid-state imaging element recited in any one of above (27) to (32), wherein the second reflection film is formed in a manner extending to the inside of a semiconductor substrate from an opposite surface of a light incident surface of the semiconductor substrate formed with the photoelectric conversion element.

(35)

The solid-state imaging element recited in above (34), wherein the first reflection film and the second reflection film are integrated.

(36)

An electronic device including solid-state imaging element that includes:

a pixel array unit on which a plurality of pixels each provided with a photoelectric conversion unit adapted to receive incident light including infrared light is arranged;

a first reflection film provided per the photoelectric conversion element, and adapted to reflect transmitted light having passed through the photoelectric conversion element in multiple directions toward the photoelectric conversion element where the transmitted light has passed through; and a second reflection film formed between the photoelectric conversion elements adjacent to each other.

REFERENCE SIGNS LIST

11 Solid-state imaging element
21 Pixel array unit
61 Photodiode
101 Solid-state imaging element
113 Semiconductor substrate
114-1, 114-2 Photodiode
115-1, 115-2 Transfer gate portion
116-1, 116-2 Electric charge-voltage conversion unit
301a to 301d Solid-state imaging element 313-1 to 313-3 Photodiode
314-1 to 341-2 Wire
321A-1 to 341A-2 Dummy via
401a to 401i Solid-state imaging element
412 Color filter array
412A-1 to 412A-4 Filter
413 Semiconductor substrate
414-1 to 414-7 Photodiode
415-1 to 415-5 Shielding metal
421-1 to 421-5 Shielding metal
422-1, 422-2 Reflection metal
431 Logic substrate
432 Reflection metal
441-1 to 451-5 Separation layer
461 Color filter array
461A-1 to 461A-4 Filter
462-1 to 471-2 Reflection metal
481 Color filter array
481A-1 to 481A-7 Filter
482-1 to 482-8 Shielding metal
483-1, 483-2 Reflection metal
491 Color filter array
491A-1 to 491A-4 Filter
492L, 492R Photodiode
493 Reflection metal
601 Solid-state imaging element
613 Semiconductor substrate
614-1, 614-2 Photoelectric conversion unit
615-1, 615-2 P+ layer
615A-1, 615A-2 Groove
616 Reflection film
618 Reflection film
618A-1, 618A-2 Protruding portion
701 Solid-state imaging element
713 Semiconductor substrate
714-1, 714-2 Photoelectric conversion unit
715-1, 715-2 P+ layer
715A-1, 715A-2 Groove
717 Reflection film
717A-1, 717A-2 Protruding portion
717B Wall portion
801 Solid-state imaging element
813 Semiconductor substrate
814-1, 814-2 Photoelectric conversion unit
815-1, 815-2 P+ layer
816 Insulation film
816A-1, 816A-2 Groove
818 Reflection film
818A-1, 818A-2 Protruding portion
818B Wall portion
C1-1 to C11 Contact
DC1-1, DC1-2 Dummy contact
DVa1-1 to DVc104 Dummy via
P1 to Pi4 Pixel
Vb1-1 to Vb2-2 Via
Wa1-1 to Wp15 Wire
WR1 to WR3 Wiring layer

The invention claimed is:

1. A solid-state imaging element, comprising:
a wiring layer, and
a photoelectric conversion unit configured to photoelectrically convert incident light incident from incident surface of the photoelectric conversion unit, wherein the photoelectric conversion unit includes a plurality of patterns, wherein positions of the plurality of patterns with respect to the wiring layer are misaligned from each other along a straight line in an extending direction of the wiring layer,
wherein the wiring layer is on a bottom surface side of the photoelectric conversion unit, wherein the bottom surface side is opposite to the incident surface, and wherein the wiring layer includes a protruding pattern on a surface that faces the photoelectric conversion unit.

2. The solid-state imaging element according to claim 1, wherein the plurality of patterns are at different intervals in the extending direction of the wiring layer.

3. The solid-state imaging element according to claim 1, wherein a pixel in a proximity to an outer periphery of the solid-state imaging element has a lower density of patterns in a direction vertical to a side of the outer periphery.

4. The solid-state imaging element according to claim 1, wherein each of the positions of the plurality of patterns is different than a position of a first wire of the wiring layer, wherein the position of the first wire is closer to the photoelectric conversion unit than a position of a second wire, and wherein the second wire includes a set of patterns of the plurality of patterns.

5. The solid-state imaging element according to claim 1, wherein a width of each of the plurality of patterns is based on a width of the wiring layer.

6. The solid-state imaging element according to claim 1, wherein a pixel in proximity to a side of an outer periphery of the solid-state imaging element includes a set of patterns of the plurality of patterns, and wherein a length corresponding to the set of patterns in the extending direction of the wiring layer is greater than a threshold length.

7. The solid-state imaging element according to claim 1, wherein the wiring layer comprises a plurality of wires,
wherein the plurality of patterns are not formed in a specific wire of the plurality of wires of the wiring layer, and
wherein the specific wire is closest to a bottom surface of the photoelectric conversion unit among the plurality of wires.

8. The solid-state imaging element according to claim 1, wherein the plurality of patterns are in the photoelectric conversion unit of a pixel that receives light of a specific wavelength or more.

9. The solid-state imaging element according to claim 1, wherein an arrangement of the plurality of patterns is based on at least one of a connection of wires of adjacent wiring layers or a connection of a wire of the wiring layer to a semiconductor substrate of the photoelectric conversion unit.

10. An electronic device, comprising:
a solid-state imaging element that comprises:
a wiring layer; and
a photoelectric conversion unit configured to photoelectrically convert incident light incident from incident surface of the photoelectric conversion unit, wherein the photoelectric conversion unit includes a plurality of patterns, and wherein positions of the plurality of patterns with respect to the wiring layer are misaligned from each other along a straight line in an extending direction of the wiring layer,
wherein the wiring layer is on a bottom surface side of the photoelectric conversion unit, wherein the bottom surface side is opposite to the incident surface, and wherein the wiring layer includes a protruding pattern on a surface that faces the photoelectric conversion unit.

\* \* \* \* \*